US011889749B2

(12) United States Patent
Min et al.

(10) Patent No.: US 11,889,749 B2
(45) Date of Patent: Jan. 30, 2024

(54) ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

(71) Applicants: Samsung Electronics Co., Ltd., Suwon-si (KR); Samsung SDI Co., Ltd., Yongin-si (KR)

(72) Inventors: Minsik Min, Suwon-si (KR); Wook Kim, Yongin-si (KR); Sangmo Kim, Hwaseong-si (KR); Jongsoo Kim, Hanam-si (KR); Joonghyuk Kim, Seoul (KR); Hyejin Bae, Suwon-si (KR); Jhunmo Son, Yongin-si (KR); Hasup Lee, Seoul (KR); Yongsik Jung, Seoul (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 562 days.

(21) Appl. No.: 16/987,950

(22) Filed: Aug. 7, 2020

(65) Prior Publication Data

US 2021/0043856 A1 Feb. 11, 2021

(30) Foreign Application Priority Data

Aug. 9, 2019 (KR) ........................ 10-2019-0097638

(51) Int. Cl.
*H10K 85/00* (2023.01)
*H10K 85/30* (2023.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC ............. H01L 51/0087; H01L 51/5056; H01L 51/5072; H01L 51/5088; H01L 51/5092;
(Continued)

(56) References Cited

U.S. PATENT DOCUMENTS 10,084,143 B2 9/2018 Alleyne et al.
10,573,828 B2 2/2020 Bold et al.
(Continued)

FOREIGN PATENT DOCUMENTS

KR 1020110074538 A 6/2011
WO 0215645 A1 2/2002
WO 2005019373 A2 3/2005

OTHER PUBLICATIONS

CAS reg. No. 2591614-82-1, Feb. 18, 2021. (Year: 2021).*
Extended European search report issued by the European Patent Office dated Oct. 27, 2020 in the examination of the European Patent Application No. 20190113.9, which corresponds to the U.S. Appl. No. 16/987,950.
Ruben Seifert et al., "Chemical degradation mechanisms of highly efficient blue phosphorescent emitters used for organic light emitting diodes," Organic Electronics, Nov. 7, 2012, pp. 115-123, vol. 14.
Tyler Fleetham et al., "Effi cient "Pure" Blue OLEDs Employing Tetradentate Pt Complexes with a Narrow Spectral Bandwidth," Adv. Mater., Sep. 10, 2014, pp. 7116-7121, vol. 26.

*Primary Examiner* — Douglas J McGinty

(74) *Attorney, Agent, or Firm* — CANTOR COLBURN LLP

(57) ABSTRACT

An organometallic compound represented by Formula 1, wherein $M_1$ is beryllium, magnesium, aluminum, calcium, titanium, manganese, cobalt, copper, zinc, gallium, germanium, zirconium, ruthenium, rhodium, palladium, silver, rhenium, platinum, or gold; $A_1$ to $A_3$ are each independently a $C_5$-$C_{30}$ carbocyclic group or a $C_1$-$C_{30}$ heterocyclic group; $A_4$ is a 5-membered heterocyclic group; $A_5$ is at least two rings of a $C_7$-$C_{30}$ carbocyclic group comprising a 6-membered carbocyclic group, or $A_5$ is at least two rings of a $C_1$-$C_{30}$ heterocyclic group comprising a 6-membered carbocyclic group or a 6-membered heterocyclic group; $X_{10}$, $X_{20}$, $X_{30}$, and $X_{40}$ to $X_{44}$ are each independently C or N; $T_1$ to $T_3$ are each independently a single bond, *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(=O)—*', *—S(=O)—*', *—S(=O)$_2$—*', *—C($R_1$)=C($R_2$)—*', *—C(=S)—*', or *—C≡C—*'; and wherein the other substituents may be understood by referring to the detailed description.

Formula 1

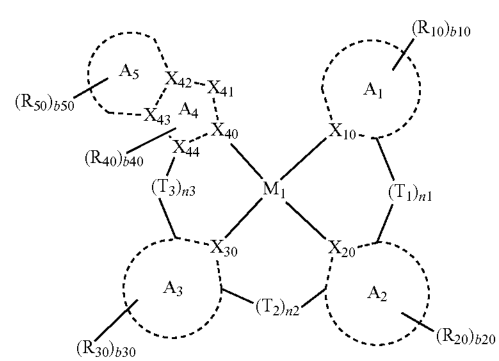

19 Claims, 1 Drawing Sheet

(51) Int. Cl.

| | |
|---|---|
| ***C07F 15/00*** | (2006.01) |
| ***C09K 11/06*** | (2006.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.
CPC ................ *C09K 2211/1029* (2013.01); *C09K 2211/1048* (2013.01); *C09K 2211/185* (2013.01); *H10K 50/15* (2023.02); *H10K 50/16* (2023.02); *H10K 50/17* (2023.02); *H10K 50/171* (2023.02); *H10K 50/18* (2023.02)

(58) Field of Classification Search
CPC ............ H01L 51/5096; H01L 51/0081; H01L 51/5016; H01L 51/5012; H01L 51/5024; C07F 15/0086; C09K 11/06; C09K 2211/1029; C09K 2211/1048; C09K 2211/185; C09K 2211/1007; C09K 2211/104; C09K 2211/1051; C09K 2211/1059; C09K 2211/1062; C09K 2211/1074; C09K 2211/1081; G01N 21/6428; G01N 21/64; G01N 33/58; H10K 85/346; H10K 50/15; H10K 50/16; H10K 50/17; H10K 50/171; H10K 50/18; H10K 50/11; H10K 85/324; H10K 2101/10; H10K 50/12
USPC .......................................................... 428/690
See application file for complete search history.

(56) References Cited

U.S. PATENT DOCUMENTS

| | | | | |
|---|---|---|---|---|
| 2014/0364605 | A1 | 12/2014 | Li et al. | |
| 2015/0008419 | A1 | 1/2015 | Li et al. | |
| 2015/0105556 | A1* | 4/2015 | Li | H01L 51/0087 546/4 |
| 2015/0194616 | A1 | 7/2015 | Li et al. | |
| 2015/0228914 | A1 | 8/2015 | Li et al. | |
| 2015/0274762 | A1* | 10/2015 | Li | C09K 11/06 546/4 |
| 2015/0349279 | A1 | 12/2015 | Li et al. | |
| 2016/0359125 | A1* | 12/2016 | Li | H01L 51/0087 |
| 2018/0053904 | A1 | 2/2018 | Li et al. | |
| 2018/0208615 | A1* | 7/2018 | Lin | C07F 15/006 |
| 2018/0301641 | A1* | 10/2018 | Li | C09K 11/06 |
| 2018/0309072 | A1* | 10/2018 | Lee | H01L 51/0087 |
| 2018/0337350 | A1 | 11/2018 | Li et al. | |
| 2019/0036042 | A1 | 1/2019 | Kim et al. | |
| 2019/0074455 | A1 | 3/2019 | Chen et al. | |
| 2019/0214584 | A1 | 7/2019 | Chen et al. | |
| 2021/0005828 | A1* | 1/2021 | Choi | C07F 15/0086 |

* cited by examiner

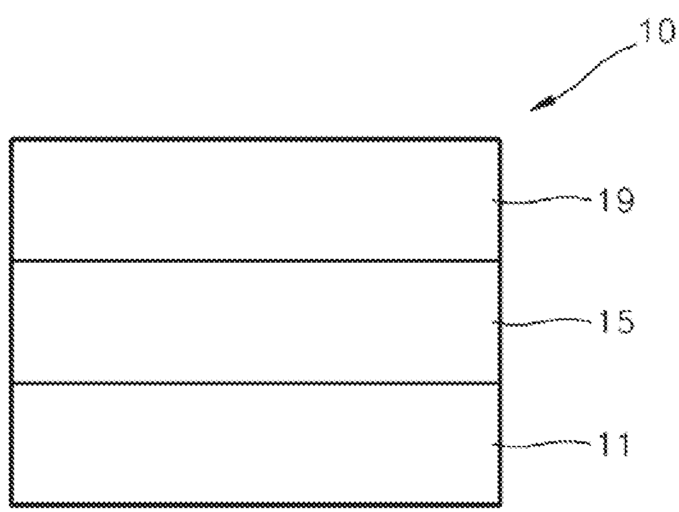
10
19
15
11

ORGANOMETALLIC COMPOUND, ORGANIC LIGHT-EMITTING DEVICE INCLUDING ORGANOMETALLIC COMPOUND, AND DIAGNOSTIC COMPOSITION INCLUDING ORGANOMETALLIC COMPOUND

CROSS-REFERENCE TO RELATED APPLICATION

This application claims priority to and the benefit of Korean Patent Application No. 10-2019-0097638, filed on Aug. 9, 2019, in the Korean Intellectual Property Office, and all the benefits accruing therefrom under 35 U.S.C. § 119, the content of which is incorporated herein in its entirety by reference.

BACKGROUND

1. Field

One or more embodiments of the present disclosure relate to an organometallic compound, an organic light-emitting device including the organometallic compound, and a diagnostic composition that includes the organometallic compound.

2. Description of the Related Art

Organic light-emitting devices (OLEDs) are self-emission devices which produce full-color images. In addition, OLEDs have wide viewing angles and exhibit excellent driving voltage and response speed characteristics.

OLEDs include an anode, a cathode, and an organic layer between the anode and the cathode and including an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

Further, light-emitting compounds, e.g., phosphorescence-emitting compounds, can also be used to monitor, sense, or detect biological materials, including a variety of cells and proteins.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to an aspect of an embodiment, an organometallic compound may be represented by Formula 1:

Formula 1

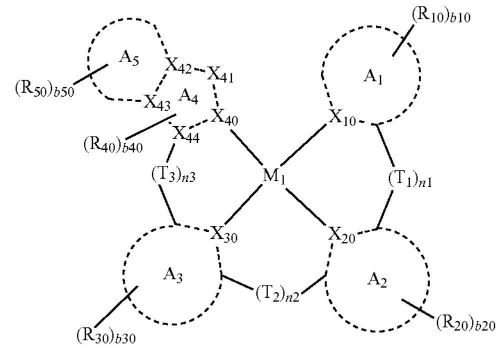

wherein, in Formula 1, $M_1$ may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $A_1$ to $A_3$ may each independently be a $C_5$-$C_{30}$ carbocyclic group or a $C_1$-$C_{30}$ heterocyclic group, $A_4$ may be a 5-membered heterocyclic group, $A_5$ may be at least two rings of a $C_7$-$C_{30}$ carbocyclic group including a 6-membered carbocyclic group, or $A_5$ may be at least two rings of a $C_1$-$C_{30}$ heterocyclic group including a 6-membered carbocyclic group or a 6-membered heterocyclic group, $X_{10}$, $X_{20}$, $X_{30}$ and $X_{40}$ to $X_{44}$ may each independently be C or N, $T_1$ to $T_3$ may each independently be a single bond, *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(═O)—*', *—S(═O)—*', *—S(═O)$_2$—*', *—C($R_1$)═C($R_2$)—*', *—C(═S)—*', and *—C≡C—*', wherein * and *' may each indicate a binding site to an adjacent atom, n1 may be an integer from 1 to 3, $L_1$ may be a single bond, a substituted or unsubstituted $C_5$-$C_{30}$ carbocyclic group, or a substituted or unsubstituted $C_1$-$C_{30}$ heterocyclic group, a1 may be an integer from 1 to 3, and when a1 is 2 or greater, at least two $L_1$ groups may be identical to or different from each other, $R_1$, $R_2$, $R_{10}$, $R_{20}$, $R_{30}$, $R_{40}$, and $R_{50}$ may each independently be hydrogen, deuterium, —F, —C, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P($Q_8$)($Q_9$), or —P(═O)($Q_8$)($Q_9$), at least two adjacent $R_1$, $R_2$, $R_{10}$, $R_{20}$, $R_{30}$, $R_{40}$, or $R_{50}$ groups may optionally be bound together to form a substituted or unsubstituted $C_5$-$C_{30}$ carbocyclic group or a substituted or unsubstituted $C_1$-$C_{30}$ heterocyclic group, b1 may be an integer from 1 to 5, and when b1 is 2 or greater, at least two $R_1$ groups may be identical to or different from each other, b10, b20, b30, and b50 may each independently be an integer from 1 to 10, b40 may be an integer from 1 to 3, when b10 is 2 or greater, at least two $R_{10}$ groups may be identical to or different from each other, when b20 is 2 or greater, at least two $R_{20}$ groups may be identical to or different from each other, when b30 is 2 or greater, at least two $R_{30}$ groups may be identical to or different from each other, when b40 is 2 or greater, at least two $R_{40}$ groups may be identical to or different from each other, when b50 is 2 or greater, at least two $R_{50}$ groups may be identical to or different from each other, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, or the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P($Q_{18}$)($Q_{19}$), or —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$—C heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P($Q_{28}$)($Q_{29}$), or —P(═O)($Q_{28}$)($Q_{29}$); or —N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P($Q_{38}$)($Q_{39}$), or —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ may each independently be hydrogen; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

In some embodiments, $Q_1$ to $Q_9$, $Q_{11}$ to $Q_{19}$, $Q_{21}$ to $Q_{29}$, and $Q_{31}$ to $Q_{39}$ may each independently be hydrogen, —F;

—Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group, each except hydrogen, —F, —C, —Br, —I, the hydroxyl group, the cyano group, and the nitro group substituted with at least one of deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group substituted with a $C_1$-$C_{60}$ alkyl group; a $C_6$-$C_{60}$ aryl group; or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

In some embodiments, $Q_1$ to $Q_9$, $Q_{11}$ to $Q_{19}$, $Q_{21}$ to $Q_{29}$, and $Q_{31}$ to $Q_{39}$ may each independently be hydrogen; a $C_1$-$C_{60}$ alkyl group; a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group, each except hydrogen substituted with at least one of deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group substituted with a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

According to an aspect of another embodiment, an organic light-emitting device may include: a first electrode; a second electrode; and an organic layer disposed between the first electrode and the second electrode, the organic layer including an emission layer and at least one of the organometallic compounds.

According to an aspect of still another embodiment, a diagnostic composition may include at least one organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which:

The FIGURE is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "A" "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to a cross section illustration that is a schematic illustration of one or more idealized embodiments. As such, variations from the shapes of the illustration as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURE are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An aspect of the present disclosure provides an organometallic compound that may be represented by Formula 1:

Formula 1

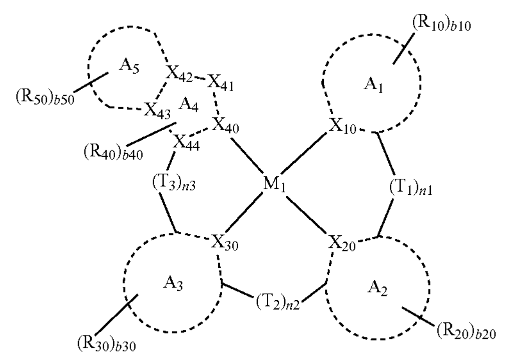

wherein, in Formula 1, $M_1$ may be beryllium (Be), magnesium (Mg), aluminum (A), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

In some embodiments, $M_1$ may be Pd, Pt, or Au, but embodiments are not limited thereto.

In Formula 1, $A_1$ to $A_3$ may each independently be a $C_5$-$C_{30}$ carbocyclic group or a $C_1$-$C_{30}$ heterocyclic group.

In some embodiments, $A_1$ to $A_3$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, and a 5,6,7,8-tetrahydroquinoline group.

In some embodiments, ring $A_1$ and ring $A_3$ may each independently be selected from a benzene group, a naphthalene group, a 1,2,3,4-tetrahydronaphthalene group, a fluorene group, a carbazole group, a dibenzofuran group, a dibenzothiophene group, and a dibenzosilole group.

In Formula 1, $A_4$ may be a 5-membered heterocyclic group.

In some embodiments, $A_4$ may be selected from a cyclopentadiene group, a furan group, a thiophene group, a pyrrole group, a silole group, an oxazole group, an isoxazole group, an oxadiazole group, an isooxadiazole group, an oxatriazole group, an isooxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group.

In some embodiments, $A_4$ may be a pyrrolyl group, a pyrazolyl group, an imidazolyl group, a triazolyl group, or a tetrazolyl group.

In Formula 1, $A_5$ may be at least two rings of a $C_7$-$C_{30}$ carbocyclic group including a 6-membered carbocyclic group, or $A_5$ is at least two rings of a $C_1$-$C_{30}$ heterocyclic group including a 6-membered carbocyclic group or a 6-membered heterocyclic group.

In some embodiments, the 6-membered carbocyclic group may be a cyclohexane group or a benzene group. In some embodiments, the 6-membered carbocyclic group may be a benzene group. It is to be understood that a "6-membered carbocyclic group" refers to a 6-membered carbocyclic ring in the structure of $A_5$.

In some embodiments, the 6-membered heterocyclic group may be selected from a pyridine group, a pyrimidine group, a pyrazine group, a pyridazine group, and a triazine group. In some embodiments, the 6-membered heterocyclic group may be a pyridine group. It is to be understood that a "6-membered heterocyclic group" refers to a 6-membered heterocyclic ring in the structure of $A_5$.

In some embodiments, $A_5$ may be a group represented by any one of Formulae A5-1 to A5-6:

A5-1

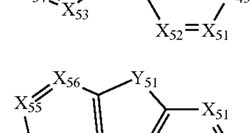

A5-2

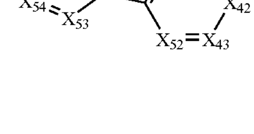

-continued

A5-3

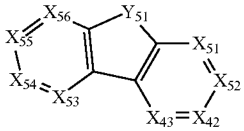

A5-4

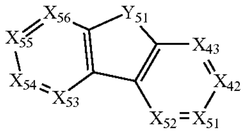

A5-5

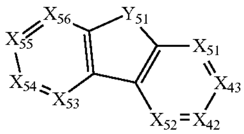

A5-6

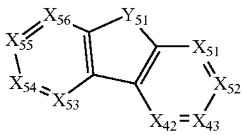

wherein, in Formulae A5-1 to A5-6, $Y_{51}$ may be *—O—*', *—S—*', *—N($R_5$)—*', *—C($R_5$)($R_6$)—*', *—Si($R_5$)($R_6$)—*', *—B($R_5$)—*', *—P($R_5$)—*',or *—P(═O)($R_5$)—*', wherein * and *' each indicate a binding site to an adjacent atom, $R_5$ and $R_6$ may respectively be understood by referring to the descriptions of $R_1$ and $R_2$ provided herein, $X_{42}$ and $X_{43}$ may respectively be understood by referring to the descriptions of $X_{42}$ and $X_{43}$ provided herein, and $X_{51}$ may be C($R_{51}$) or N, $X_{52}$ may be C($R_{52}$) or N, $X_{53}$ may be C($R_{53}$) or N, $X_{54}$ may be C($R_{54}$) or N, $X_{55}$ may be C($R_{55}$) or N, $X_{56}$ may be C($R_{56}$) or N, and $R_{51}$ to $R_{56}$ may each independently be understood by referring to the description of $R_{50}$ provided herein.

In some embodiments, $X_{51}$ to $X_{56}$ may each be CH.

In some embodiments, at least one of $X_{51}$ to $X_{56}$ may be N.

In some embodiments, one of $X_{51}$ to $X_{56}$ may be N.

In Formula 1, $X_{10}$, $X_{20}$, $X_{30}$, and $X_4$ to $X_{44}$ may each independently be C or N.

In some embodiments, $X_{10}$ may be N, and $X_{20}$, $X_{30}$, and $X_{40}$ may each be C.

In some embodiments, $X_4$ in $A_4$ may be C, and $X_{41}$ and $X_{44}$ may each be N.

In some embodiments, $X_{42}$ and $X_{43}$ in $A_4$ may each be C.

In some embodiments, a bond between $M_1$ and $X_{10}$, a bond between $M_1$ and $X_{20}$, a bond between $M_1$ and $X_{30}$, and a bond between $M_1$ and $X_4$ may each independently be a coordinate bond or a covalent bond.

In Formula 1, at least two of a bond between $M_1$ and $X_{10}$, a bond between $M_1$ and $X_{20}$, a bond between $M_1$ and $X_{30}$, or a bond between $M_1$ and $X_{40}$ may each be a covalent bond, and the other two bonds may each be a coordinate bond. The organometallic compound represented by Formula 1 may be electrically neutral.

In some embodiments, a bond between $M_1$ and $X_{10}$ may be a coordinate bond, a bond between $M_1$ and $X_{20}$ may be a covalent bond, a bond between $M_1$ and $X_{30}$ may be a covalent bond, and a bond between $M_1$ and $X_{40}$ may be a coordinate bond.

In Formula 1, $T_1$ to $T_3$ may each independently be a single bond, *—N[($L_1$)$_{a1}$-($R_1$)$_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*, *—O—*', *—C(═O)—*', *—S(═O)—*', *—S(═O)$_2$—*, *—C($R_1$)═*, *═C($R_1$)—*, *—C($R_1$)═C($R_2$)—*, *—C(═S)—*', or *—C≡C—*', wherein * and *' each indicate a binding site to an adjacent atom. $R_1$ and $R_2$ may respectively be understood by referring to the descriptions of $R_1$ and $R_2$ provided herein.

In some embodiments, $T_1$ to $T_3$ may each independently be *—N[($L_1$)$_{a1}$-($R_1$)$_{b1}$]—*, *—C($R_1$)($R_2$)—*', *—Si($R_1$)($R_2$)—*', *—O—*', or *—S—*'. In some embodiments, $T_1$ may be *—N[($L_1$)$_{a1}$-($R_1$)$_{b1}$]—*', *—O—*', or *—S—*', wherein * and *' each indicate a binding site to an adjacent atom.

In Formula 1, n1 to n3 may each independently be an integer from 1 to 3.

In some embodiments, n1 to n3 may each independently be 1 or 2.

In some embodiments, n1 to n3 may each be 1.

In Formula 1, $L_1$ may be a single bond, a substituted or unsubstituted $C_5$-$C_{30}$ carbocyclic group, or a substituted or unsubstituted $C_1$-$C_3$ heterocyclic group.

In some embodiments, $L_1$ may be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

In Formula 1, a1 may be an integer from 1 to 3, and when a1 is 2 or greater, at least two $L_1$ groups may be identical to or different from each other. In some embodiments, a1 may be 1 or 2.

In Formula 1, $R_1$, $R_2$, $R_{10}$, $R_{20}$, $R_{30}$, $R_{40}$, and $R_{50}$ may each independently be hydrogen, deuterium, —F, —C, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P($Q_8$)($Q_9$), or —P(═O)($Q_8$)($Q_9$).

At least two adjacent groups $R_1$, $R_2$, $R_{10}$, $R_{20}$, $R_{30}$, $R_{40}$, or $R_{50}$ may optionally be bound together to form a substituted or unsubstituted $C_5$-$C_{30}$ carbocyclic group or a substituted or unsubstituted $C_1$-$C_{30}$ heterocyclic group, for example any two or more adjacent groups $R_1$, $R_2$, $R_{10}$, $R_{20}$, $R_{30}$, $R_{40}$, or $R_{50}$ may optionally be bound together through a single bond, a double bond, or a first linking group to form a substituted or unsubstituted $C_5$-$C_{30}$ carbocyclic group or a substituted or unsubstituted $C_1$-$C_{30}$ heterocyclic group. In some embodiments, the substituted $C_5$-$C_{30}$ carbocyclic group and the substituted $C_1$-$C_{30}$ heterocyclic group may each independently be substituted with at least one $R_{10a}$. $R_{10a}$ may be understood by referring to the description of $R_1$ provided herein. For example, two adjacent groups $R_1$, $R_2$, $R_{10}$, $R_{20}$, $R_{30}$, $R_{40}$, and $R_{50}$ optionally may together form a fluorene group, a xanthene group, or an acridine group, each unsubstituted or substituted with at least one $R_{10a}$.

The first linking group may be *—N($R_3$)—*', *—B($R_3$)—*', *—P($R_3$)—*', *—C($R_3$)($R_4$)—*', *—Si($R_3$)($R_4$)—*', *—Ge($R_3$)($R_4$)—*', *—S—*', *—Se—*', *—O—*', *—C(═O)—*', *—S(═O)—*', *—S(═O)$_2$—*', *—C($R_3$)═*', *═C($R_3$)—*', *—C($R_3$)═C($R_4$)—*', *—C(═S)—*', or *—C≡C—*', $R_3$ and $R_4$ may each be understood by referring to the description of $R_1$ provided herein, and * and *' may each indicate a binding site to an adjacent atom.

In Formula 1, b1 may be an integer from 1 to 5, and when b1 is 2 or greater, at least two $R_1$ groups may be identical to or different from each other. In some embodiments, b1 may be 1, 2, or 3.

In Formula 1, b10, b20, b30, and b50 may each independently be an integer from 1 to 10, b40 may be an integer from 1 to 3, and when b10 is 2 or greater, at least two $R_{10}$ groups may be identical to or different from each other, when b20 is 2 or greater, at least two $R_{20}$ groups may be identical to or different from each other, when b30 is 2 or greater, at least two $R_{30}$ groups may be identical to or different from each other, when b40 is 2 or greater, at least two $R_4$ groups may be identical to or different from each other, when b50 is 2 or greater, at least two $R_{50}$ groups may be identical to or different from each other.

In some embodiments, $R_1$, $R_2$, $R_{10}$, $R_{20}$, $R_{30}$, $R_{40}$, and $R_{50}$ may each independently be:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or —N($Q_1$)($Q_2$), —Si($Q_3$)($Q_4$)($Q_5$), —Ge($Q_3$)($Q_4$)($Q_5$), —B($Q_6$)($Q_7$), —P($Q_8$)($Q_9$), or —P(═O)($Q_8$)($Q_9$), wherein $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, or a naphthyl group; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one of deuterium, a $C_1$-$C_{10}$ alkyl group, or a phenyl group.

In some embodiments, $R_1$ and $R_2$ may each independently be:

a $C_1$-$C_{30}$ alkyl group;

a $C_1$-$C_{30}$ alkyl group substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group.

In some embodiments, $R_1$, $R_2$, $R_{10}$, $R_{20}$, $R_{30}$, $R_{40}$, and $R_{50}$ may each independently be:

hydrogen, deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, or a dibenzothiophenyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, or a dibenzothiophenyl group, each substituted with at least one of deuterium, —F, $—CD_3$, $—CD_2H$, $—CDH_2$, $—CF_3$, $—CF_2H$, $—CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, or a dibenzothiophenyl group; or $—N(Q_1)(Q_2)$, $—Si(Q_3)(Q_4)(Q_5)$, $—Ge(Q_3)(Q_4)(Q_5)$, $—B(Q_6)(Q_7)$, $—P(Q_8)(Q_9)$, or $—P(=O)(Q_8)(Q_9)$, wherein $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, or a naphthyl group; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one of deuterium, a $C_1$-$C_{10}$ alkyl group, or a phenyl group.

In some embodiments, $R_1$, $R_2$, $R_{10}$, $R_{20}$, $R_{30}$, $R_{40}$, and $R_{50}$ may each independently be: hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, a group represented by any one of Formulae 9-1 to 9-19, or a group represented by any one of Formulae 10-1 to 10-194:

9-1

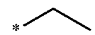

9-2

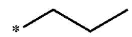

9-3

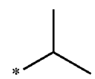

9-4

9-5

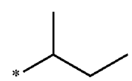

9-6

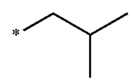

9-7

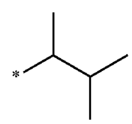

9-8

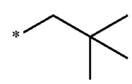

9-9

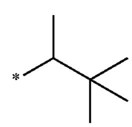

9-10

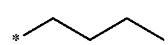

9-11

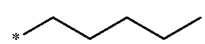

9-12

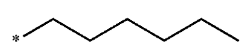

9-13

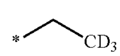

9-14

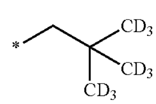

9-15

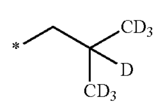

9-16

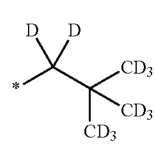

-continued
9-17
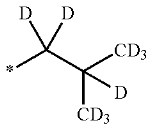
9-18
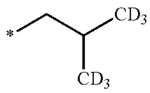
9-19
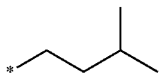
10-1
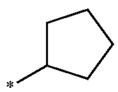
10-2
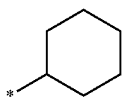
10-3
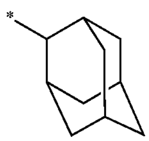
10-4
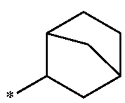
10-5
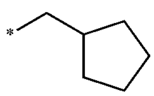
10-6
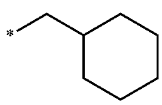
10-7
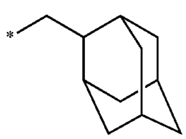
10-8
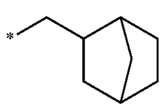
10-9
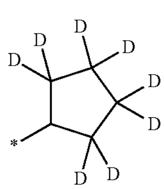
-continued
10-10
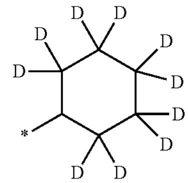
10-11
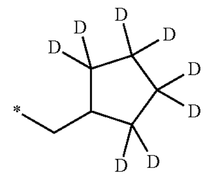
10-12
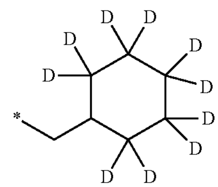
10-13
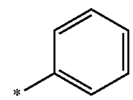
10-14
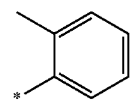
10-15
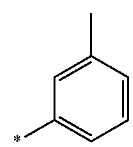
10-16
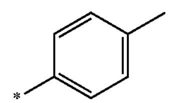
10-17
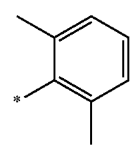
10-18
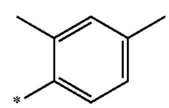
10-19
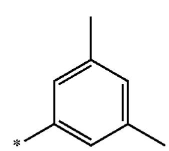
10-20
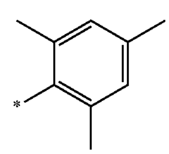

-continued
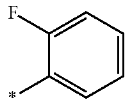
10-21
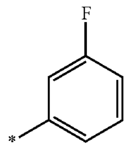
10-22
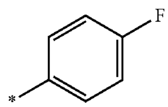
10-23
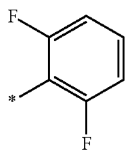
10-24
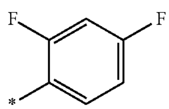
10-25
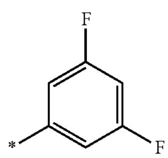
10-26
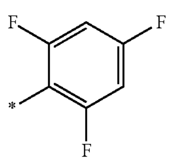
10-27
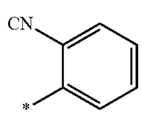
10-28
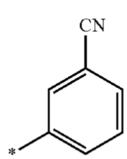
10-29
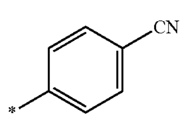
10-30
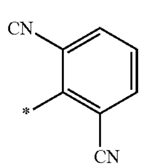
10-31
-continued
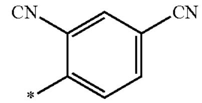
10-32
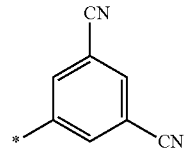
10-33
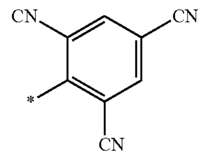
10-34
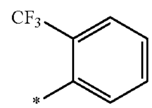
10-35
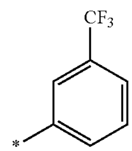
10-36
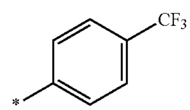
10-37
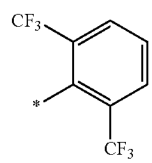
10-38
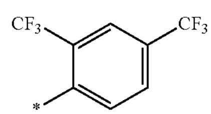
10-39
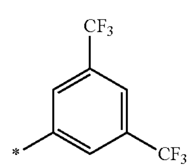
10-40
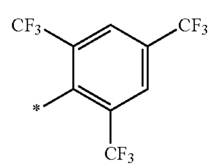
10-41
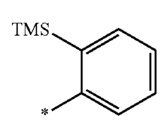
10-42

-continued
10-43
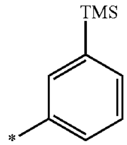
10-44
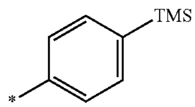
10-45
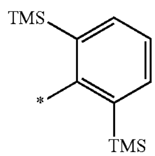
10-46
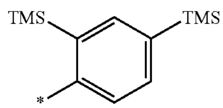
10-47
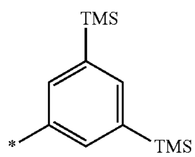
10-48
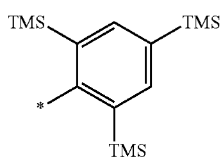
10-49
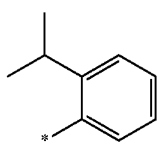
10-50
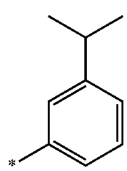
10-51
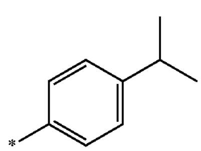
10-52
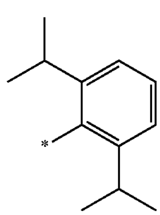
-continued
10-53
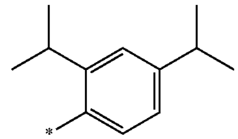
10-54
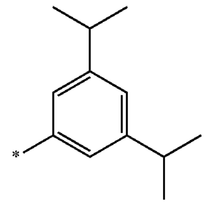
10-55
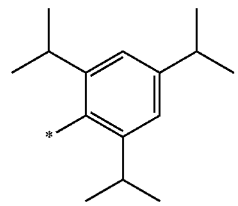
10-56
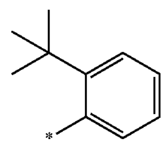
10-57
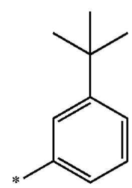
10-58
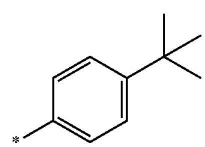
10-59
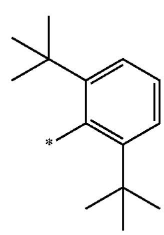
10-60
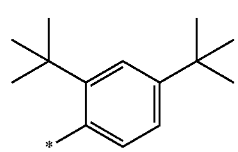

-continued
10-61
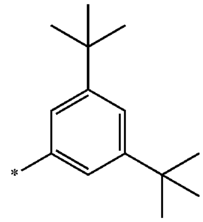
10-62
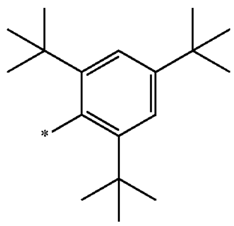
10-63
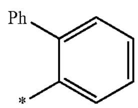
10-64
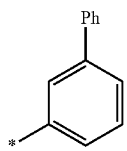
10-65
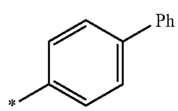
10-66
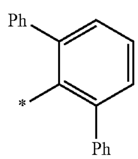
10-67
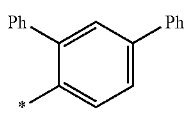
10-68
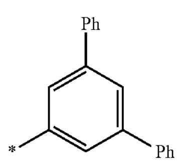
10-69
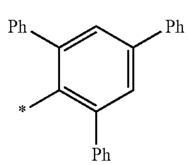
10-70
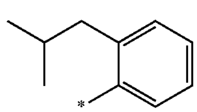
-continued
10-71
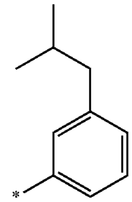
10-72
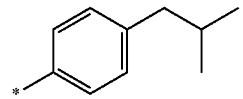
10-73
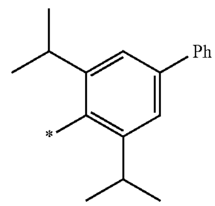
10-74
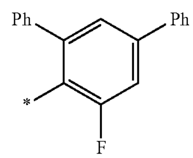
10-75
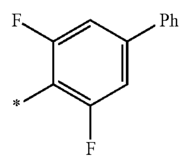
10-76
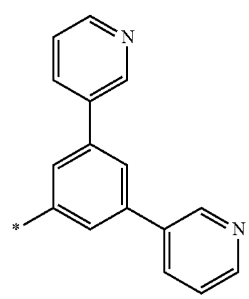
10-77
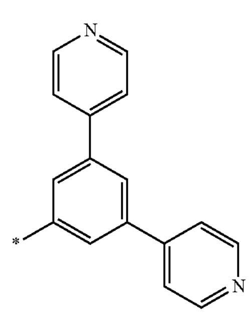

-continued
10-78
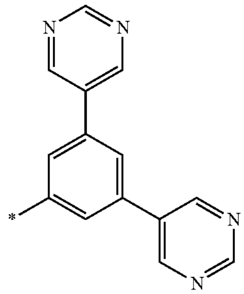
10-79
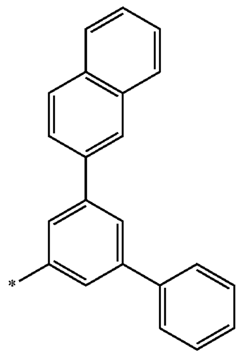
10-80
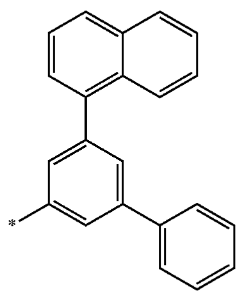
10-81
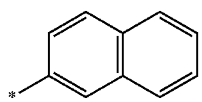
10-82
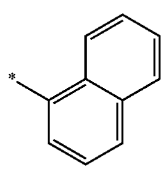
10-83
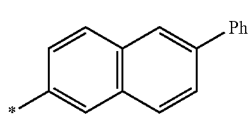
10-84
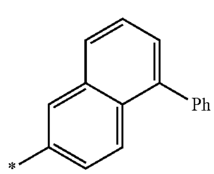
-continued
10-85
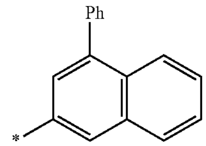
10-86
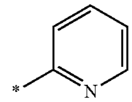
10-87
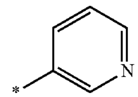
10-88
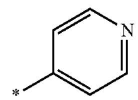
10-89
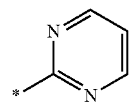
10-90
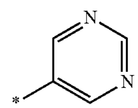
10-91
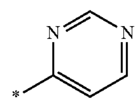
10-92
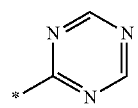
10-93
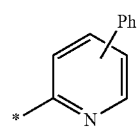
10-94
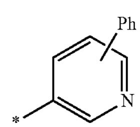
10-95
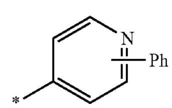
10-96
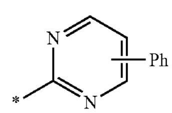
10-97
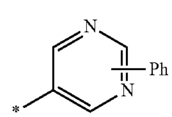

-continued
10-98
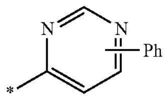
10-99
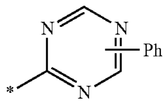
10-100
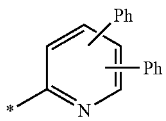
10-101
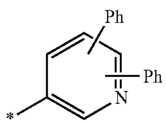
10-102
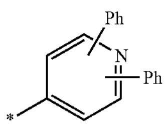
10-103
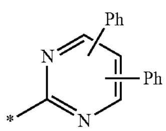
10-104
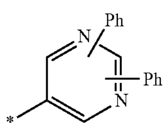
10-105
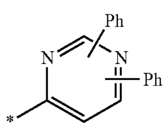
10-106
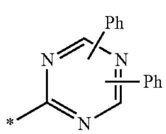
10-107
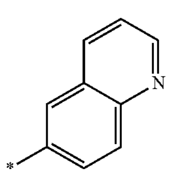
10-108
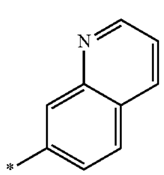
-continued
10-109
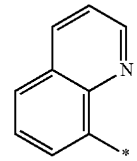
10-110
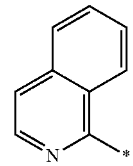
10-111
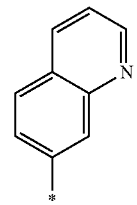
10-112
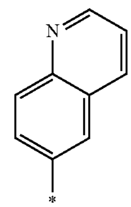
10-113
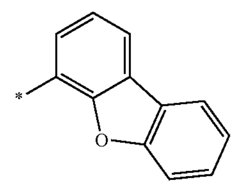
10-114
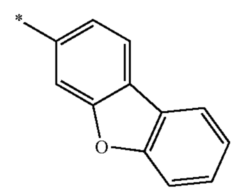
10-115
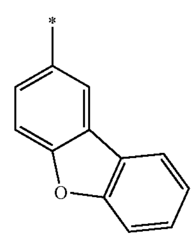
10-116
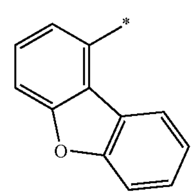

-continued
10-117
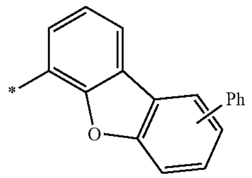
10-118
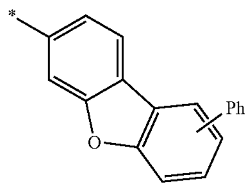
10-119
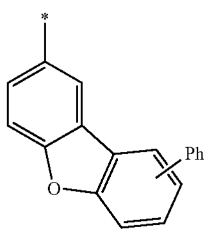
10-120
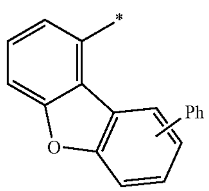
10-121
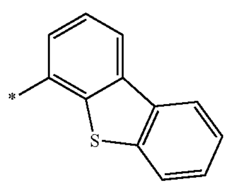
10-122
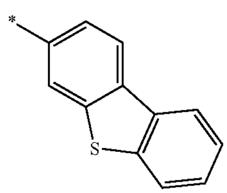
10-123
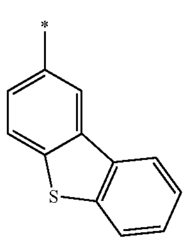
10-124
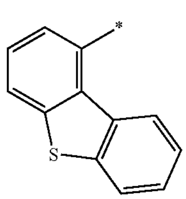
-continued
10-125
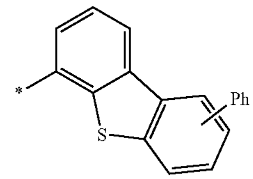
10-126
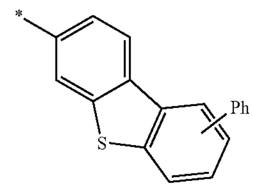
10-127
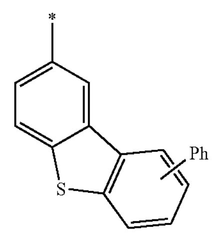
10-128
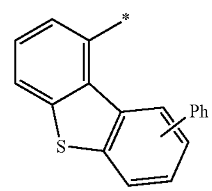
10-129
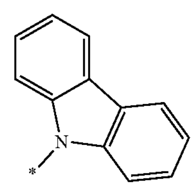
10-130
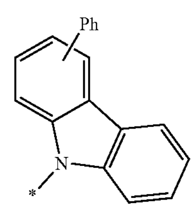
10-131
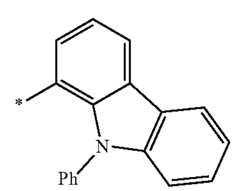
10-132
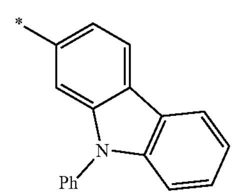

10-133
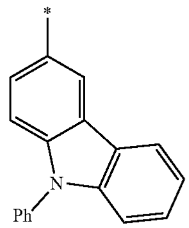
10-134
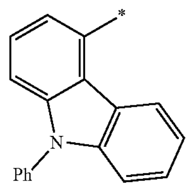
10-135
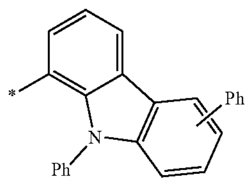
10-136
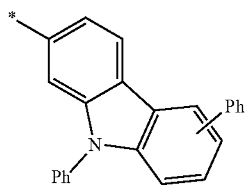
10-137
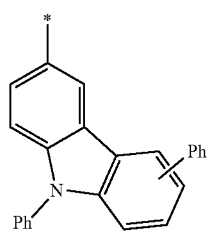
10-138
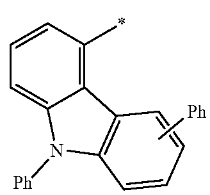
10-139
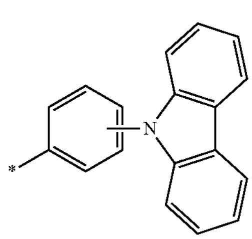
10-140
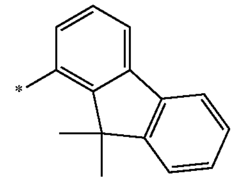
10-141
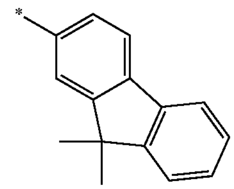
10-142
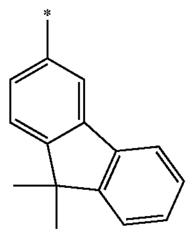
10-143
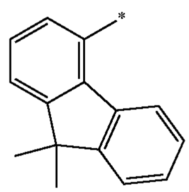
10-144
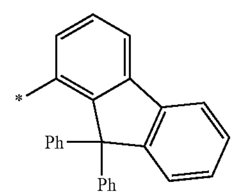
10-145
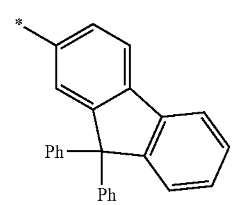
10-146
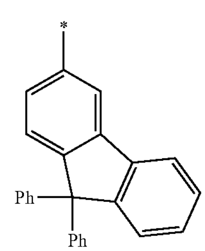

-continued
10-147
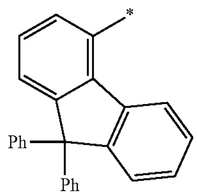
10-148
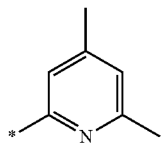
10-149
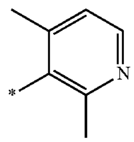
10-150
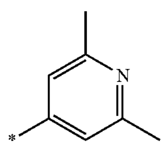
10-151
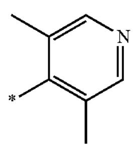
10-152
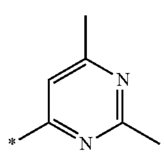
10-153
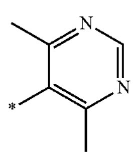
10-154
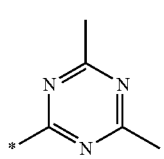
10-155
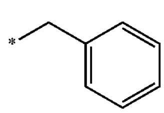
10-156
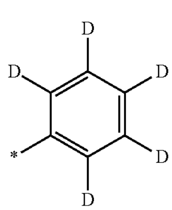
-continued
10-157
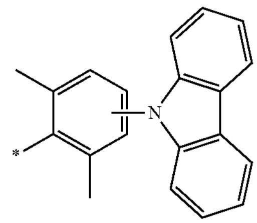
10-158
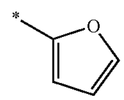
10-159
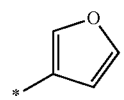
10-160
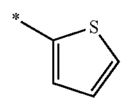
10-161
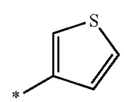
10-162
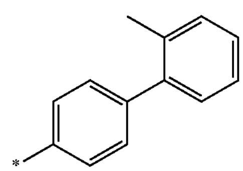
10-163
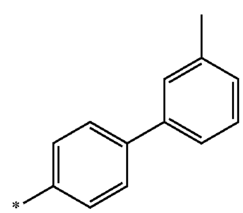
10-164
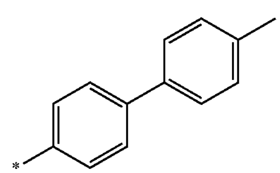
10-165
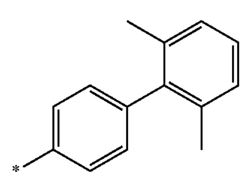
10-166
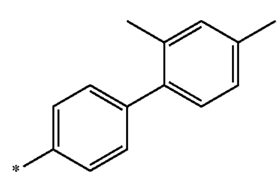

-continued
10-167
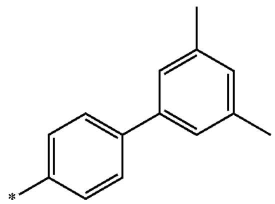
10-168
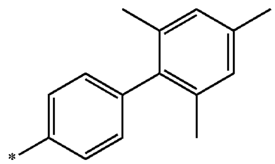
10-169
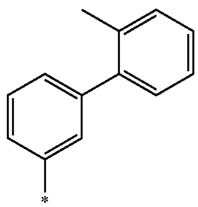
10-170
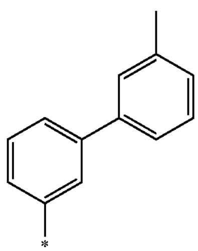
10-171
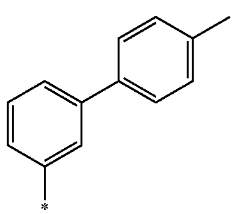
10-172
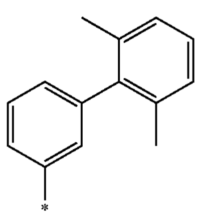
10-173
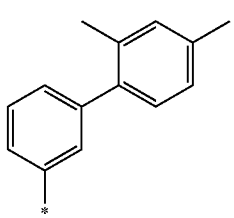
-continued
10-174
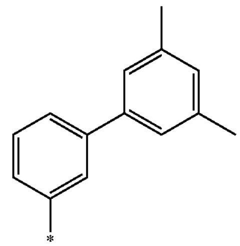
10-175
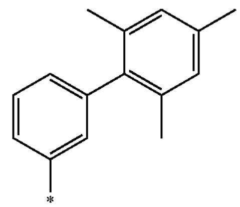
10-176
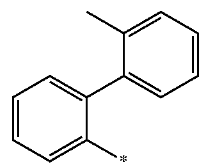
10-177
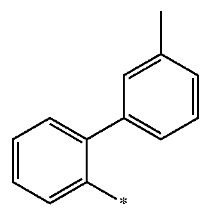
10-178
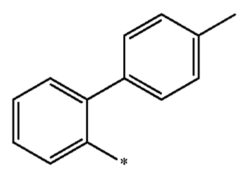
10-179
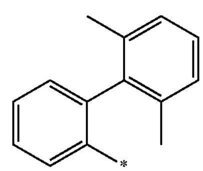
10-180
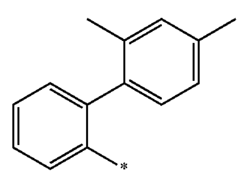
10-181
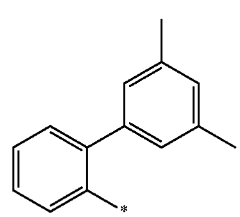

-continued 10-182

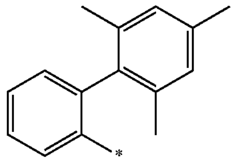

10-183

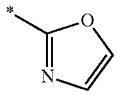

10-184

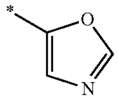

10-185

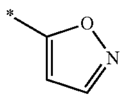

10-186

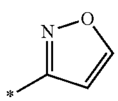

10-187

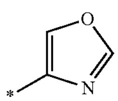

10-188

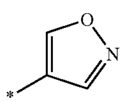

10-189

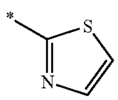

10-190

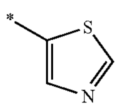

10-191

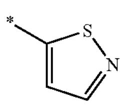

10-192

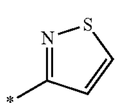

10-193

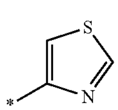

10-194

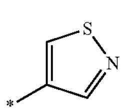

wherein, in Formulae 9-1 to 9-19 and 10-1 to 10-194, * indicates a binding site to an adjacent atom, "Ph" indicates a phenyl group, and "TMS" indicates a trimethylsilyl group.

In some embodiments, at least one $R_{10}$ may be any one of Formulae 9-1 to 9-19.

In some embodiments, at least one $R_{40}$ may be any one of Formulae 9-1 to 9-19 or Formulae 10-1 to 10-194.

In some embodiments, at least one of $R_1$, $R_2$, $R_{10}$, $R_{20}$, $R_{30}$, $R_{40}$, or $R_{50}$ may be:

a $C_1$-$C_{30}$ alkyl group; or a $C_1$-$C_{30}$ alkyl group substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group.

In Formula 1, b1, b10, b20, b30, b40, and b50 may each respectively indicate the number of $R_1$ groups, $R_{10}$ groups, $R_{20}$ groups, $R_{30}$ groups, $R_{40}$ groups, and $R_{50}$ groups, wherein b1 may be an integer from 1 to 5, when b1 is 2 or greater, at least two $R_1$(s) may be identical to or different from each other, b10, b20, b30, and b50 are each independently an integer from 1 to 10, b40 is an integer from 1 to 3, when b10 is 2 or greater, at least two $R_{10}$ groups may be identical to or different from each other, when b20 is 2 or greater, at least two $R_{20}$ groups may be identical to or different from each other, when b30 is 2 or greater, at least two $R_{30}$ groups may be identical to or different from each other, when b40 is 2 or greater, at least two $R_{40}$ groups are identical to or different from each other, when b50 is 2 or greater, at least two $R_{50}$ groups may be identical to or different from each other.

In some embodiments, b10 and b40 may each independently be an integer from 1 to 4, and b20 and b30 may each independently be an integer from 1 to 3.

In some embodiments, at least two selected from $R_1$, $R_2$, $R_{10}$, $R_{20}$, $R_{30}$, $R_{40}$, and $R_{50}$ may optionally be bound together to form a substituted or unsubstituted $C_5$-$C_{30}$ carbocyclic group or a substituted or unsubstituted $C_1$-$C_{30}$ heterocyclic group.

In some embodiments, in Formula 1, when b10 is 2 or greater, at least two $R_{10}$ groups may optionally be bound together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$.

In some embodiments, in Formula 1, when b20 is 2 or greater, at least two $R_{20}$ groups may optionally be bound together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$.

In some embodiments, in Formula 1, when b30 is 2 or greater, at least two $R_{30}$ groups may optionally be bound together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$.

In some embodiments, in Formula 1, when b40 is 2 or greater, at least two $R_{40}$ groups may optionally be bound together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$.

In some embodiments, in Formula 1, when b50 is 2 or greater, at least two $R_{50}$ groups may optionally be bound together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$.

In some embodiments, in Formula 1, $R_1$ and $R_2$ may optionally be bound together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$.

In some embodiments, in Formula 1, any one of $R_1$ or $R_2$ and any one of $R_{10}$, $R_{20}$, $R_{30}$, $R_{40}$, or $R_{50}$ may optionally be bound together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$.

In some embodiments, the organometallic compound represented by Formula 1 may be represented by any one of Formulae 11-1 to 11-6:

Formula 11-1

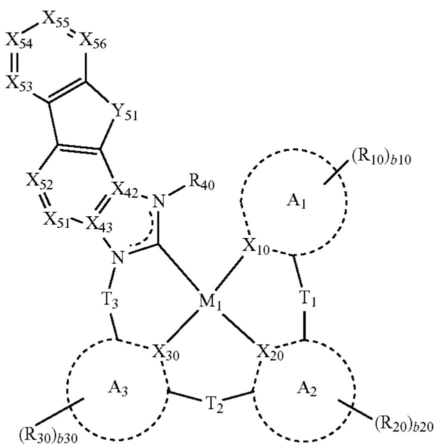

Formula 11-2

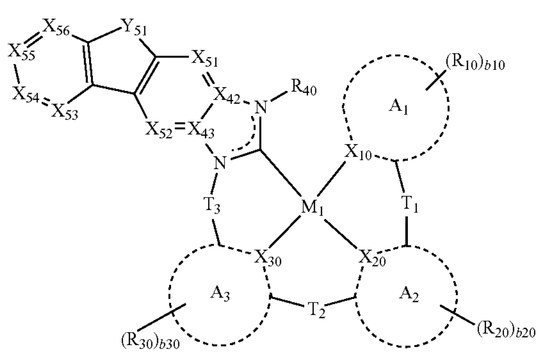

Formula 11-3

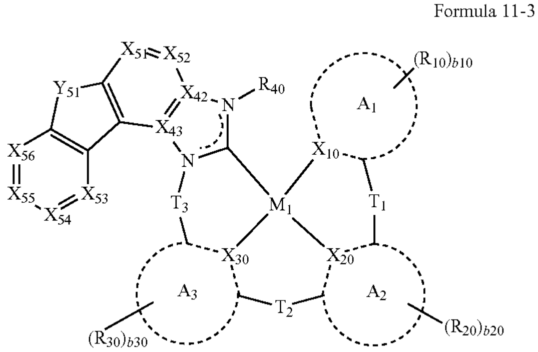

-continued

Formula 11-4

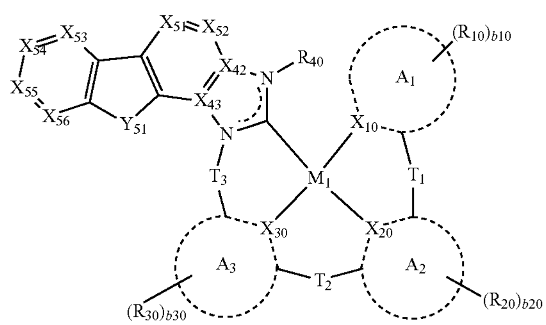

Formula 11-5

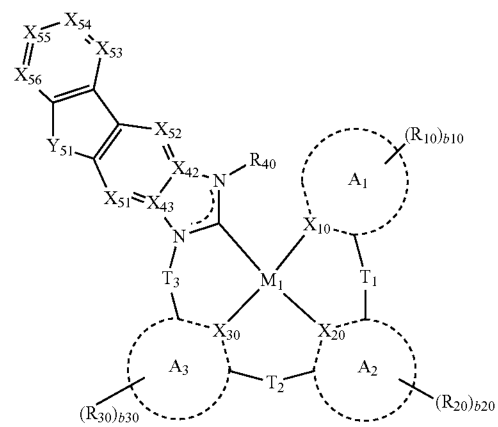

Formula 11-6

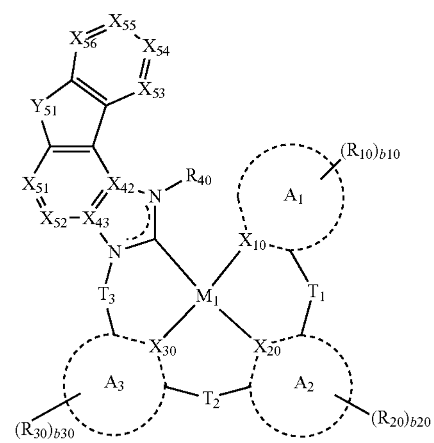

wherein, in Formulae 11-1 to 11-6, $M_1$, $A_1$ to $A_3$, $X_{10}$, $X_{20}$, $X_{30}$, $X_{42}$, $X_{43}$, T to $T_3$, $R_{10}$, $R_{20}$, $R_{30}$, $R_{40}$, $R_{50}$, b10, b20, and b30 may respectively be understood by referring to the descriptions of $M_1$, $A_1$ to $A_3$, $X_{10}$, $X_{20}$, $X_{30}$, $X_{42}$, $X_{43}$, $T_1$ to $T_3$, $R_{10}$, $R_{20}$, $R_{30}$, $R_{40}$, $R_{50}$, b10, b20, and b30 provided herein, $Y_{51}$ may be *—O—*', *—S—*', *—N($R_5$)—*' *—C($R_5$)($R_6$)—*', *—Si($R_5$)($R_6$)—*', *—B($R_5$)—*", *—P($R_5$)—*', or *—P(═O)($R_5$)—*', wherein * and *' may each indicate a binding site to an adjacent atom, $R_5$ and $R_6$ may respectively be understood by referring to the descriptions of R and $R_2$ provided herein, $X_{51}$ may be C($R_{51}$) or N, $X_{52}$ may be C($R_{52}$) or N, $X_{53}$ may be C($R_{53}$) or N, $X_{54}$ may be C($R_{54}$) or N, $X_{55}$ may be C($R_{55}$) or N, $X_{56}$ may be C($R_{56}$) or N, and $R_{51}$ to $R_{56}$ may each independently be understood by referring to the description of $R_{50}$ provided herein.

In some embodiments, the organometallic compound represented by Formula 1 may be represented by any one of Formulae 12-1 to 12-6:

Formula 12-1

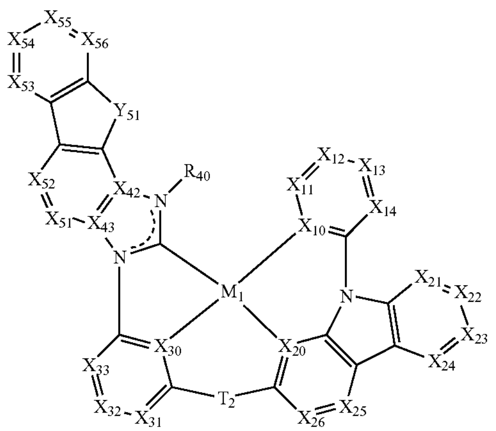

Formula 12-2

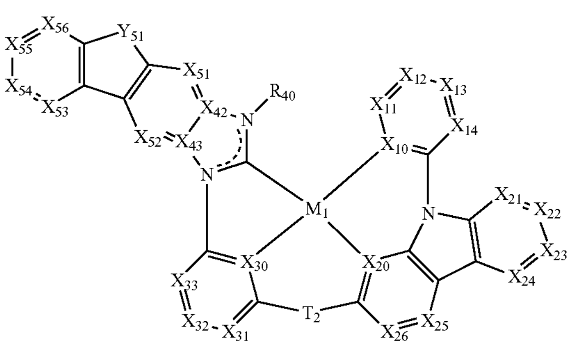

Formula 12-3

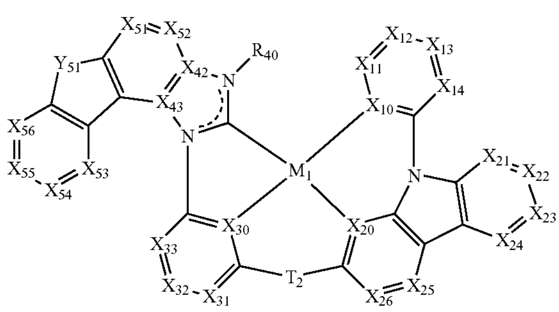

Formula 12-4

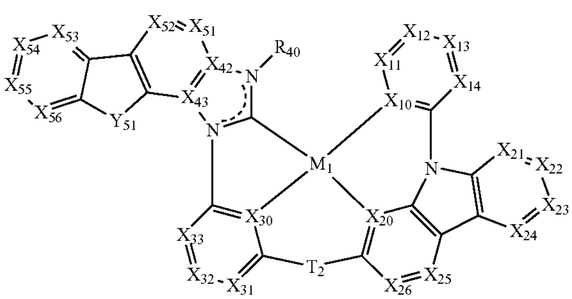

-continued

Formula 12-5

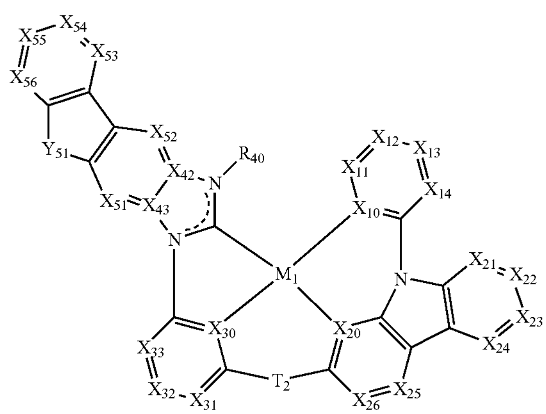

Formula 12-6

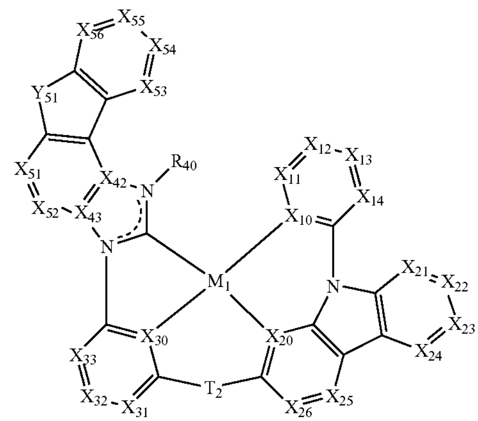

wherein, in Formulae 12-1 to 12-6,

- $M_1$, $X_{10}$, $X_{20}$, $X_{30}$, $X_{42}$, $X_{43}$, $R_{40}$, and $T_2$ may respectively be understood by referring to the descriptions of $M_1$, $X_{10}$, $X_{20}$, $X_{30}$, $X_{42}$, $X_{43}$, $R_{40}$, and $T_2$ provided herein,
- $Y_{51}$ may be *—O—*', *—S—*', *—N($R_5$)—*', *—C($R_5$)($R_6$)—*', *—Si($R_5$)($R_6$)—*', *—B($R_5$)—*', *—P($R_5$)—*', or *—P(=O)($R_5$)—*', wherein * and *' may each indicate a binding site to an adjacent atom,
- $R_5$ and $R_6$ may respectively be understood by referring to the descriptions of $R_1$ and $R_2$ provided herein,
- $X_{11}$ may be C($R_{11}$) or N, $X_{12}$ may be C($R_{12}$) or N, $X_{13}$ may be C($R_{13}$) or N, $X_{14}$ may be C($R_{14}$) or N,
- $X_{21}$ may be C($R_{21}$) or N, $X_{22}$ may be C($R_{22}$) or N, $X_{23}$ may be C($R_{23}$) or N, $X_{24}$ may be C($R_{24}$) or N, $X_{25}$ may be C($R_{25}$) or N, $X_{26}$ may be C($R_{26}$) or N, and
- $X_{31}$ may be C($R_{31}$) or N, $X_{32}$ may be C($R_{32}$) or N, $X_{33}$ may be C($R_{33}$) or N,
- $X_{51}$ may be C($R_{51}$) or N, $X_{52}$ may be C($R_{52}$) or N, $X_{53}$ may be C($R_{53}$) or N, $X_{54}$ may be C($R_{54}$) or N, $X_{55}$ may be C($R_{55}$) or N, $X_{56}$ may be C($R_{56}$) or N,
- $R_{11}$ to $R_{14}$ may each independently be understood by referring to the description of $R_{10}$ provided herein,
- $R_{21}$ to $R_{26}$ may each independently be understood by referring to the description of $R_{20}$ provided herein,
- $R_{31}$ to $R_{33}$ may each independently be understood by referring to the description of $R_{30}$ provided herein, and
- $R_{51}$ to $R_{56}$ may each independently be understood by referring to the description of $R_{50}$ provided herein.

In one or more embodiments, the organometallic compound may be any one of Compounds 1 to 72, but embodiments are not limited thereto:

-continued
1
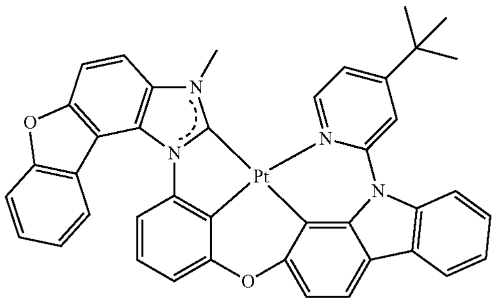
2
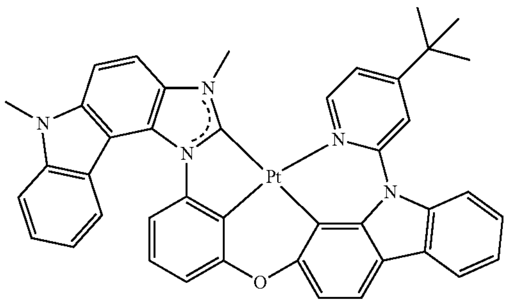
3
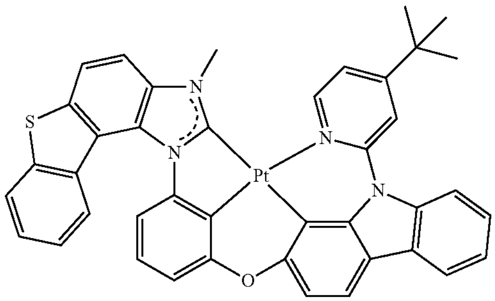
4
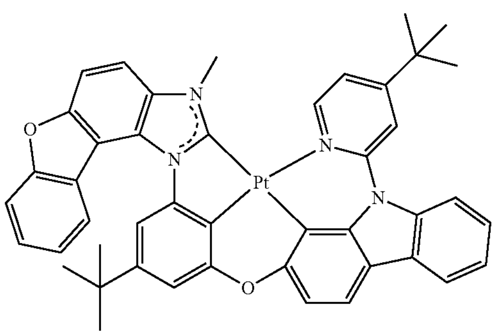
5
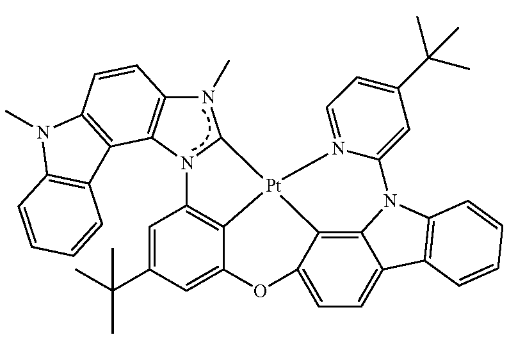
6
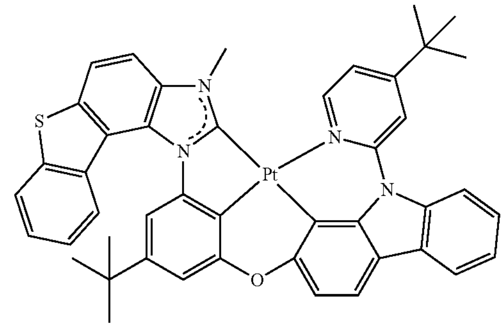
7
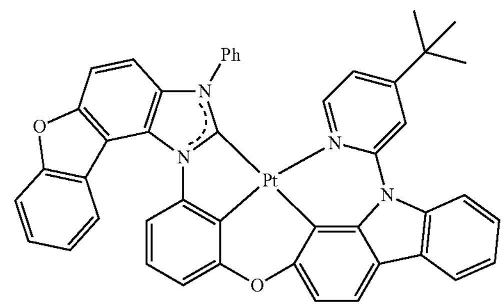
8
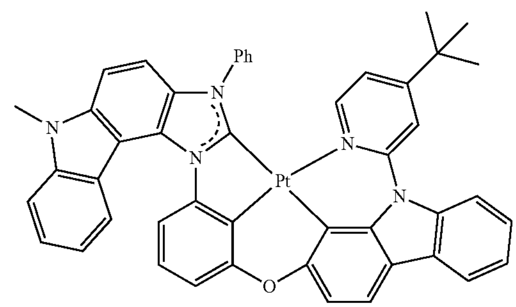
9
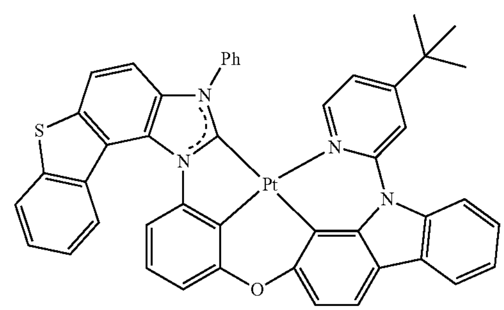
10
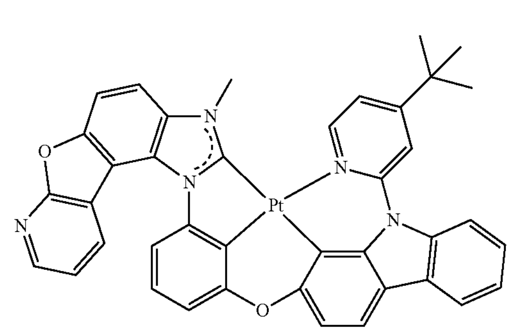

-continued
11
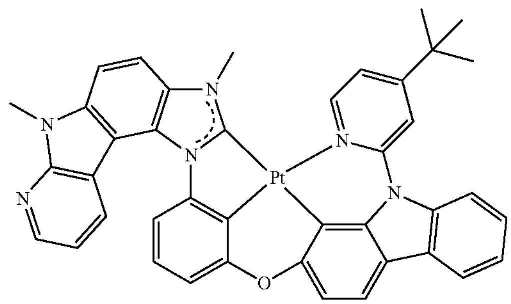
12
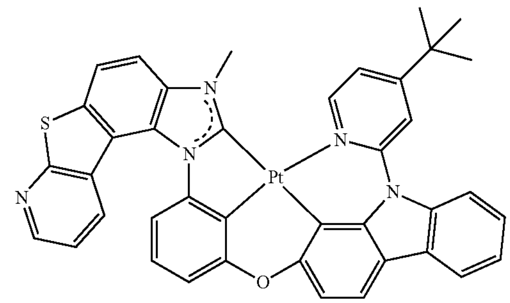
13
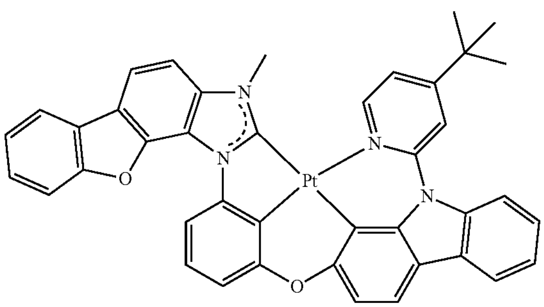
14
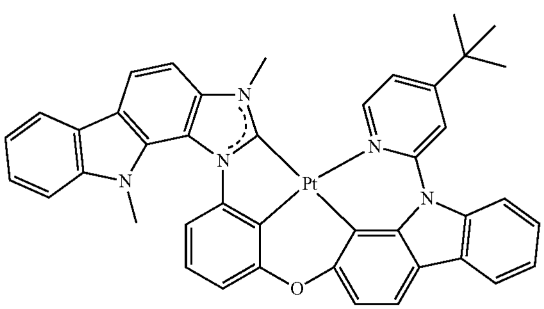
15
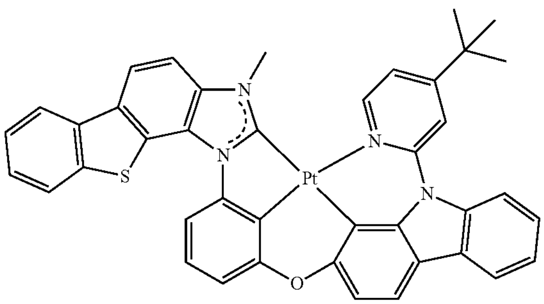
-continued
16
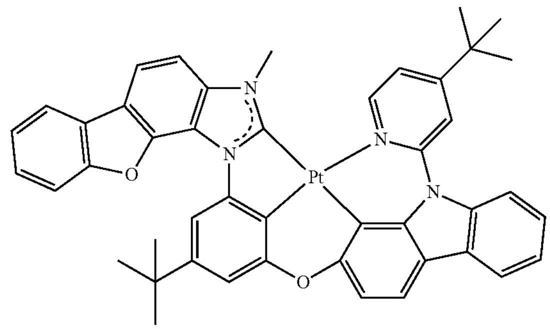
17
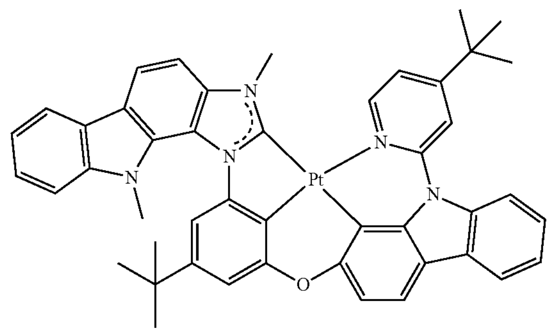
18
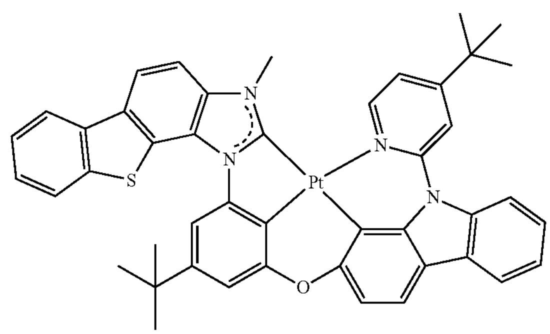
19
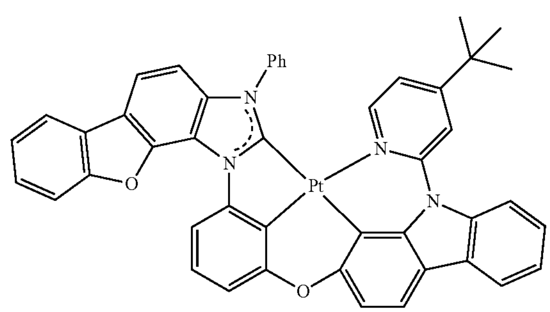

-continued
20
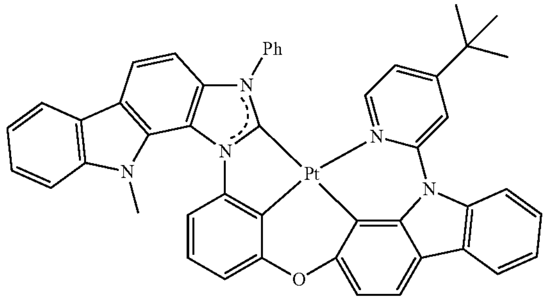
21
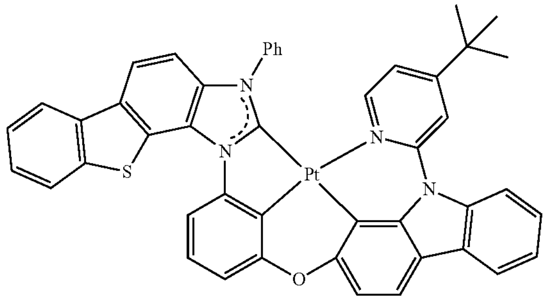
22
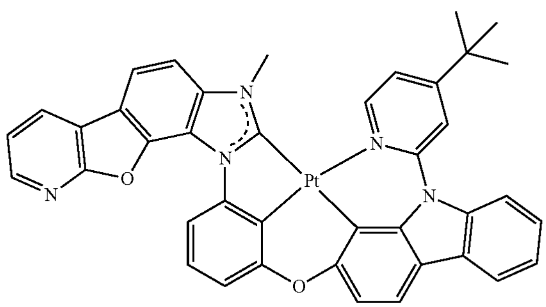
23
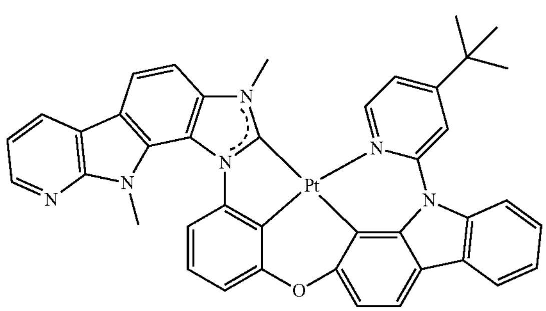
24
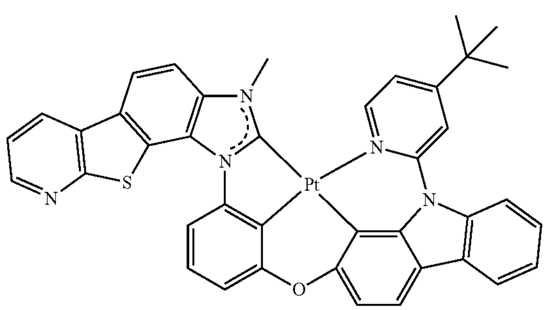
-continued
25
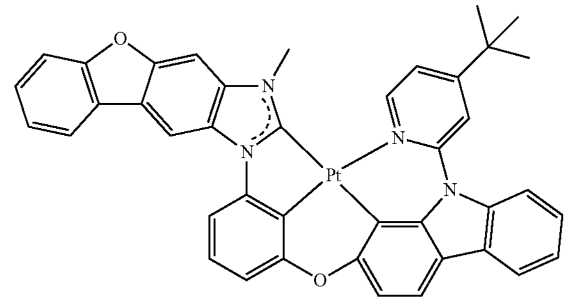
26
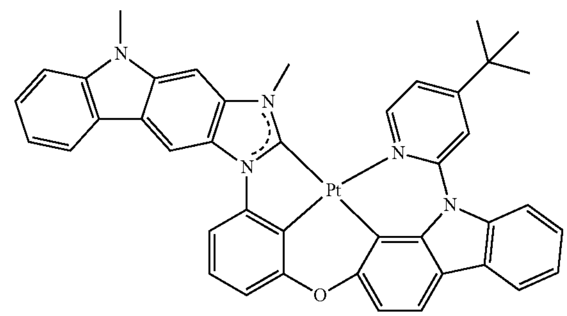
27
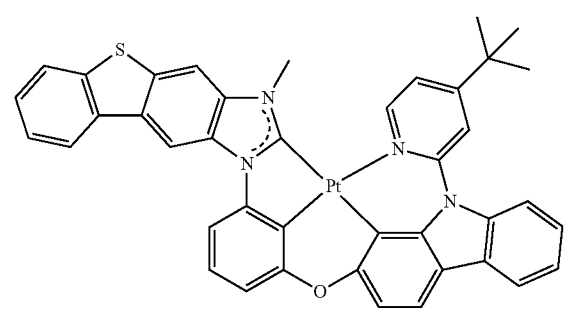
28
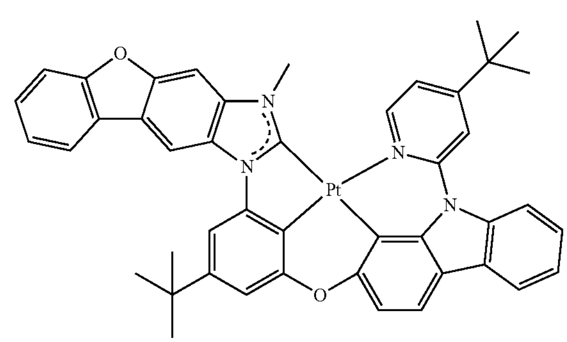

-continued
29
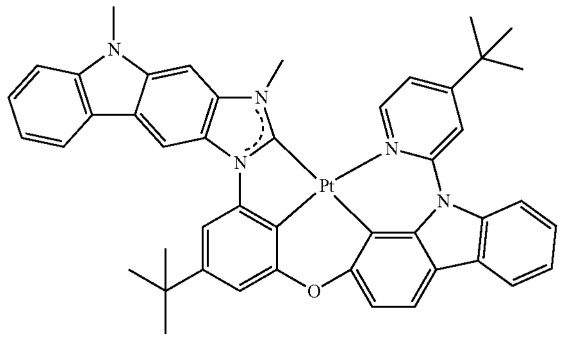
30
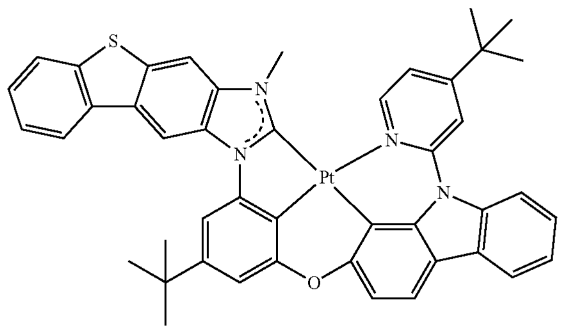
31
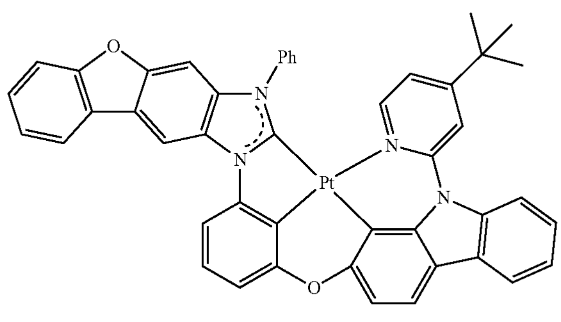
32
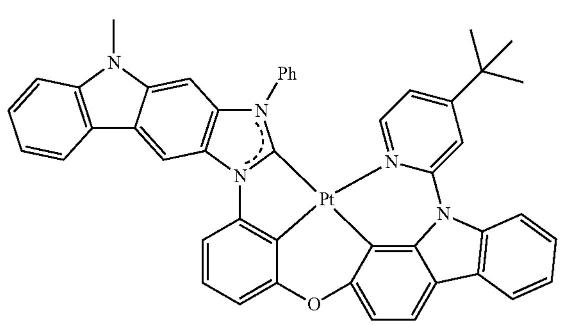
-continued
33
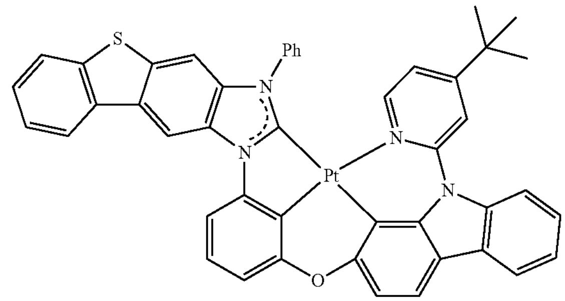
34
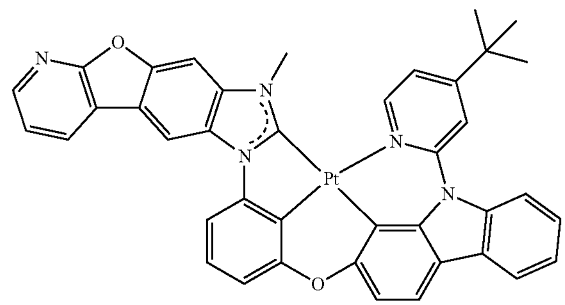
35
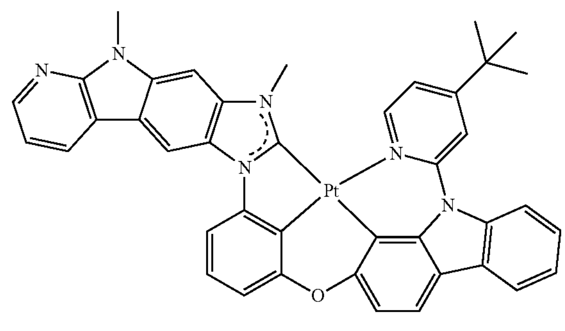
36
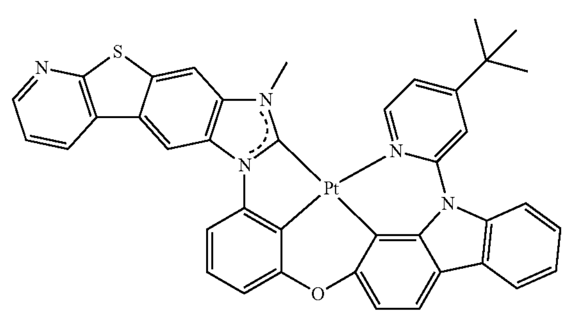

37
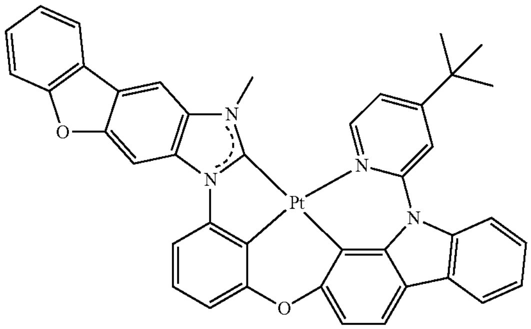
38
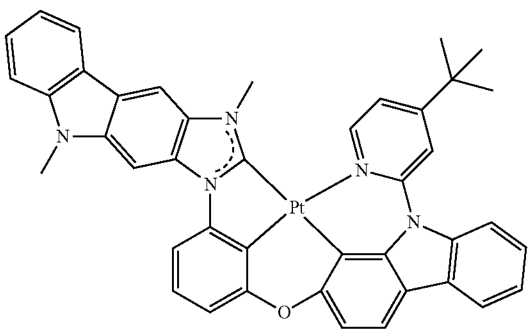
39
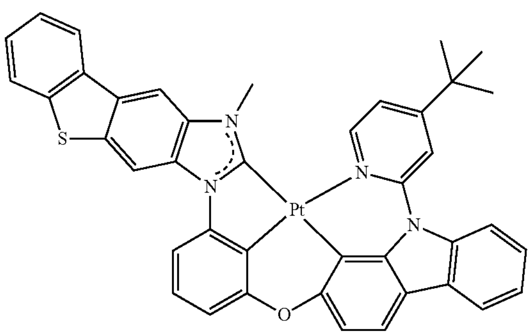
40
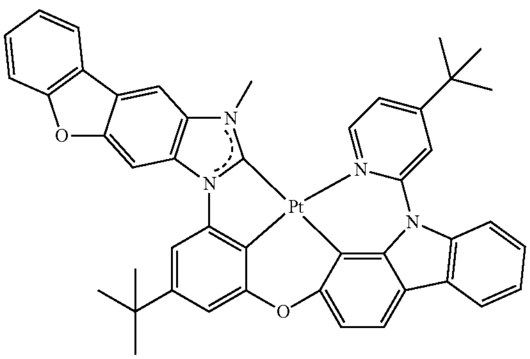
41
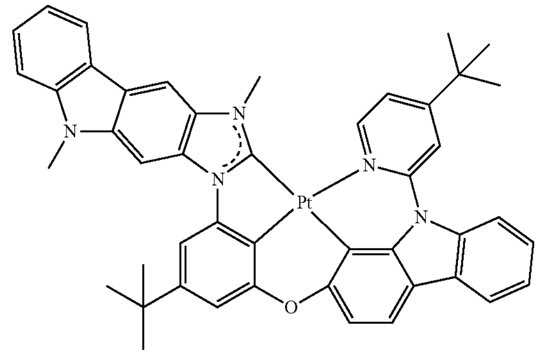
42
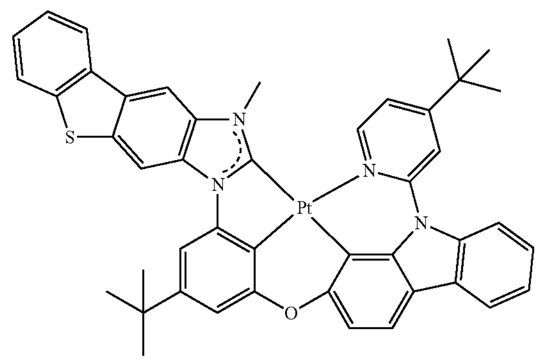
43
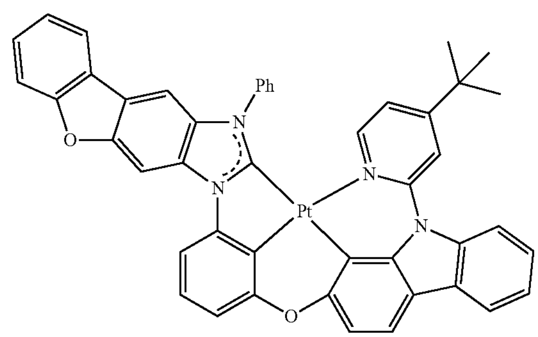
44
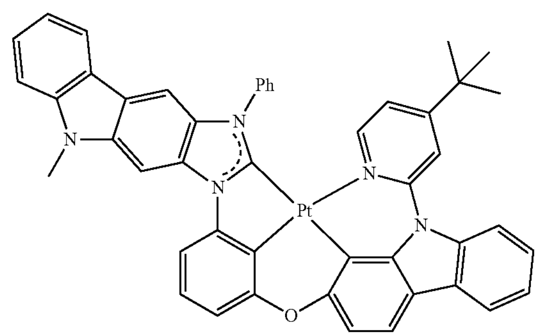

-continued
45
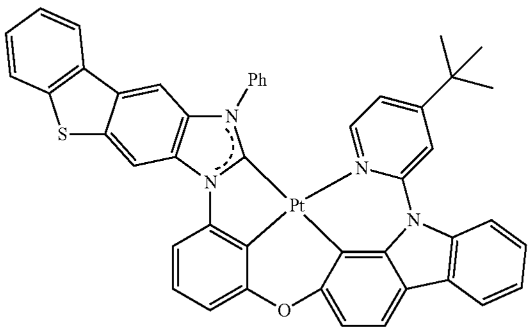
46
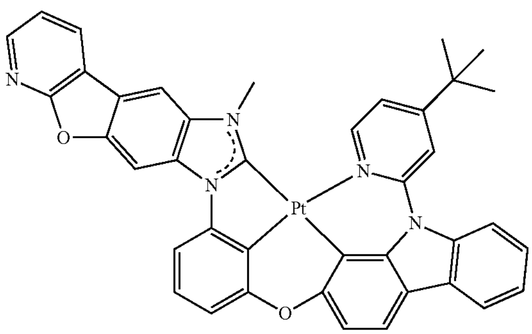
47
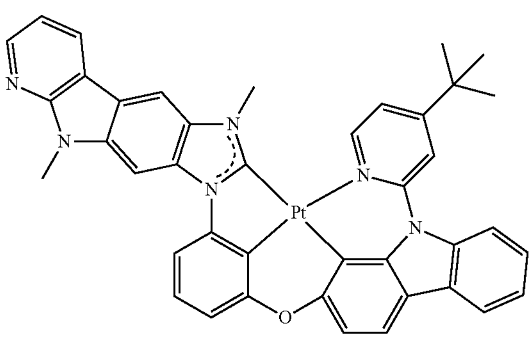
48
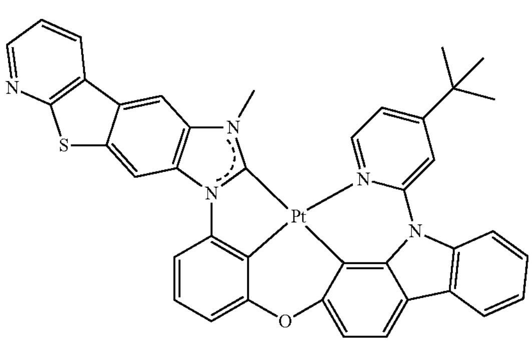
-continued
49
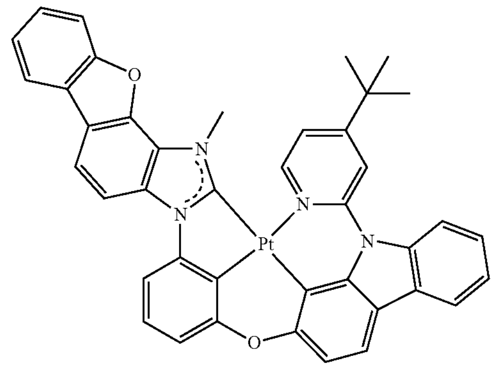
50
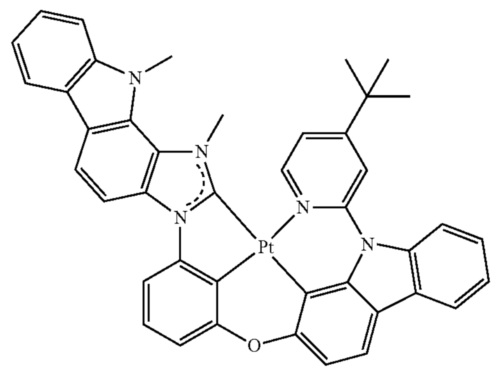
51
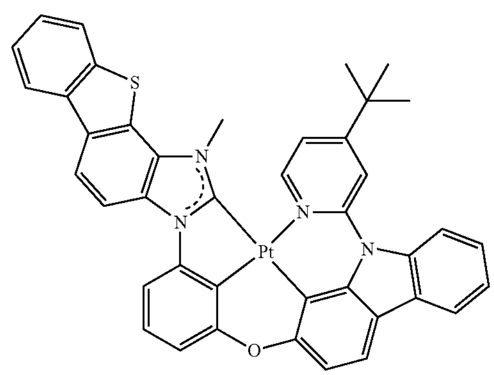
52
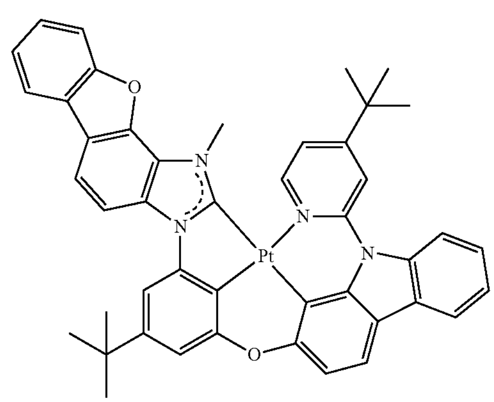

-continued
53
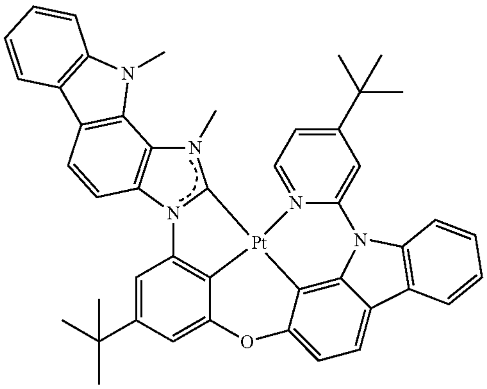
54
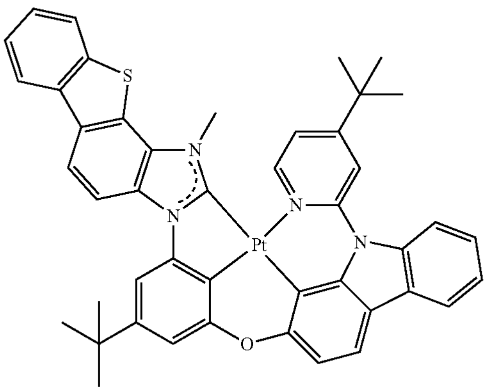
55
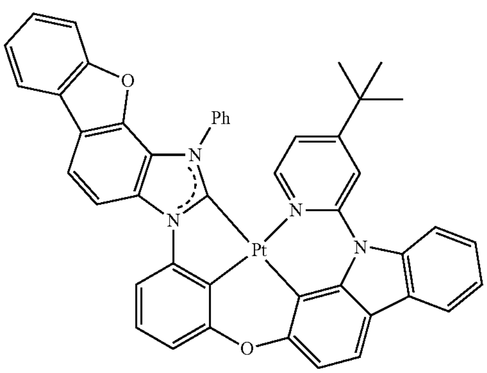
56
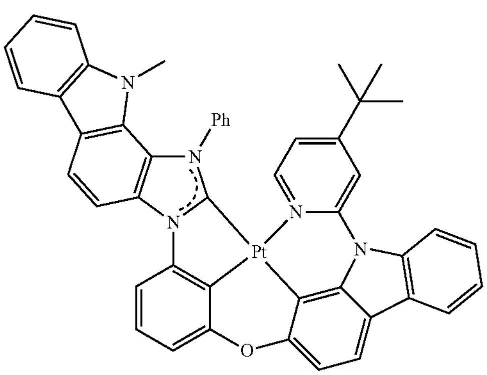
-continued
57
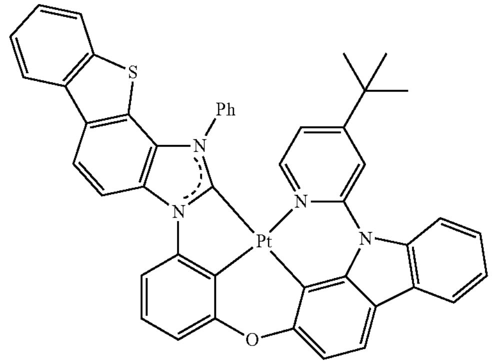
58
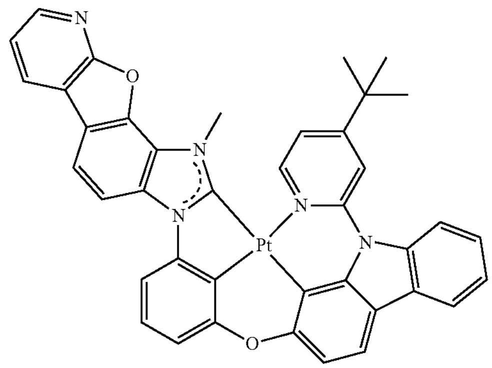
59
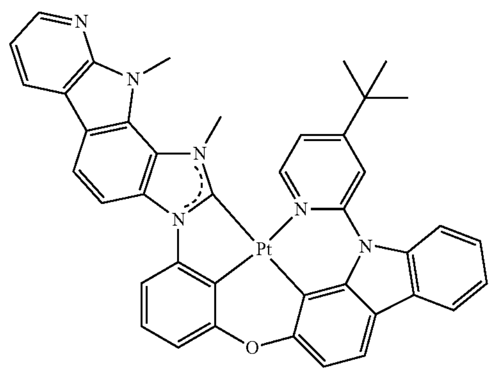
60
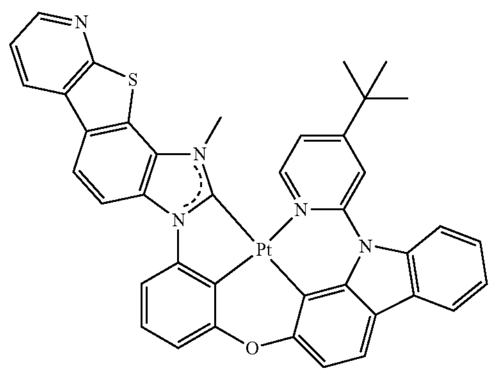

-continued
61
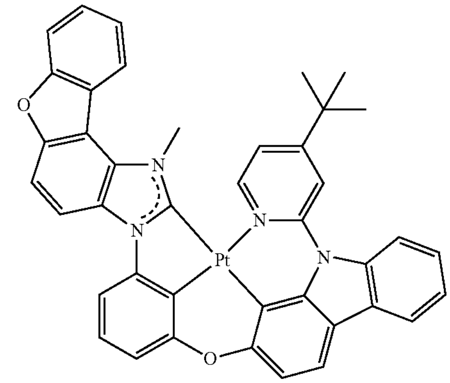
62
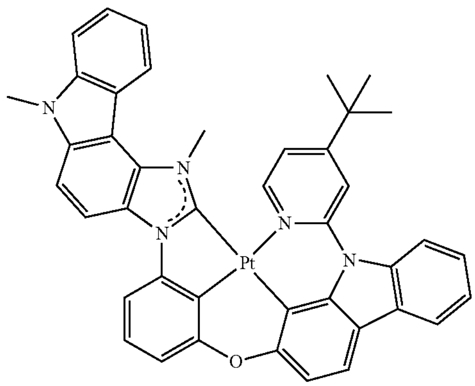
63
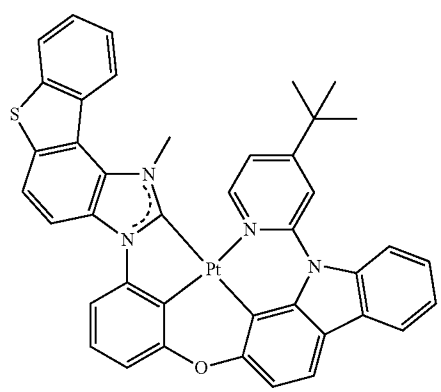
64
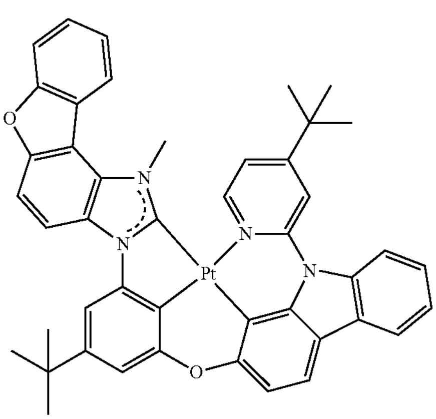
-continued
65
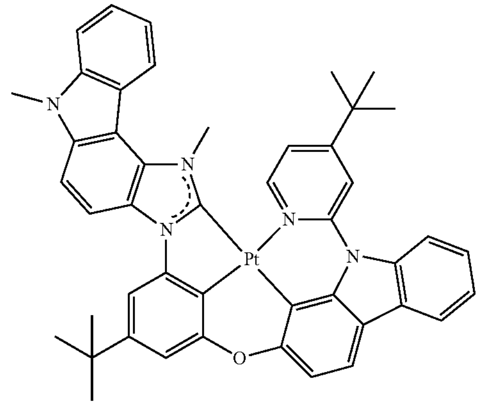
66
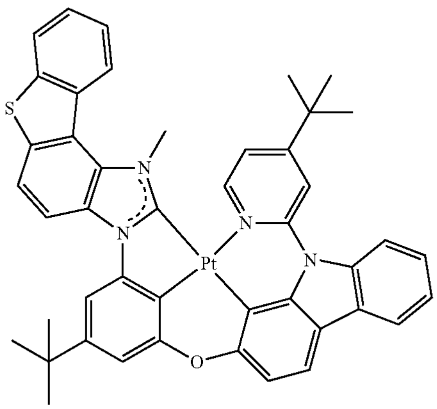
67
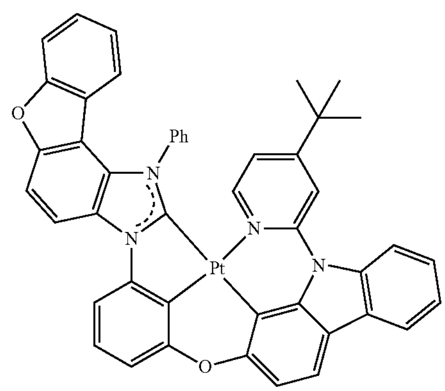
68
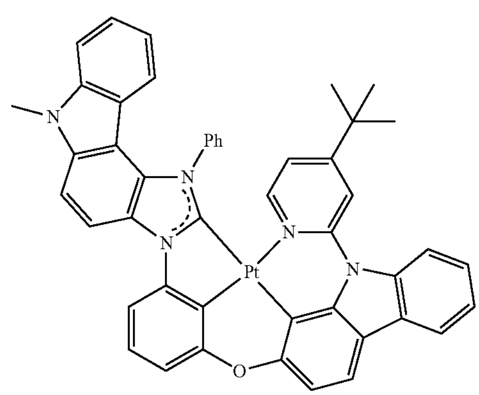

-continued

69

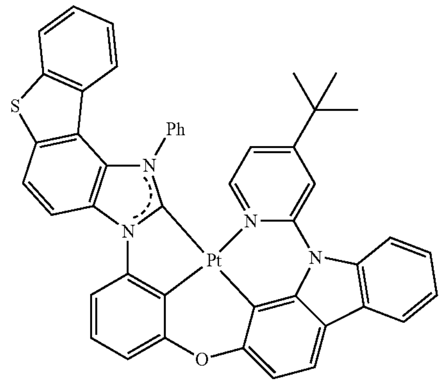

70

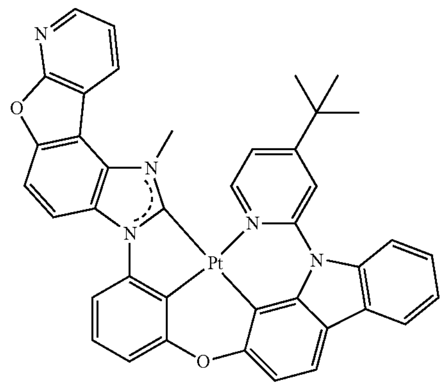

71

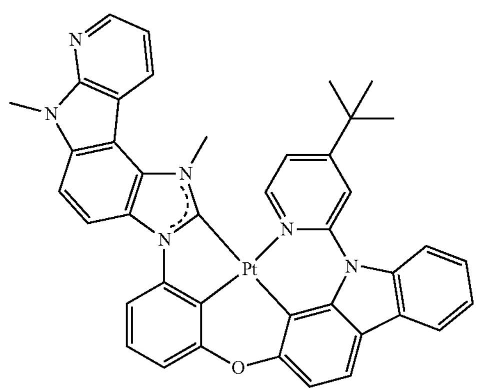

72

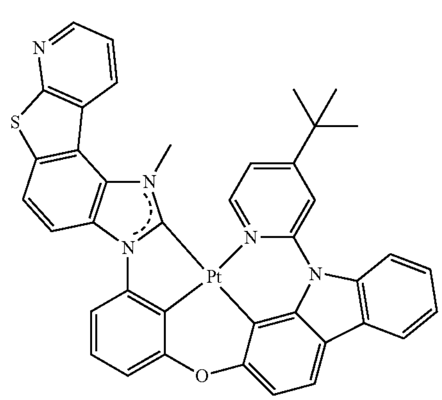

The organometallic compound represented by Formula 1 may satisfy the structure of Formula 1, and due to a structure in which $A_5$, i.e., at least two rings that essentially include a 6-membered ring, is condensed to $A_4$, i.e., a5-membered heterocyclic group, the organometallic compound is suitable for deep blue light emission. Thus, while not wishing to be bound by theory, an electronic device, e.g., an organic light-emitting device, including the organometallic compound represented by Formula 1 may have excellent luminescent efficiency, excellent color-coordinate, and a low driving voltage.

For example, the highest occupied molecular orbital (HOMO), lowest unoccupied molecular orbital (LUMO), singlet ($S_1$), and triplet ($T_1$) energy levels of the organometallic Compounds 1 to 12, 49, A, and were evaluated by using a Gaussian program according to a density functional theory (DFT) method (the molecular structure optimization was performed at a degree of B3LYP, and 6-31 G(d,p)). The results thereof are shown in Table 1, where the values are reported as electron volts (eV).

TABLE 1

| Compound No. | HOMO (eV) | LUMO (eV) | $T_1$ (eV) | $S_1$ (eV) |
|---|---|---|---|---|
| Compound 1 | −4.72 | −1.37 | 2.66 | 2.81 |
| Compound 2 | −4.59 | −1.24 | 2.67 | 2.80 |
| Compound 3 | −4.71 | −1.42 | 2.64 | 2.77 |
| Compound 4 | −4.69 | −1.37 | 2.65 | 2.79 |
| Compound 5 | −4.57 | −1.23 | 2.65 | 2.79 |
| Compound 6 | −4.69 | −1.42 | 2.62 | 2.75 |
| Compound 7 | −4.69 | −1.34 | 2.65 | 2.83 |
| Compound 8 | −4.58 | −1.16 | 2.66 | 2.86 |
| Compound 9 | −4.69 | −1.40 | 2.62 | 2.76 |
| Compound 10 | −4.80 | −1.59 | 2.64 | 2.74 |
| Compound 11 | −4.68 | −1.37 | 2.66 | 2.79 |
| Compound 12 | −4.80 | −1.61 | 2.62 | 2.70 |
| Compound 49 | −4.69 | −1.31 | 2.66 | 2.83 |
| Compound A | −4.75 | −1.43 | 2.60 | 2.76 |
| Compound B | −4.84 | −1.42 | 2.60 | 2.84 |

1

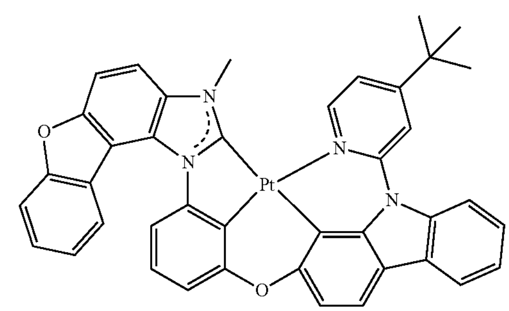

2

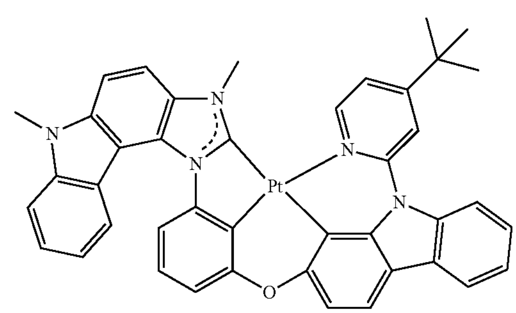

3
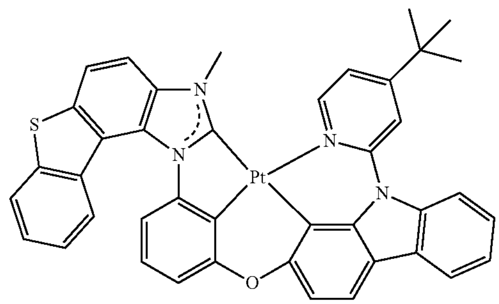
4
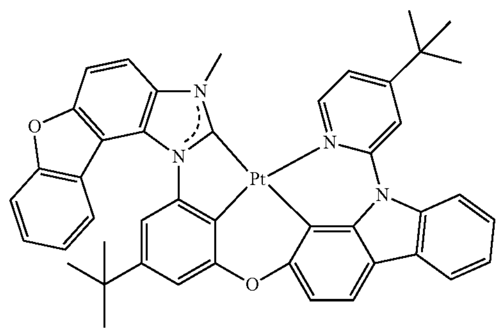
5
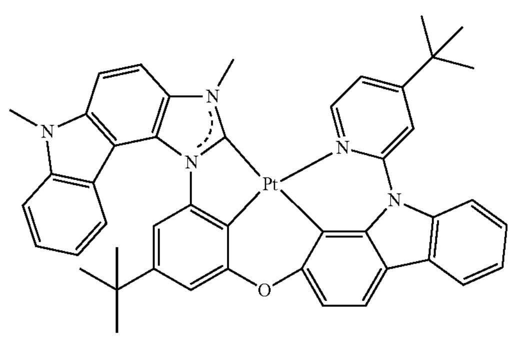
6
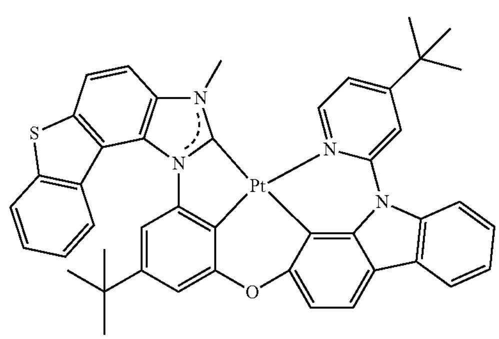
7
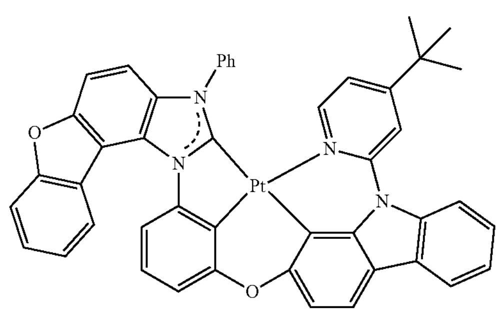
8
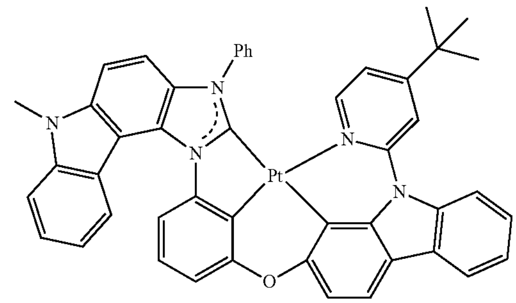
9
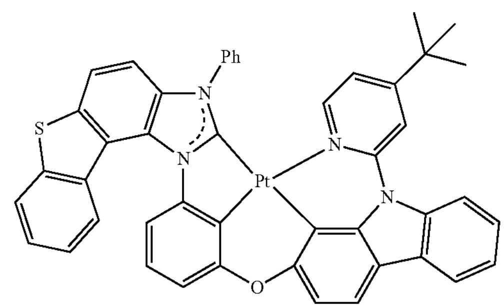
10
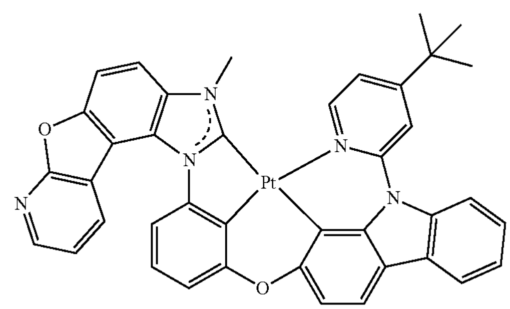
11
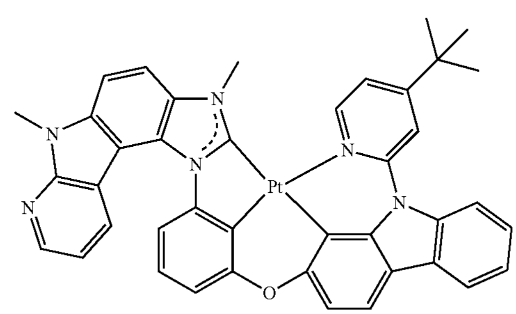
12
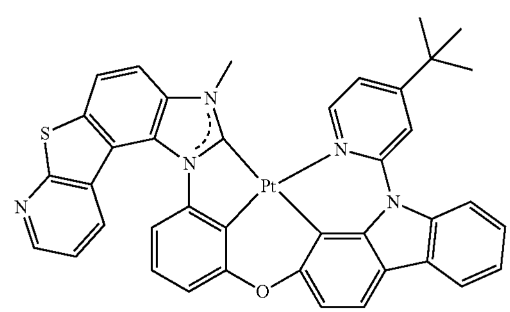

-continued

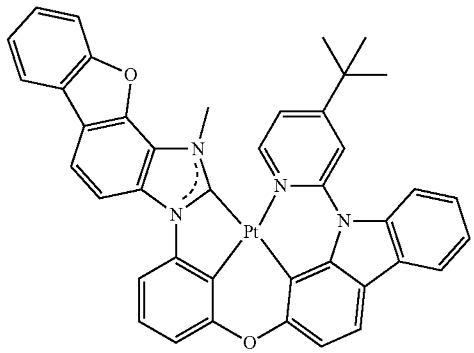

49

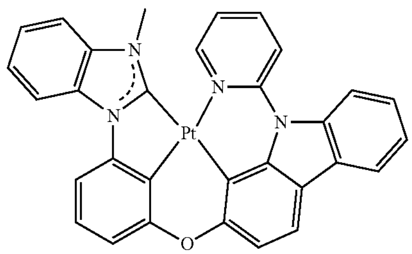

A

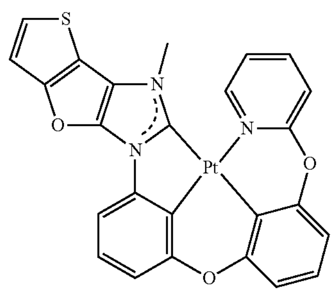

B

Referring to the results of Table 1, due to the high $T_1$ energy level, the organometallic compound represented by Formula 1 was found to have suitable electrical characteristics for use as an emission layer material in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, for example, as an emission layer material. Thus, according to another aspect, there is provided an organic light-emitting device that may include a first electrode; a second electrode; and an organic layer disposed between the first electrode and the second electrode, wherein the organic layer includes: an emission layer, and at least one of the organometallic compounds represented by Formula 1.

Since the organic light-emitting device has an organic layer including the organometallic compound represented by Formula 1, the organic light-emitting device may have a low driving voltage, high efficiency, high power, high quantum efficiency, long lifespan, low roll-off, and excellent color purity.

For example, in the organic light-emitting device, the first electrode may be an anode, the second electrode may be a cathode, and the organic layer may further include a hole transport region disposed between the first electrode and the emission layer and an electron transport region disposed between the emission layer and the second electrode, wherein the hole transport region may include a hole injection layer, a hole transport layer, an electron blocking layer, or a combination thereof, and the electron transport region may include a hole blocking layer, an electron transport layer, an electron injection layer, or a combination thereof.

In some embodiments, the organometallic compound represented by Formula 1 may be included in the emission layer.

In the emission layer, the organometallic compound may serve as an emitter. In some embodiments, an emission layer including the organometallic compound represented by Formula 1 may emit phosphorescence produced upon transition of triplet excitons to a ground state of the organometallic compound.

In some embodiments, an emission layer including the organometallic compound represented by Formula 1 may further include a host. The host may be selected from any suitable hosts, and the host may be understood by referring to the description of the host provided herein. In some embodiments, a content of a host in the emission layer may be greater than a content of the organometallic compound represented by Formula 1.

In one or more embodiments, the emission layer may include a host and a dopant, the host may be any suitable hosts, and the dopant may include the organometallic compound represented by Formula 1. The emission layer may emit phosphorescence produced upon transition of triplet excitons to a ground state of the organometallic compound that serve as a dopant.

In some embodiments, the emission layer may emit blue light having a maximum emission wavelength in a range of about 430 nanometers (nm) to about 480 nm.

As used herein, a layer (such as an organic layer) including the organometallic compound of Formula 1 refers to a layer that includes at least one of the organometallic compounds of Formula 1. For example, a layer may include two or more different organometallic compounds of Formula 1.

For example, in an exemplary embodiment, Compound 1 in Table 1 may only be included in the organic layer as an organometallic compound. In this embodiment, Compound 1 may be included in the emission layer of the organic light-emitting device.

In some embodiments, Compounds 1 and 2 may be included in the organic layer as organometallic compounds. In this embodiment, Compounds 1 and 2 may both be included in the same layer. For example, both Compounds 1 and 2 may be included in an emission layer.

The term “organic layer” as used herein refers to a single layer or a plurality of layers that are disposed between the first electrode and the second electrode in an organic light-emitting device. The “organic layer” may include organic compounds and organometallic complexes including metals.

The FIGURE illustrates a schematic cross-sectional view of an exemplary organic light-emitting device 10 according to one or more embodiments. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which in some embodiments may be sequentially layered in this stated order.

A substrate may be additionally disposed under the first electrode 11 (i.e., the first electrode is disposed on a substrate) or a substrate may be disposed on the second electrode 19. The substrate may be any substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by depositing or sputtering, onto the substrate, a material for forming the first electrode 11. The first electrode 11 may be an anode. The material for forming the first electrode 11 may be selected from materials with a high work function for easy hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO, but in other embodiments the structure of the first electrode 11 are not limited thereto.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum-deposition, for example, the vacuum deposition may be performed at a temperature in a range of about 100° C. to about 500° C., at a vacuum degree in a range of about 10-8 torr to about 10-3 torr, and at a rate in a range of about 0.01 Angstroms per second (A/sec) to about 100 Å/sec, though the conditions may vary depending on a compound used as a hole injection material and a structure and thermal properties of a desired hole injection layer, but embodiments are not limited thereto.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer, but embodiments are not limited thereto.

The conditions for forming a hole transport layer and an electron blocking layer may be inferred from the conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor-sulfonic acid (PANI/CSA), polyaniline)/poly(4-styrene sulfonate (PANI/PSS), a compound represented by Formula 201, and a compound represented by Formula 202:

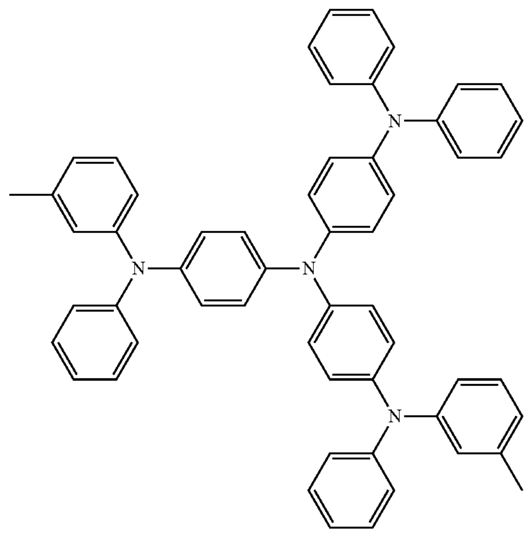

m-MTDATA

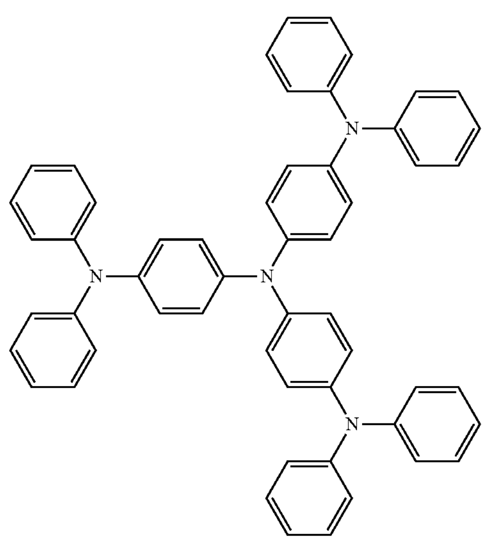

TDATA

-continued
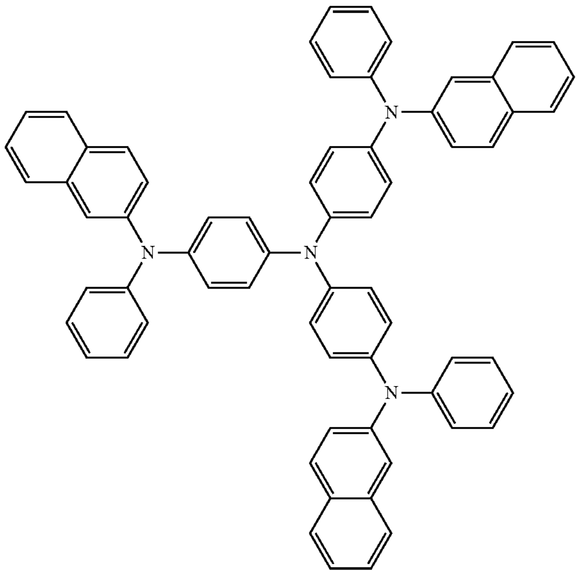
2-TNATA
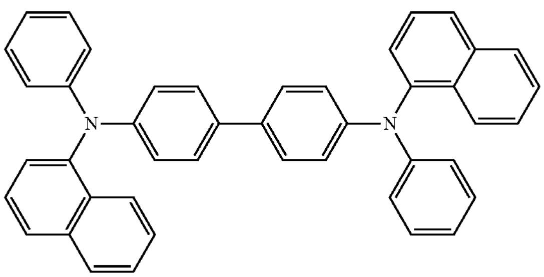
NPB
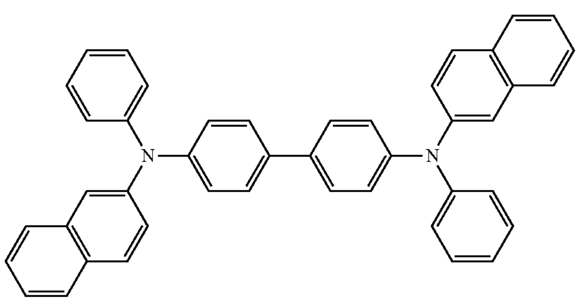
β-NPB
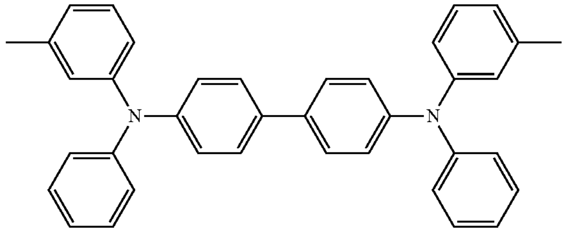
TPD
-continued
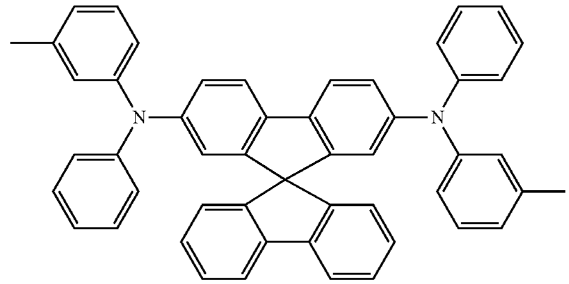
Spiro-TPD
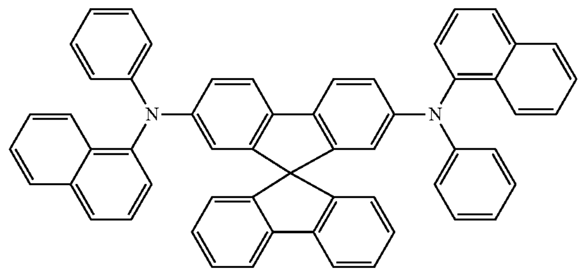
Spiro-NPB
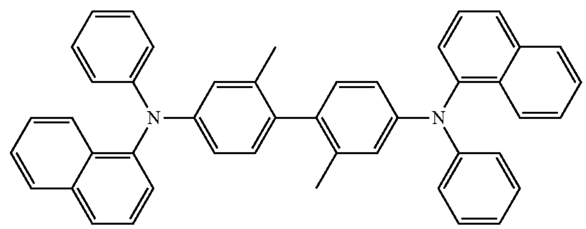
methylated NPB
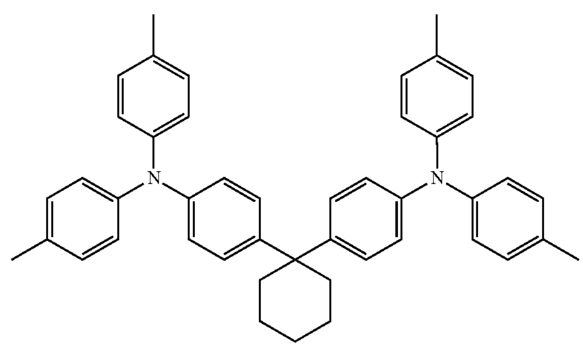
TAPC
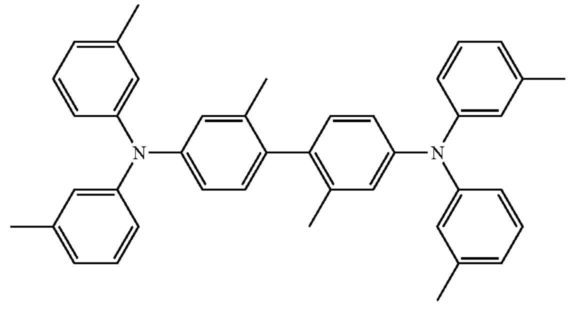
HMTPD -continued Formula 201

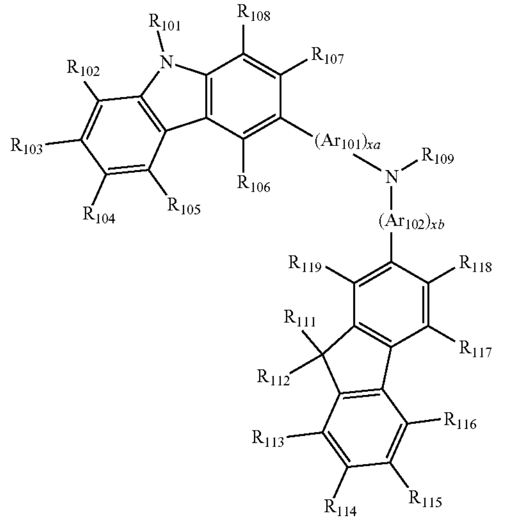

Formula 202

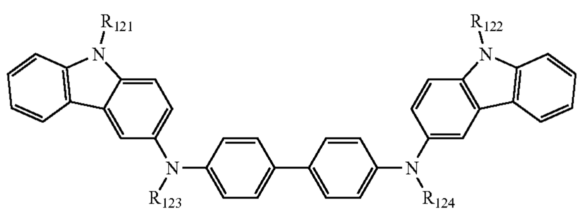

Formula 201A

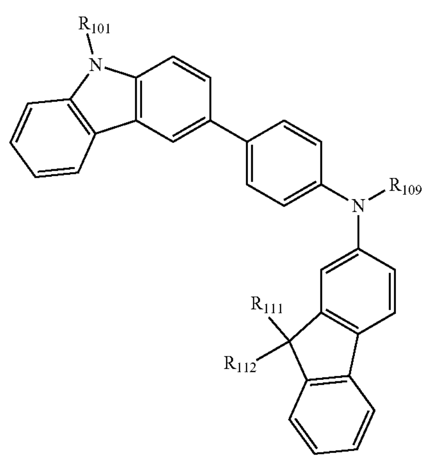

wherein, in Formula 201, $Ar_{101}$ and $Ar_{102}$ may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one of deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group.

In Formula 201, xa and xb may each independently be an integer from 0 to 5. In some embodiments, xa and xb may each independently be 0, 1, or 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each substituted with at least one of deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with at least one of deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments are not limited thereto.

In Formula 201, $R_{109}$ may be:

a phenyl group, a naphthyl group, an anthracenyl group, or a pyridinyl group; or a phenyl group, a naphthyl group, an anthracenyl group, or a pyridinyl group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

In some embodiments, the compound represented by Formula 201 may be represented by Formula 201A, but embodiments are not limited thereto:

Formula 201A

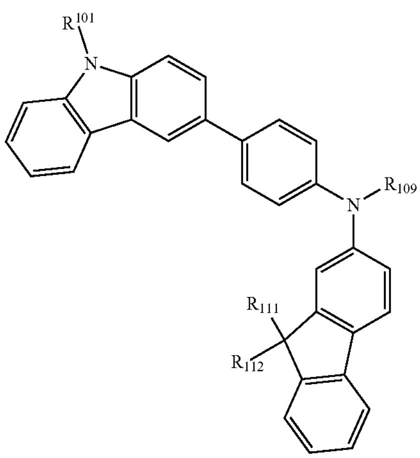

wherein, in Formula 201A, $R_{101}$, $R_{111}$, $R_{112}$, and $R_{109}$ may respectively be understood by referring to the descriptions of $R_{11}$, $R_{111}$, $R_{112}$, and $R_{109}$ provided herein.

In some embodiments, the compounds represented by Formulae 201 and 202 may include Compounds HT1 to HT20 but embodiments are not limited thereto:

HT1

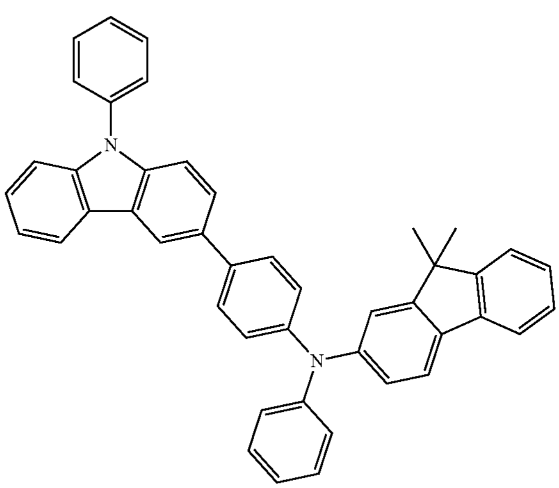

-continued

HT2

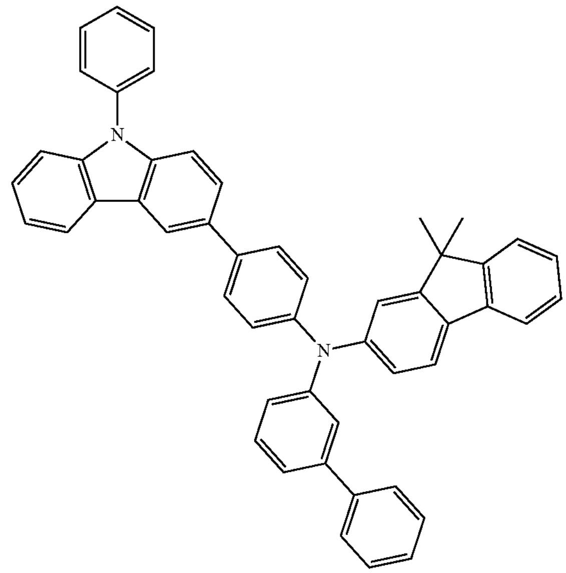

HT3

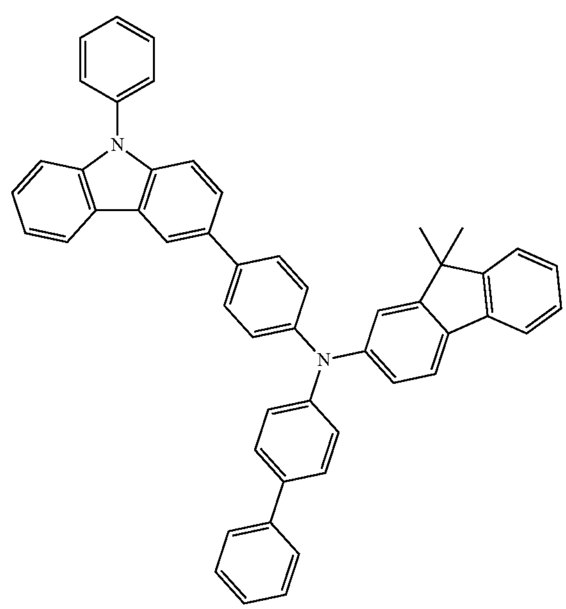

-continued
HT4
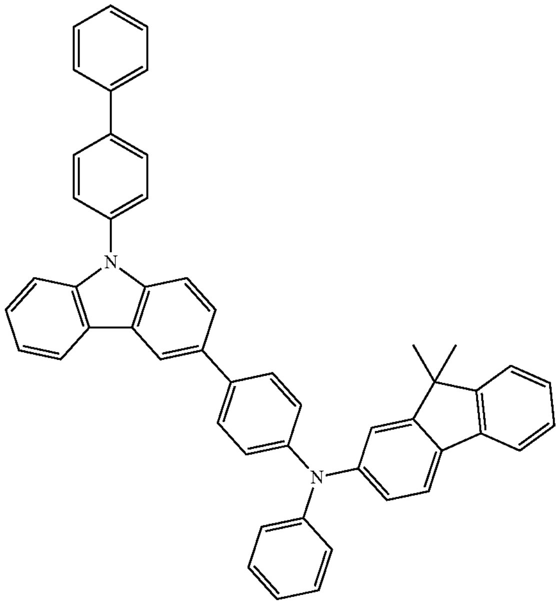
HT5
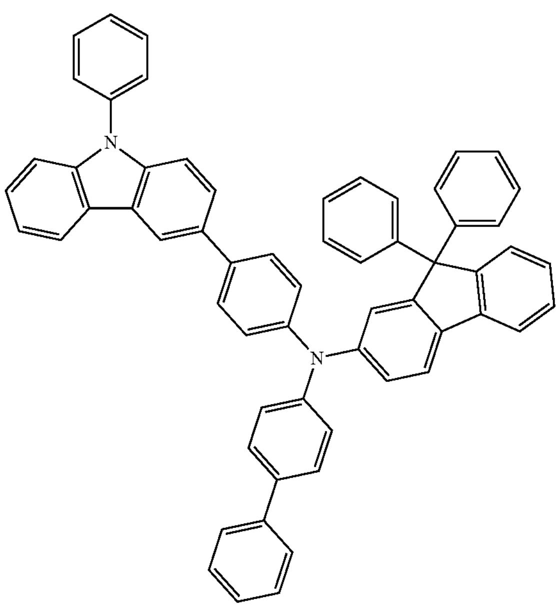
-continued
HT6
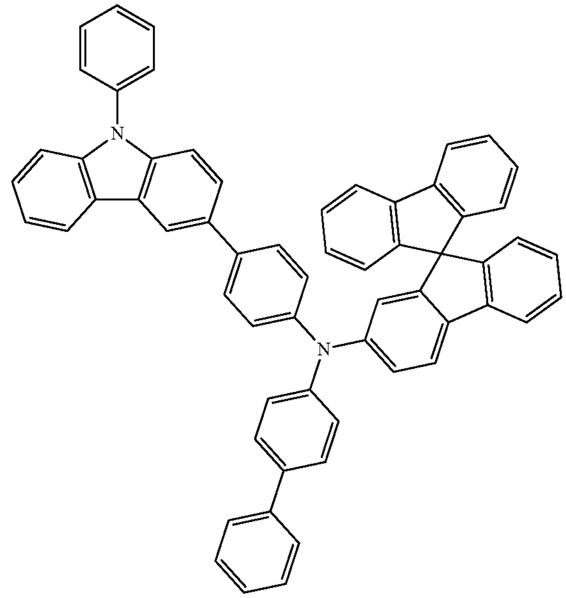
HT7
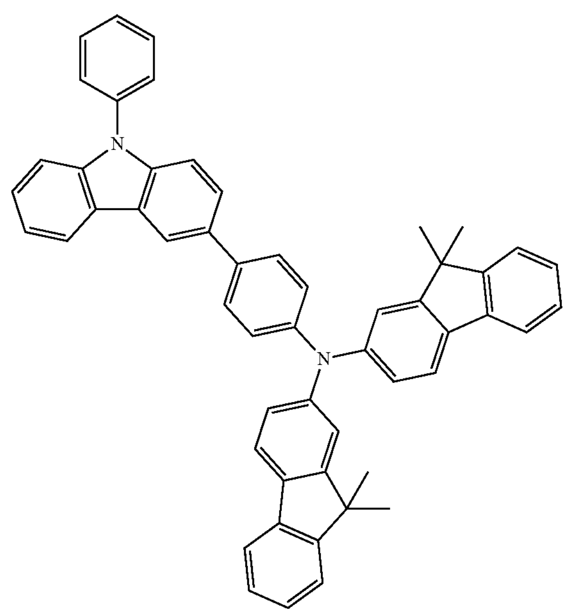

-continued
HT8
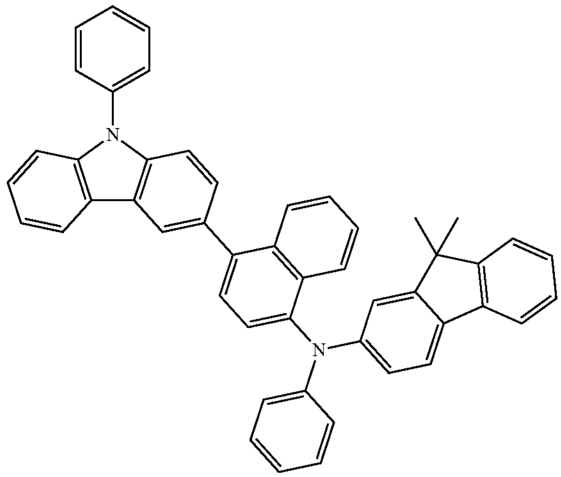
HT9
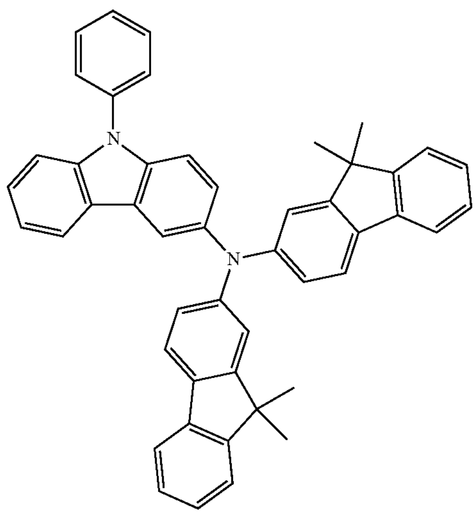
HT10
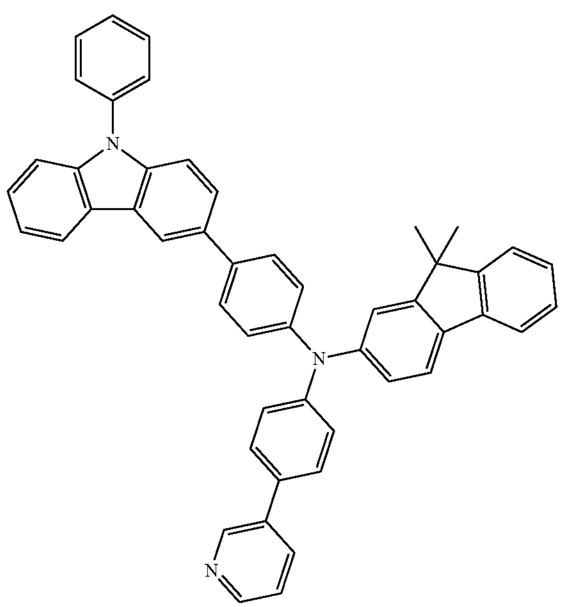
-continued
HT11
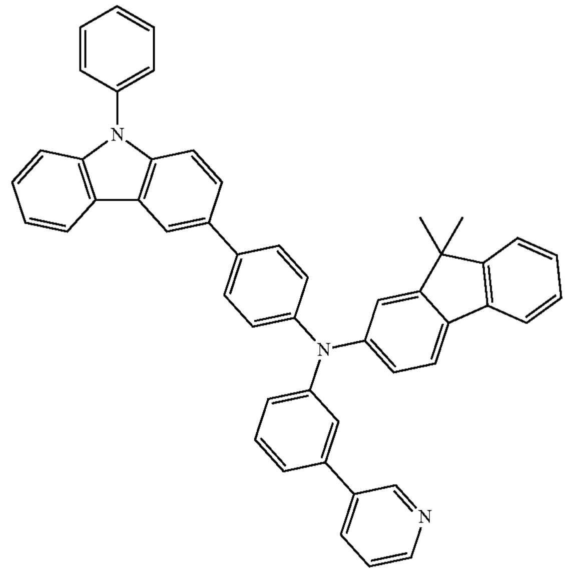
HT12
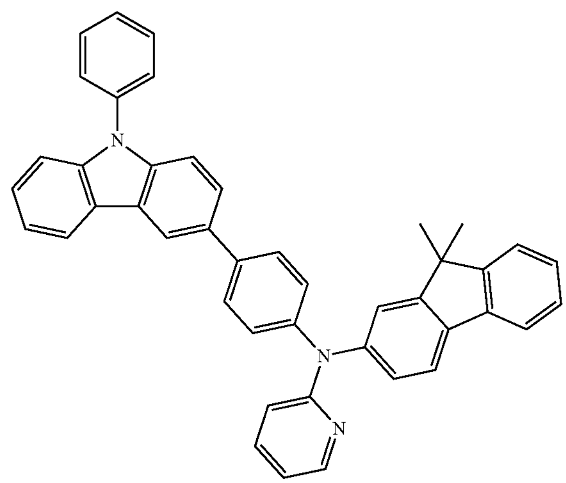
HT13
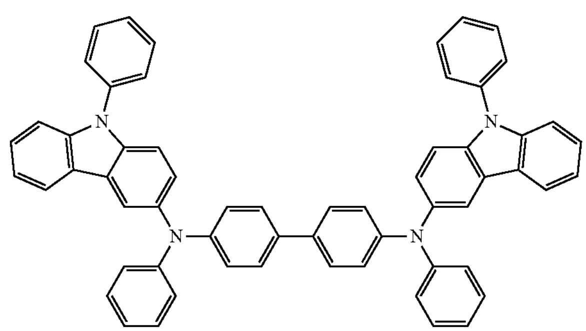

-continued

HT14

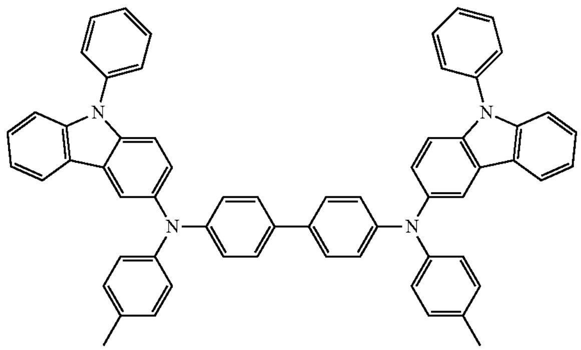

HT15

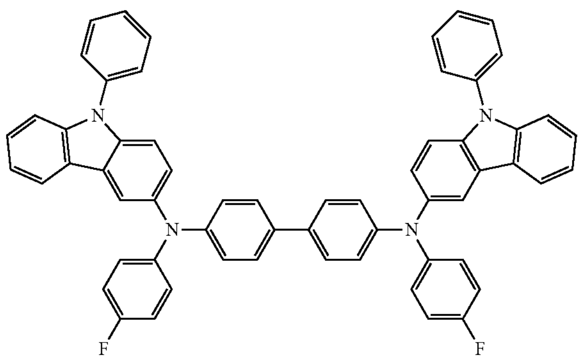

HT16

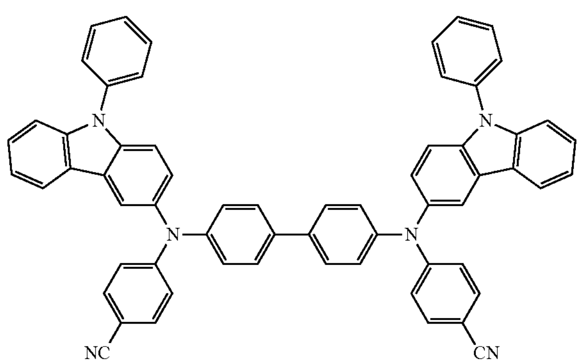

HT17

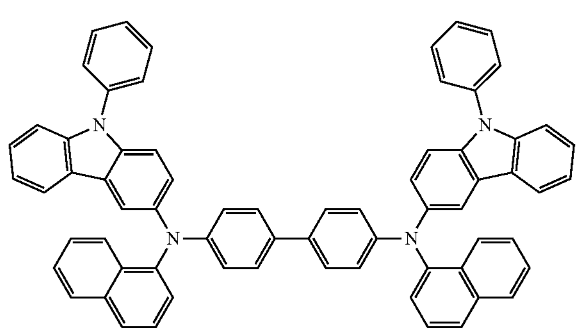

-continued

HT18

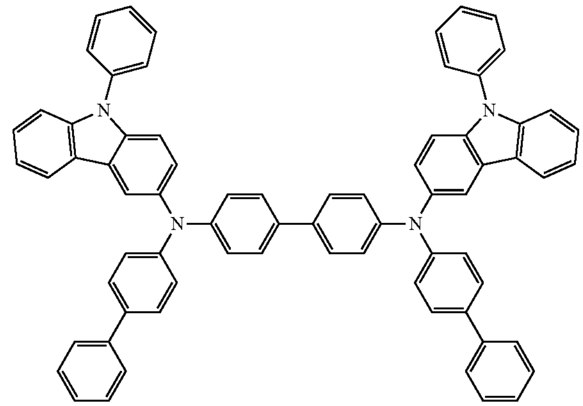

HT19

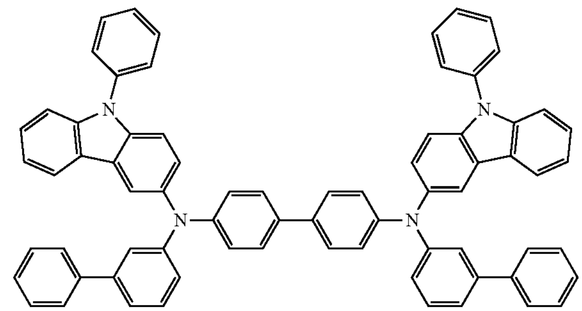

HT20

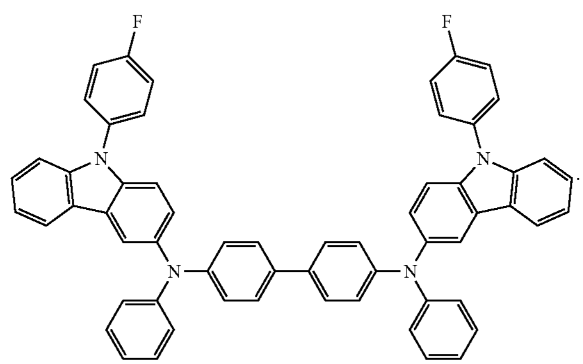

The thickness of the hole transport region may be in a range of about 100 Angstroms (Å) to about 10,000 Å, for example, about 100 Å to about 1,000 Å. When the hole transport region includes at least one selected from a hole injection layer and a hole transport layer, the thickness of the hole injection layer may be in a range of about 100 Å to about 10,000 Å, for example, about 100 Å to about 1,000 Å, the thickness of the hole transport layer may be in a range of about 50 Å to about 2,000 Å, for example, about 100 Å to about 1,500 Å. While not wishing to be bound by theory, it is understood that when the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may include one of a quinone derivative, a metal oxide, and a compound containing a cyano group, but embodiments are not limited thereto. For example, non-limiting examples of the p-dopant include a quinone derivative, such as tetracyanoquinodimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1, but embodiments are not limited thereto:

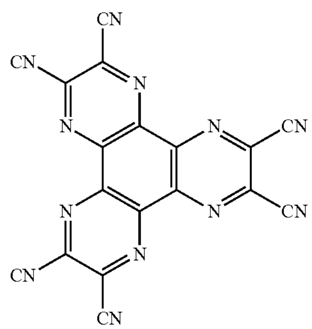

HT-D1

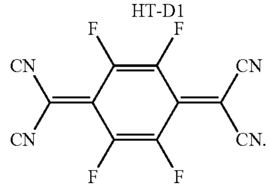

F4-TCNQ

The hole transport region may further include a buffer layer.

The buffer layer may compensate for an optical resonance distance depending on a wavelength of light emitted from the emission layer to improve the efficiency of an organic light-emitting device.

An emission layer may be formed on the hole transport region by using one or more suitable methods, such as vacuum deposition, spin coating, casting, LB deposition, or the like. When the emission layer is formed by vacuum deposition or spin coating, vacuum deposition and coating conditions for forming the emission layer may be generally similar to those conditions for forming a hole injection layer, though the conditions may vary depending on a compound that is used.

When the hole transport region includes an electron blocking layer, a material for forming the electron blocking layer may be selected from the materials for forming a hole transport region and host materials described herein, but embodiments are not limited thereto. In some embodiments, when the hole transport region includes an electron blocking layer, mCP described herein may be used for forming the electron blocking layer.

The emission layer may include a host and a dopant, and the dopant may include the organometallic compound represented by Formula 1.

The host may include at least one selected from TPBi, TBADN, ADN (also known as "DNA"), CBP, CDBP, TCP, mCP, and Compounds H50 and H51:

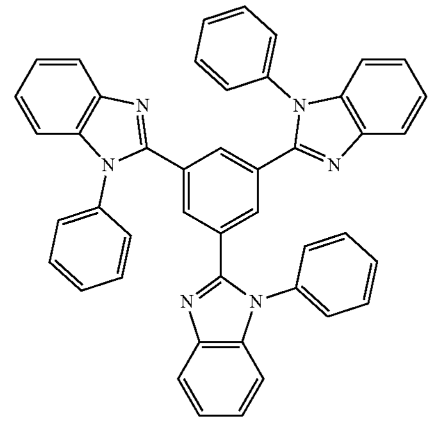

TPBi

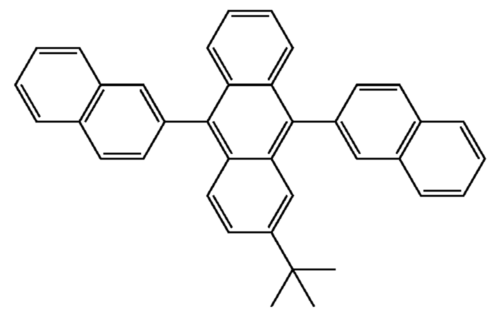

TBADN

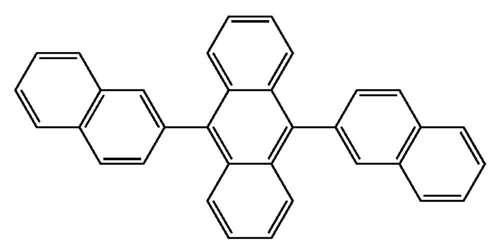

ADN

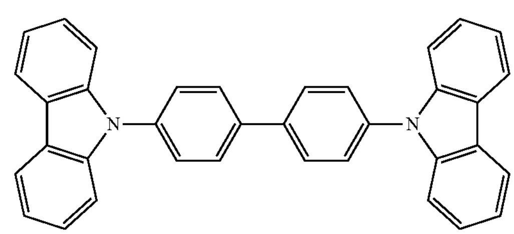

CBP

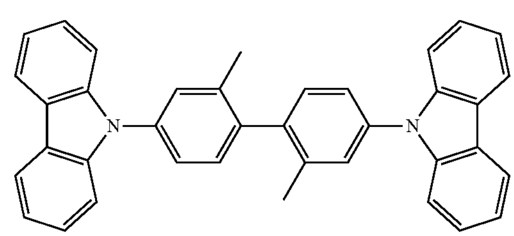

CDBP

-continued

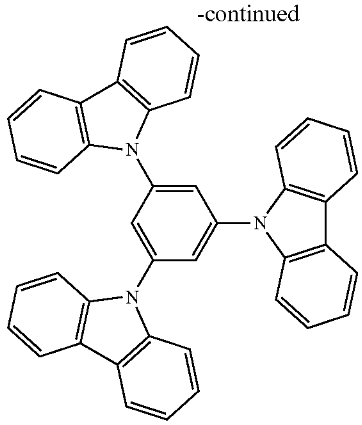

TCP

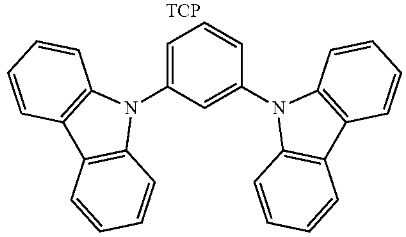

mCP

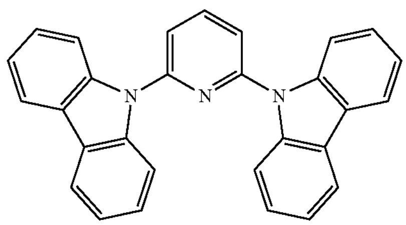

H50

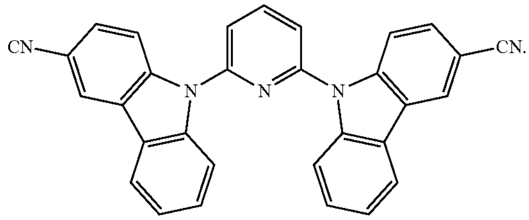

H51

In some embodiments, the host may further include a compound represented by Formula 301:

Formula 301

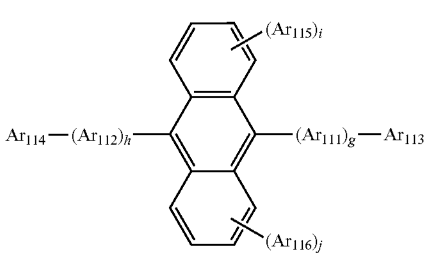

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each substituted with at least one of a phenyl group, a naphthyl group, or an anthracenyl group.

In Formula 301, $Ar_{113}$ to $Ar_{116}$ may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with at least one of a phenyl group, a naphthyl group, or an anthracenyl group.

In Formula 301, g, h, i, and j may each independently be an integer from 0 to 4.

In some embodiments, g, h, i, and j may each independently be 0, 1, or 2.

In Formula 301, $Ar_{113}$ to $Ar_{116}$ may each independently be:

a $C_1$-$C_{10}$ alkyl group substituted with at least one of a phenyl group, a naphthyl group, or an anthracenyl group;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each substituted with at least one of deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, or a fluorenyl group; or a group of the formula

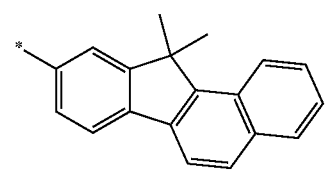

, but embodiments are not limited thereto.

In some embodiments, the host may include a compound represented by Formula 302:

Formula 302

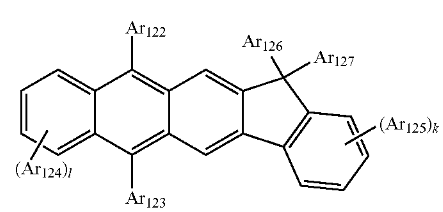

In Formula 302, $Ar_{122}$ to $Ar_{125}$ may each independently be understood by referring to the descriptions for $Ar_{113}$ in Formula 301 provided herein.

In Formula 302, $Ar_{126}$ and $Ar_{127}$ may each independently be a $C_1$-$C_{10}$ alkyl group (e.g., a methyl group, an ethyl group, or a propyl group).

In Formula 302, k and l may each independently be an integer from 0 to 4. In some embodiments, k and l may each be 0, 1, or 2.

When the organic light-emitting device 10 is a full-color organic light-emitting device, the emission layer may be patterned into a red emission layer, a green emission layer, and a blue emission layer. In some embodiments, the emission layer may have a structure in which the red emission layer, the green emission layer, and/or the blue emission layer are layered to emit white light. In some embodiments, the structure of the emission layer may vary.

When the emission layer includes the host and the dopant, an amount of the dopant may be in a range of about 0.01 parts to about 15 parts by weight based on about 100 parts by weight of the host, but embodiments are not limited thereto.

The thickness of the emission layer may be in a range of about 100 Å to about 1,000 Å, and in some embodiments, about 200 Å to about 600 Å. While not wishing to be bound by theory, when the thickness of the emission layer is within any of these ranges, improved luminescence characteristics may be obtained without a substantial increase in driving voltage.

Next, an electron transport region may be formed on the emission layer.

The electron transport region may include a hole blocking layer, an electron transport layer, an electron injection layer, or a combination thereof.

In some embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, at least one selected from BCP, BPhen, and BAlq, but embodiments are not limited thereto:

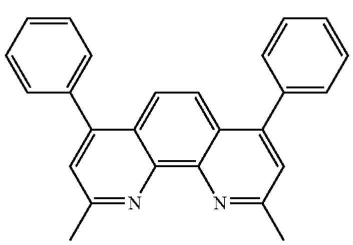

BCP

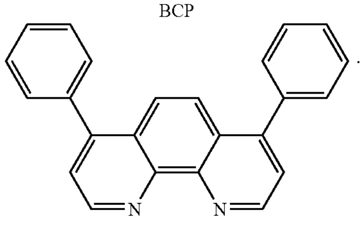

Bphen

The thickness of the hole blocking layer may be in a range of about 20 Å to about 1,000 Å, for example, about 30 Å to about 300 Å. While not wishing to be bound by theory, when the thickness of the hole blocking layer is within any of these ranges, excellent hole blocking characteristics may be obtained without a substantial increase in driving voltage.

The electron transport layer may include at least one selected from BCP, BPhen, $Alq_3$, BAlq, TAZ, and NTAZ:

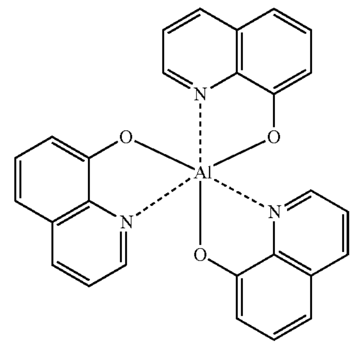

$Alq_3$

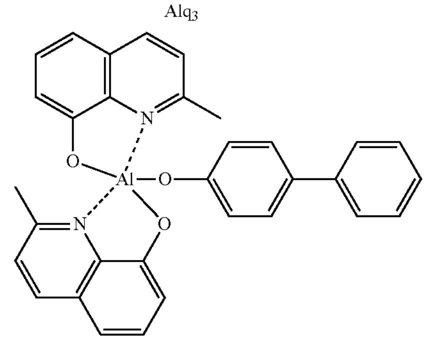

BAlq

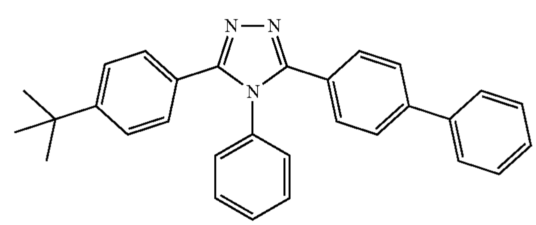

TAZ

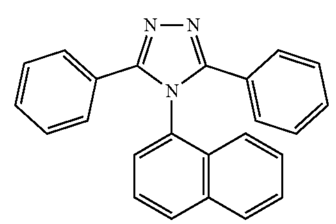

NTAZ

In some embodiments, the electron transport layer may include at least one selected from Compounds ET1 to ET25, but embodiments are not limited thereto:

-continued
ET1
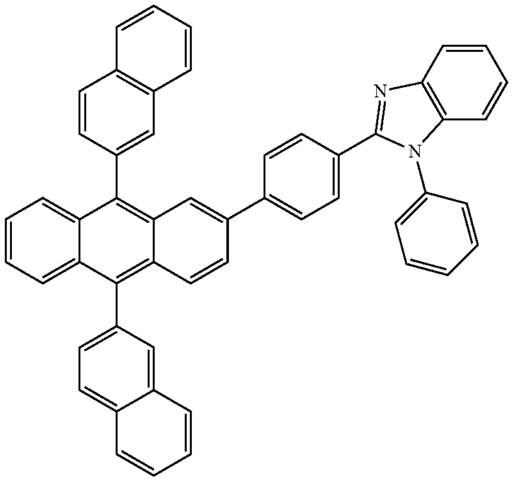
ET2
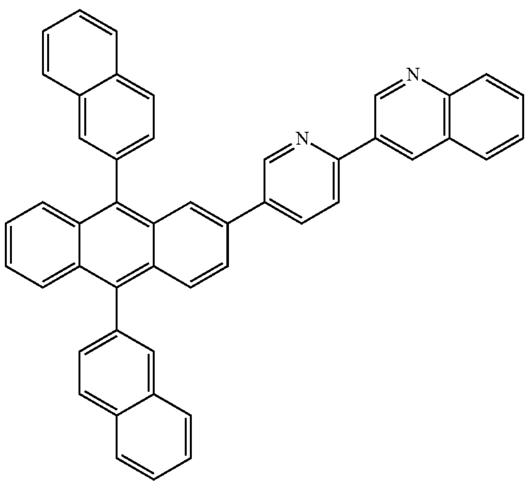
ET3
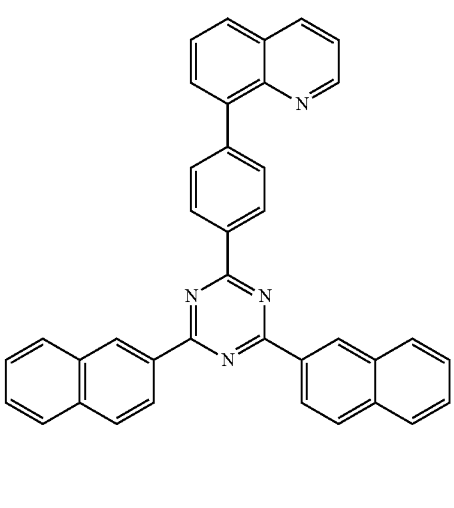
ET4
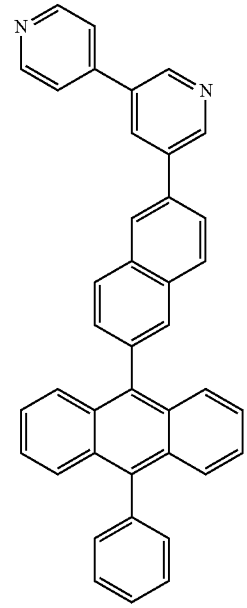
ET5
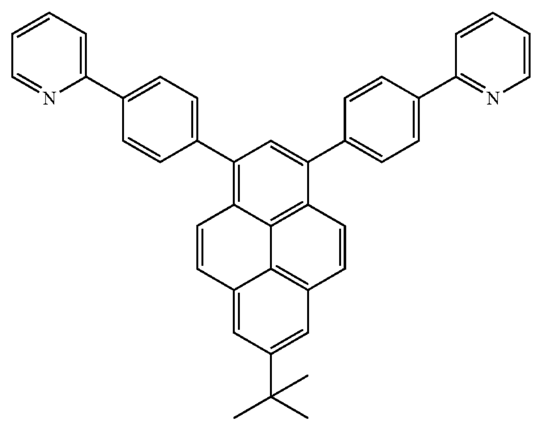
ET6
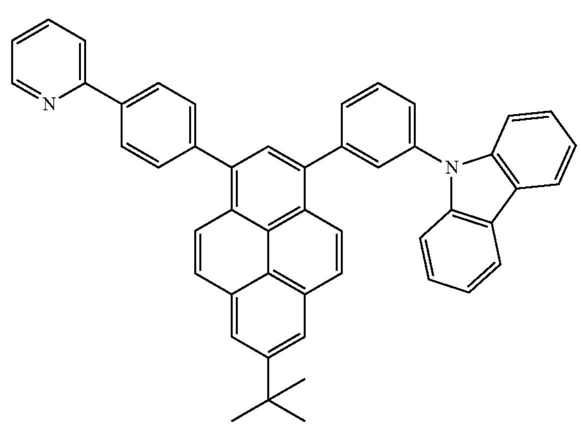

-continued
ET7
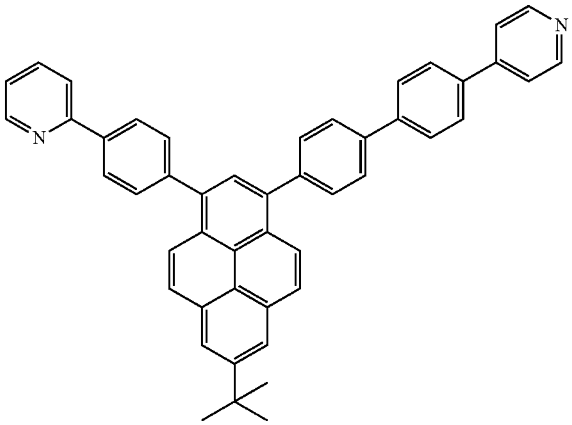
ET8
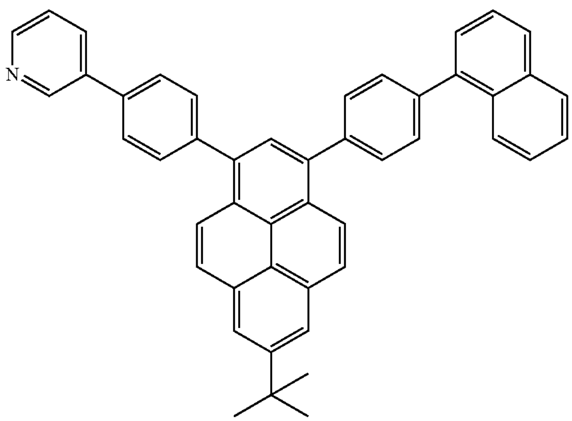
ET9
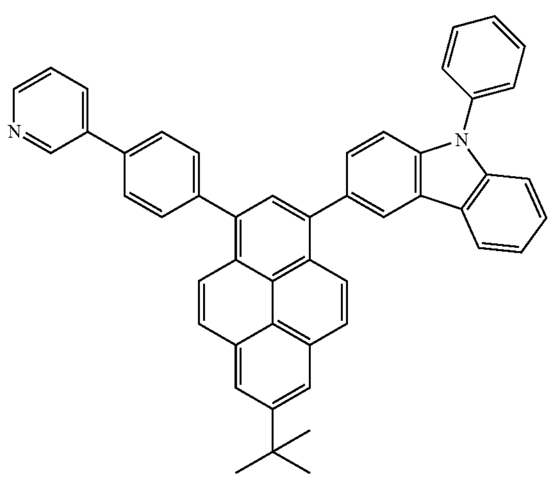
-continued
ET10
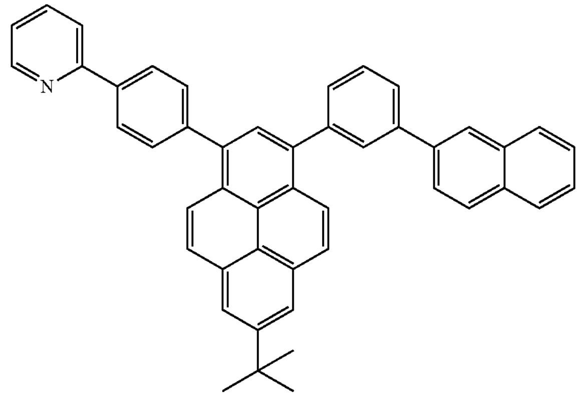
ET11
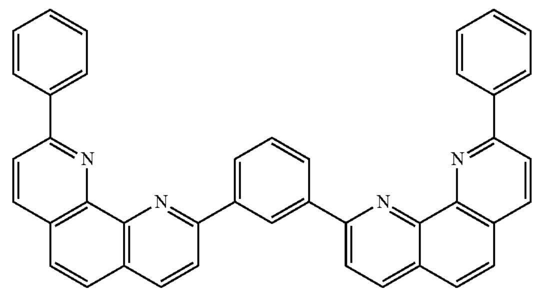
ET12
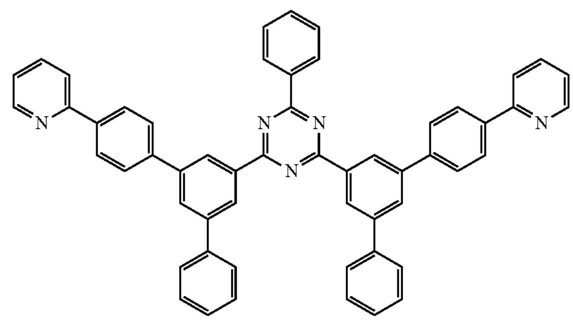
ET13
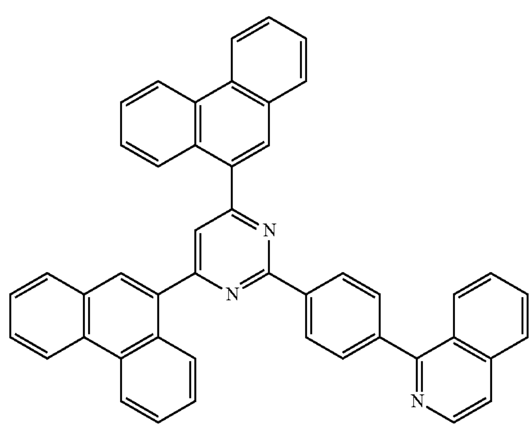

-continued
ET14
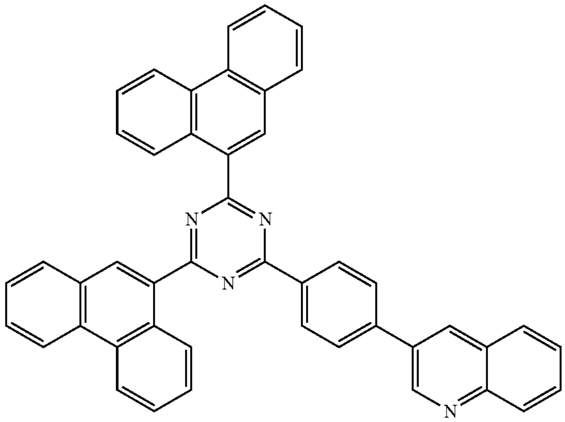
ET15
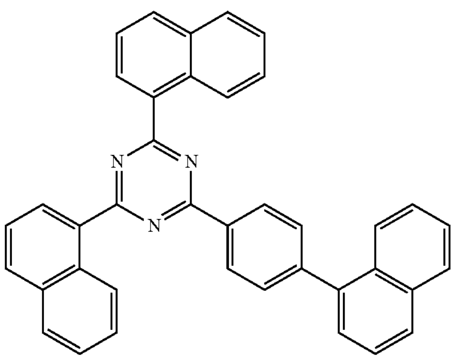
ET16
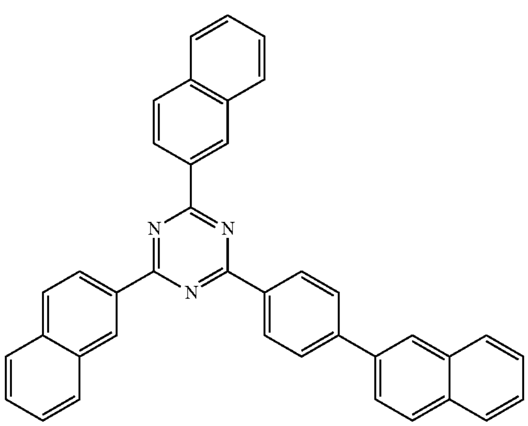
-continued
ET17
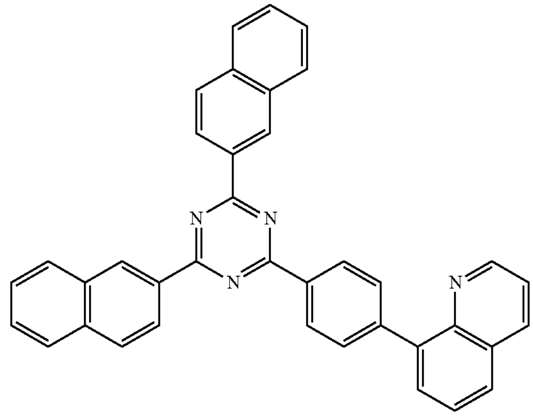
ET18
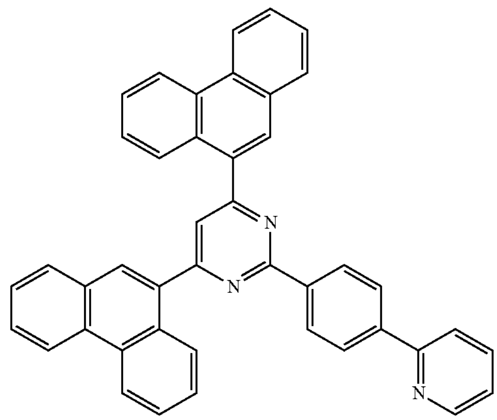
ET19
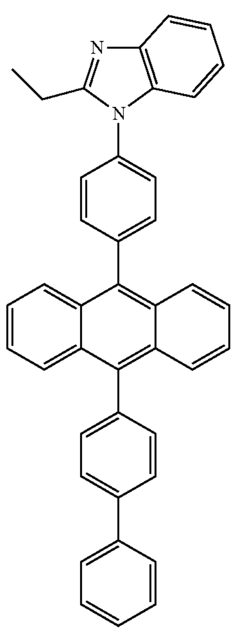

-continued
ET20
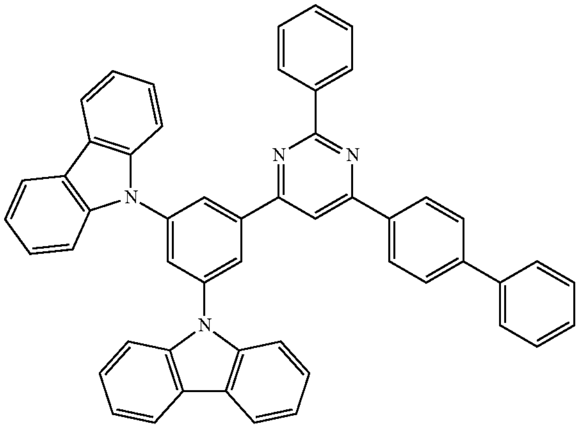
ET21
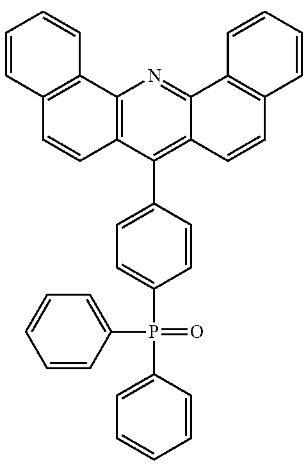
ET22
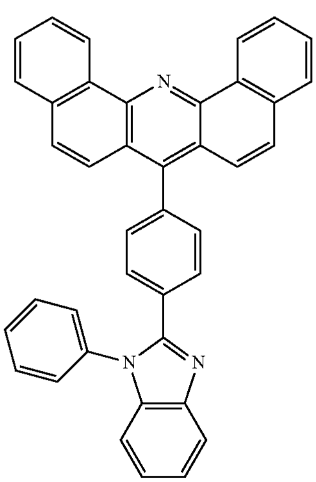
-continued
ET23
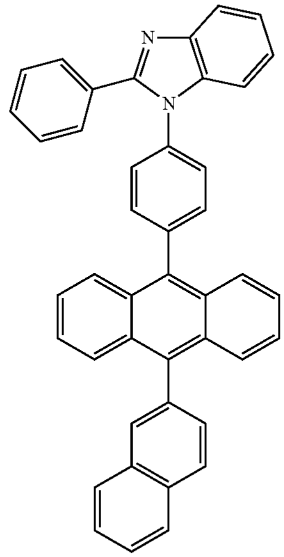
ET24
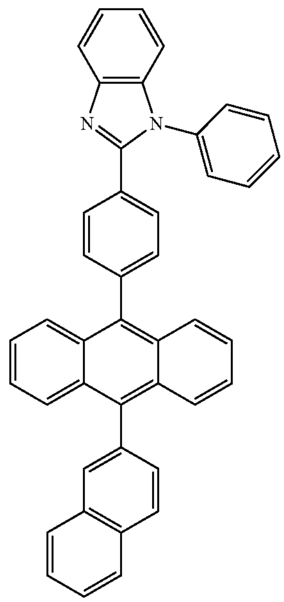
ET25
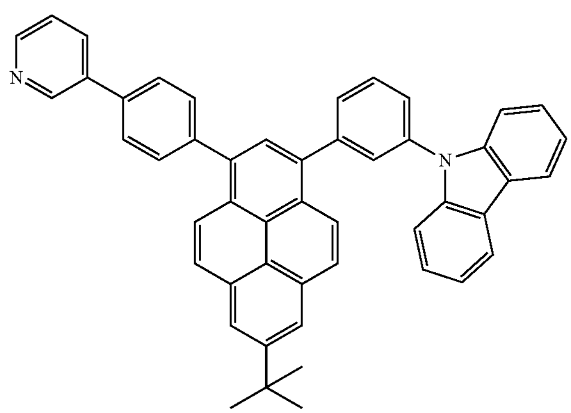
The thickness of the electron transport layer may be in a range of about 100 Å to about 1,000 Å, and in some embodiments, about 150 Å to about 500 Å. While not wishing to be bound by theory, when the thickness of the electron transport layer is within any of these ranges, excellent electron transport characteristics may be obtained without a substantial increase in driving voltage.

The electron transport layer may further include a metal-containing material, in addition to the materials described above.

The metal-containing material may include a Li complex. The Li complex may include, e.g., Compound FT-D1 (LiQ) or Compound FT-D2:

ET-D1

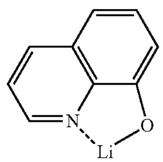

ET-D2

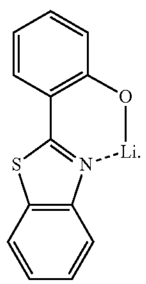

The electron transport region may include an electron injection layer that facilitates electron injection from the second electrode 19.

The electron injection layer may include at least one selected from, LiF, NaCl, CsF, $Li_2$, and BaO.

The thickness of the electron injection layer may be in a range of about 1 Å to about 100 Å, and in some embodiments, about 3 Å to about 90 Å. While not wishing to be bound by theory, when the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, and a mixture thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to the FIGURE, but embodiments are not limited thereto.

According to an aspect of still another embodiment, a diagnostic composition may include at least one organometallic compound represented by Formula 1.

Since the organometallic compound represented by Formula 1 provides high luminescence efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

The term "$C_1$-$C_{60}$ alkyl group" as used herein refers to a linear or branched saturated aliphatic hydrocarbon monovalent group having 1 to 60 carbon atoms.

Examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethenyl group and a propenyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent monocyclic saturated hydrocarbon group including 3 to 10 carbon atoms. Examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group including at least one heteroatom selected from N, O, P, Si, and S as a ring-forming atom and 1 to 10 carbon atoms. Examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom selected from N, O, P, Si, and S as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other. The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having at least one heteroatom selected from N, O, P, Si, and S as a ring-forming atom and 1 to 60 carbon atoms. The term "$C_1$-$C_{60}$ heteroarylene group" as used herein refers to a divalent group having a heterocyclic aromatic system having at least one heteroatom selected from N, O, P, and S as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other. The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is a $C_6$-$C_{60}$ aryl group), the term "$C_6$-$C_{60}$ arylthio group" as used herein indicates —$SA_{103}$ (wherein $A_{103}$ is a $C_6$-$C_{60}$ aryl group), and the term "$C_7$-$C_{60}$ arylalkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_1$ is a $C_1$-$C_{59}$ alkylene group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group.

The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, and S and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group.

The term "$C_1$-$C_{30}$ heterocyclic group" as used herein refers to saturated or unsaturated cyclic group including 1 to 30 carbon atoms and at least one heteroatom selected from N, O, P, Si, and S as ring-forming atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted $C_2$-$C_{60}$ alkylheteroaryl group, the substituted monovalent non-aromatic condensed polycyclic group, or the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(Q_{18})(Q_{19})$, or —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, or a monovalent non-aromatic condensed heteropolycyclic group, each substituted with at least one of deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(Q_{28})(Q_{29})$, or $—P(=O)(Q_{28})(Q_{29})$; or $—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(Q_{38})(Q_{39})$, or $—P(=O)(Q_{38})(Q_{39})$, wherein $Q_1$ t $Q_9$, $Q_{11}$ to $Q_{19}$, $Q_{21}$ to $Q_{29}$, and $Q_{31}$ to $Q_{39}$ may each independently be:

hydrogen; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

In some embodiments, $Q_1$ to $Q_9$, $Q_{11}$ to $Q_{19}$, $Q_{21}$ to $Q_{29}$, and $Q_{31}$ to $Q_{39}$ may each independently be hydrogen, —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group, each except hydrogen, —F, —Cl, —Br, —I, the hydroxyl group, the cyano group, and the nitro group substituted with at least one of deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group substituted with a $C_1$-$C_{60}$ alkyl group; a $C_6$-$C_{60}$ aryl group; or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

In some embodiments, $Q_1$ to $Q_9$, $Q_{11}$ to $Q_{19}$, $Q_{21}$ to $Q_{29}$, and $Q_{31}$ to $Q_{39}$ may each independently be hydrogen; a $C_1$-$C_{60}$ alkyl group; a $C_6$-$C_{60}$ aryl group; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group, each except hydrogen substituted with at least one of deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group substituted with a $C_1$-$C_{60}$ alkyl group, a $C_6$-$C_{60}$ aryl group, or a combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

As used herein, a "coordinate bond" refers to a bond in which the bonding electrons are from one of the bonded atoms (i.e., a dative bond such as the Fe—CO bond in $Fe(CO)_5$).

As used herein, a "covalent bond" refers to a bond in which the bonding electrons are from each of the bonded atoms.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an identical molar equivalent of B was used in place of A.

EXAMPLES

Synthesis Example 1: Synthesis of Compound 1

(1) Synthesis of Intermediate (A)

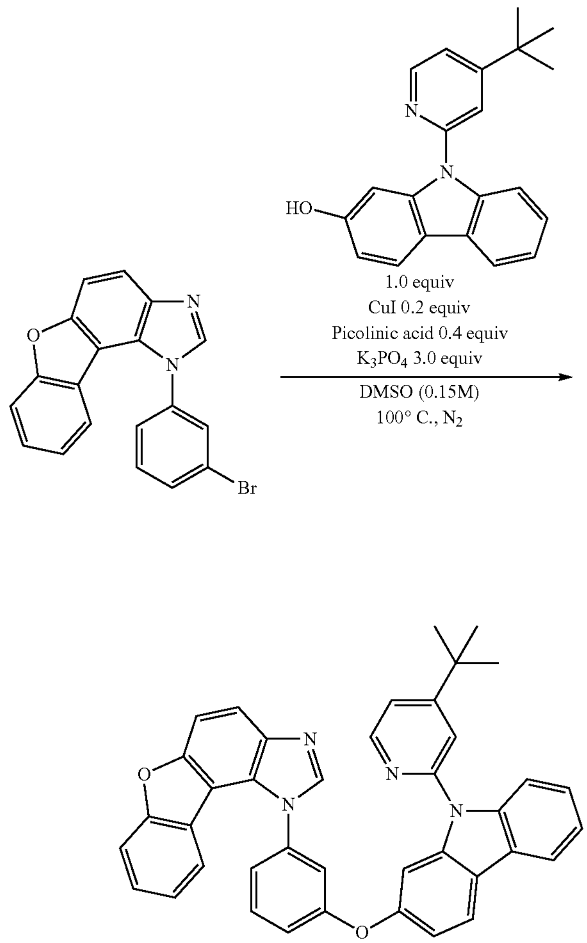

(A)

5.0 grams (g) (13.76 millimoles, mmol) of 1-(3-bromophenyl)-1H-benzo[2,3]benzofuro[4,5-d]imidazole, 4.35 g (13.76 mmol) of 9-(4-(tert-butyl)pyridin-2-yl)-9H-carbazol-2-ol, 0.52 g (2.75 mmol) of copper(I) iodide, 0.68 g (5.5 mmol) of picolinic acid, and 8.76 g (41.28 mmol) of potassium phosphate tribasic were mixed with 90 milliliters (mL) of dimethyl sulfoxide (DMSO), followed by stirring at a temperature of 120° C. for 18 hours. Once the reaction was complete, the mixture was cooled to room temperature, and then, an organic layer was extracted using saturated ammonium chloride ($NH_4Cl$) and ethyl acetate (EA). The organic layer was dried with anhydrous magnesium sulfate ($MgSO_4$) and then filtered, followed by concentration under reduced pressure. The resulting product was purified by silica gel column chromatography to thereby obtain 4.04 g (8.26 mmol) of Intermediate (A) (yield: 60%).

LC-Mass (calculated value (m/z): 598.24 grams per mole (g/mol), measured value: $M^{+1}$=599 g/mol).

(2) Synthesis of Intermediate (B)

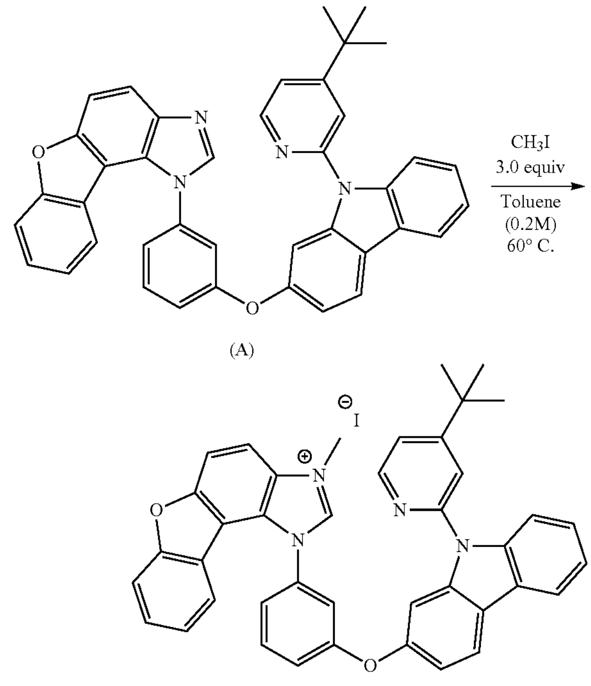

(B)

4.04 g (8.26 mmol) of Intermediate (A) and 3.52 g (24.78 mmol) of methyl iodide were mixed with 40 mL of toluene, followed by stirring at a temperature of 60° C. for 12 hours. Once the reaction was complete, the mixture was cooled to room temperature, and the resulting product was purified by silica gel column chromatography to thereby obtain 4.89 g (6.61 mmol) of Intermediate (B) (yield: 80%).

3) Synthesis of Compound 1

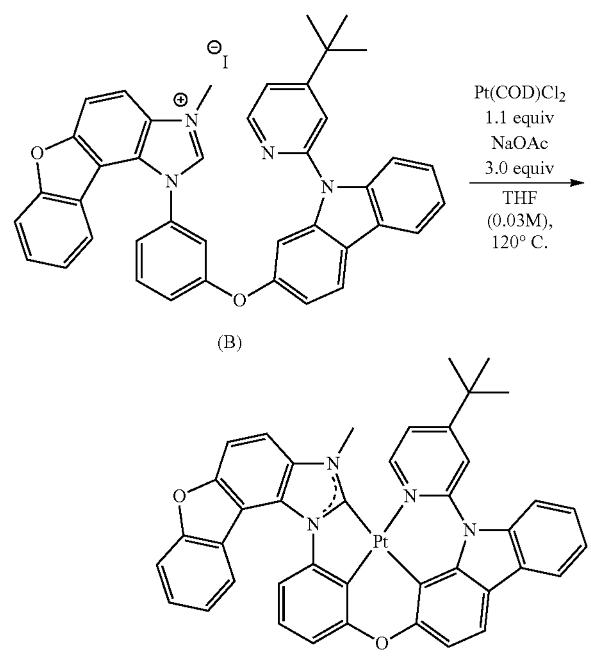

1

4.89 g (6.61 mmol) of Intermediate (B), 2.72 g (7.27 mmol) of $Pt(COD)Cl_2$, and 1.63 g (19.83 mmol) of sodium acetate were mixed with 220 mL of tetrahydrofuran (THF), followed by stirring at a temperature of 120° C. for 48 hours. Once the reaction was complete, the mixture was cooled to room temperature, and then, an organic layer was extracted using saturated ammonium chloride ($NH_4Cl$) and dichloromethane (DCM). The organic layer was dried with anhydrous magnesium sulfate ($MgSO_4$) and filtered, followed by concentration under reduced pressure. The resulting product was purified by silica gel column chromatography to thereby obtain 1.87 g (2.31 mmol) of Compound 1 (yield: 35%).

LC-Mass (calculated value (m/z): 805.20 g/mol, measured value: $M^1$=806 g/mol).

Synthesis Example 2: Synthesis of Compound 49

(1) Synthesis of Intermediate (C)

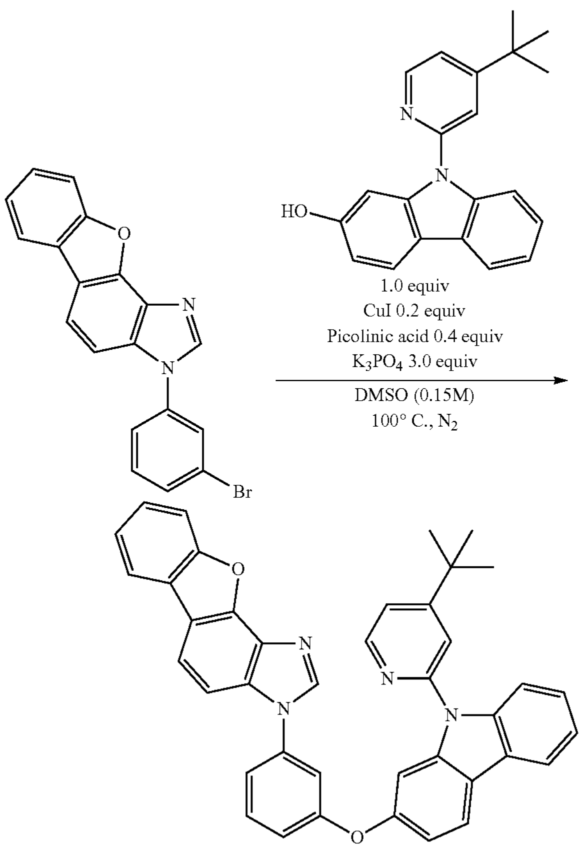

(C)

5.0 g (13.76 mmol) of 3-(3-bromophenyl)-3H-benzo[2,3]benzofuro[6,7-d]imidazole, 4.35 g (13.76 mmol) of 9-(4-(tert-butyl)pyridin-2-yl)-9H-carbazol-2-ol, 0.52 g (2.75 mmol) of copper(I) iodide, 0.68 g (5.5 mmol) of picolinic acid, and 8.76 g (41.28 mmol) of potassium phosphate tribasic were mixed with 90 mL of DMSO, followed by stirring at a temperature of 120° C. for 18 hours. Once the reaction was complete, the mixture was cooled to room temperature, and then, an organic layer was extracted using saturated ammonium chloride ($NH_4Cl$) and ethyl acetate (EA). The organic layer was dried with anhydrous magnesium sulfate ($MgSO_4$) and filtered, followed by concentration under reduced pressure. The resulting product was purified by silica gel column chromatography to thereby obtain 4.38 g (8.94 mmol) of Intermediate (C) (yield: 65%).

LC-Mass (calculated value (m/z): 598.24 g/mol, measured value: $M^1$=599 g/mol).

(2) Synthesis of Intermediate (D)

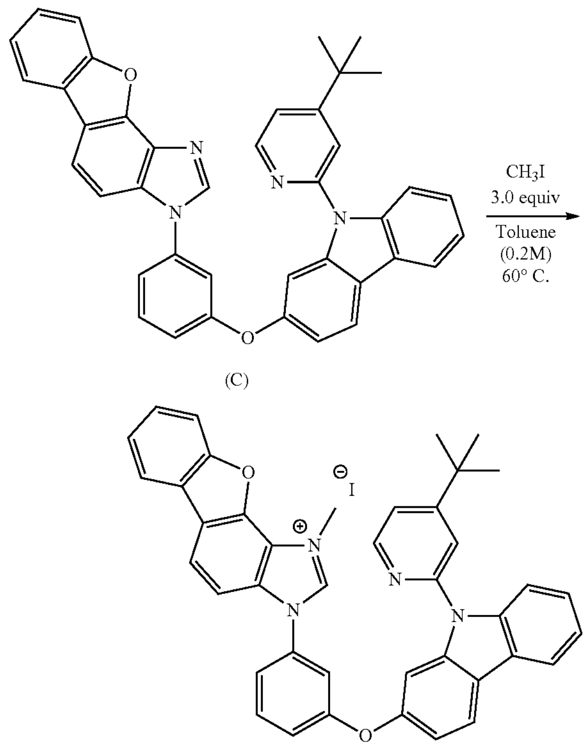

(D)

4.38 g (8.94 mmol) of Intermediate (C) and 3.81 g (26.82 mmol) of methyl iodide were mixed with 40 mL of toluene, followed by stirring at a temperature of 60° C. for 12 hours. Once the reaction was complete, the mixture was cooled to room temperature, and the resulting product was purified by silica gel column chromatography to thereby obtain 5.36 g (7.24 mmol) of Intermediate (D) (yield: 81%).

(3) Synthesis of Compound 49

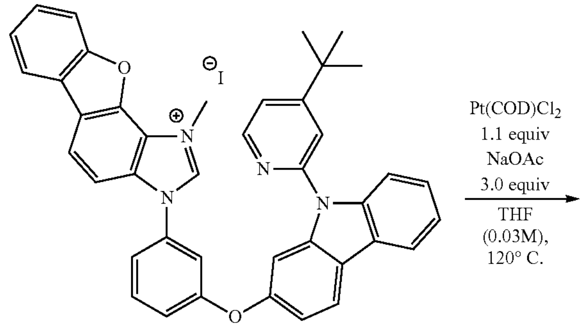

(D)

-continued

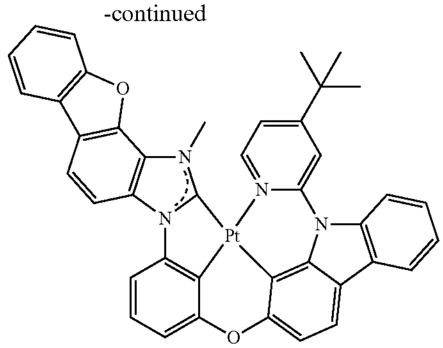

49

5.36 g (7.24 mmol) of Intermediate (D), 2.98 g (7.96 mmol) of $Pt(COD)Cl_2$, and 1.76 g (21.72 mmol) of sodium acetate were mixed with 230 mL of tetrahydrofuran (THF), followed by stirring at a temperature of 120° C. for 48 hours. Once the reaction was complete, the mixture was cooled to room temperature, and then, an organic layer was extracted using saturated ammonium chloride ($NH_4Cl$) and dichloromethane (DCM). The organic layer was dried with anhydrous magnesium sulfate ($MgSO_4$) and filtered, followed by concentration under reduced pressure. The resulting product was purified by silica gel column chromatography to thereby obtain 2.04 g (2.53 mmol) of Compound 49 (yield: 35%).

LC-Mass (calculated value (m/z): 805.20 g/mol, measured value: $M^{+1}$=806 g/mol).

Evaluation Example 1: Evaluation of Maximum Emission Wavelength (Color-Coordinate) and Full Width at Half Maximum (FWHM)

Compound 1 was diluted in toluene at a concentration of 10 millimoles per liter (millimolar, mM), and a PL spectrum of Compound 1 was measured at room temperature by using an ISC PC1 spectrofluorometer, in which a xenon lamp is mounted. From the results, the maximum emission wavelength, color-coordinate, and FWHM of Compound 1 were evaluated. This process was performed on Compounds 49 and A. The results thereof are also shown in Table 2.

Evaluation Example 2: Measurement of Decay Time

Compound 1 was co-vacuum-deposited at a vacuum degree of 10-7 torr at a weight ratio of 2 wt % with the hosts used in the Examples on a quartz substrate to form a film having a thickness of 40 nm.

The PL spectrum of each film was evaluated at room temperature by using a time-resolved photoluminescence (TRPL) measurement system, FluoTime 300 (available from PicoQuant), and a pumping source, PLS340 (available from PicoQuant, excitation wavelength=340 nm, spectral width=20 nm). Then, a wavelength of the main peak in the PL spectrum was determined, and upon photon pulses (pulse width=500 picoseconds, ps) applied to the film by PLS340, the number of photons emitted at the wavelength of the main peak for each film was repeatedly measured over time by time-correlated single photon counting (TCSPC), thereby obtaining TRPL curves available for the sufficient fitting. Based on the results obtained therefrom, one or more exponential decay functions were set forth for the fitting, thereby obtaining $T_{decay}$(Ex), i.e., a decay time, for each film. The results thereof are shown in Table 2. The function used for the fitting is as described in Equation 1, and the average value of $T_{decay}$ values for each of the exponential decay functions used for the fitting was taken as $T_{decay}$(Ex), i.e., a decay time. Here, during the same measurement time as the measurement time for obtaining TRPL curves, the same measurement was repeated once more in a dark state (i.e., a state where a pumping signal incident on each of the films was blocked), thereby obtaining a baseline or a background signal curve available as a baseline for the fitting: This same process was performed on Compounds 49 and A. The results thereof are shown in Table 2.

$$f(t) = \sum_{i=1}^{n} A_i \exp(-t/T_{decay,i}) \quad \text{Equation 1}$$

Evaluation Example 3: Evaluation of PL Quantum Yield (PLQY)

$CH_2Cl_2$ solution of PMMA, 5 wt % of CBP, and Compound 1 were mixed together. The resultant obtained therefrom was coated on a quartz substrate by using a spin coater, heat-treated in an oven at a temperature of 80° C., and cooled to room temperature, thereby obtaining a film.

The photoluminescsnce quantum yield (PLQY) of the film was evaluated by using Hamamatsu Photonics absolute PL quantum yield measurement system employing PLQY measurement software (Hamamatsu Photonics, Ltd., Shizuoka, Japan), in which a xenon light source, a monochromator, a photonic multichannel analyzer, and an integrating sphere are mounted. Thus, the PLQY of Compound 1 was evaluated. This process was also performed on Compounds 49 and A. The results thereof are shown in Table 2.

TABLE 2

| Compound | Maximum emission wavelength (nm) | Color coordinate (CIEx, y) | FWHM (nm) | Decay time (μs) | PLQY |
|---|---|---|---|---|---|
| Compound A | 465 nm | (0.14, 0.20) | 43 | 2.65 | 0.599 |
| Compound 1 | 459 nm | (0.14, 0.12) | 22 | 2.16 | 0.621 |
| Compound 49 | 457 nm | (0.14, 0.12) | 21 | 2.55 | 0.696 |

1

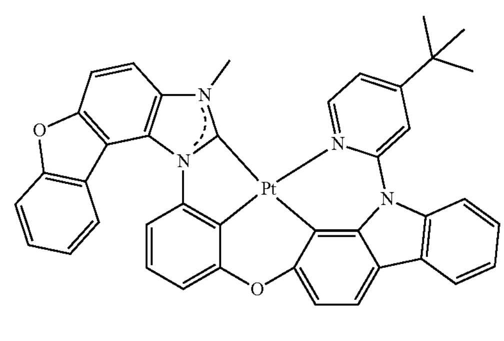

-continued

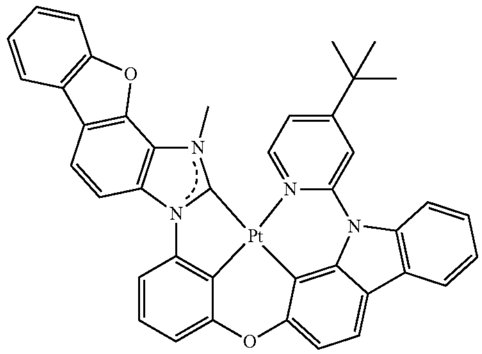

49

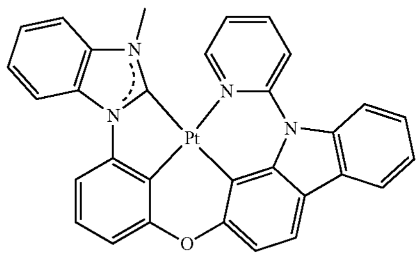

A

Referring to the results of Table 2, it was found that Compounds 1 and 49 each had excellent characteristics such as a narrow FHWM, a short decay time, and a high emission quantum efficiency, as compared with Compound A.

Example 1

An ITO glass substrate was cut to a size of 50 millimeters (mm)×50 mm×0.5 mm. Then the glass substrate was sonicated separately in acetone, isopropyl alcohol, and then pure water for about 15 minutes in each solvent and cleaned by exposure to ultraviolet irradiation with ozone for 30 minutes.

Thereafter, a hole injection layer was formed to have a thickness of 600 Å on the ITO electrode (anode) on the glass substrate by depositing m-MTDATA at a rate of about 1 Å/sec. A hole transport layer was formed to have a thickness of 250 Å on the hole injection layer by depositing α-NPD at a rate of 1 Å/sec.

An emission layer was formed to have a thickness of 400 Å on the hole transport layer by co-depositing Compound 1 (as a dopant) and CBP (as a host) at a deposition rate of 0.1 Å/sec and 1 Å/sec, respectively.

A hole blocking layer was formed on the emission layer by depositing BAlq at a rate of 1 Å/sec to have a thickness of 50 Å. Then, an electron transport layer was formed on the hole blocking layer by depositing $Alq_3$ to have a thickness of 300 Å. An electron injection layer was formed on the electron transport layer by depositing LiF to have a thickness of 10 Å. A second electrode (cathode) was formed on the electron injection layer by vacuum-depositing A1 to have a thickness of 1,200 Å. Therefore, the manufacture of an organic light-emitting device was completed, in which the organic light-emitting device included an ITO/m-MTDATA (600 Å)/α-NPD (250 Å)/CBP+10% Compound 1 (400 Å)/BAlq (50 Å)/$Alq_3$ (300 Å)/LiF (10 Å)/Al (1,200 Å) structure.

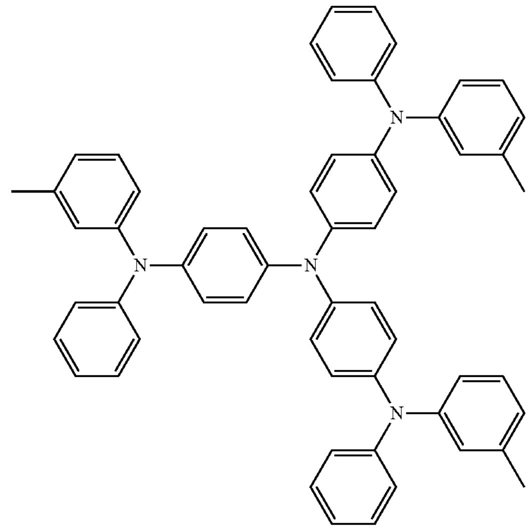

m-MTDATA

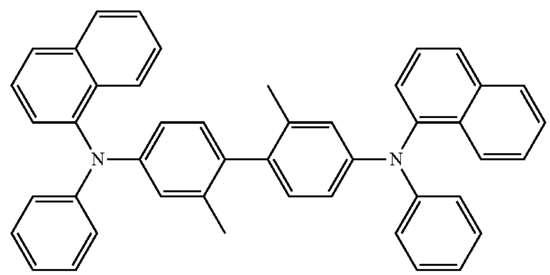

α-NPD

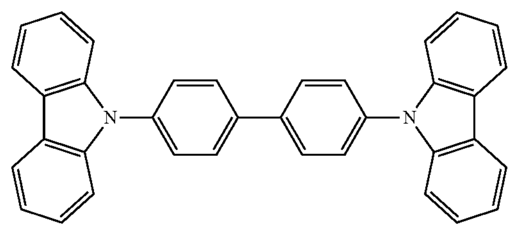

CBP

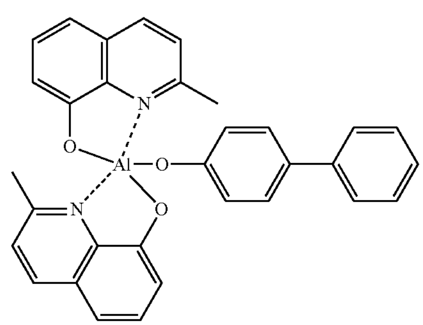

BAlq

-continued

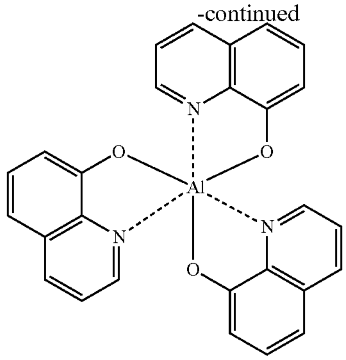

Alq3

Example 2 and Comparative Examples 1 and 2

Organic light-emitting devices were manufactured in substantially the same manner as in Example 1, except that the compounds listed in Table 3 were used instead of Compound 1 as a dopant in the formation of an emission layer.

Evaluation Example 4: Evaluation of Characteristics of Organic Light-Emitting Device The EL spectrum, driving voltage, and external quantum emission efficiency of the organic light-emitting devices manufactured in Examples 1 and 2 and Comparative Examples 1 and 2 were measured. The measurement method is as follows. The results thereof are shown in Table 3. The values of the driving voltage and the external quantum efficiency in Table 3 are shown in a relative value (%), as compared with the driving voltage and the external quantum efficiency of the organic light-emitting device in Comparative Example 2.

(1) Measurement of Current Density Depending on Applied Voltages

The current of the prepared organic light-emitting devices were measured as values of current in a unit device thereof using a current voltmeter (Keithley 2400) while increasing the applied voltage from 0 volts (V) to 10 V. The result was obtained by dividing a current value by an area.

(2) Measurement of Luminance Depending on Applied Voltages

The luminance of the prepared organic light-emitting devices were measured by using a luminance meter (Minolta Cs-1000A) while increasing the applied voltage from 0 V to 10 V.

(3) Measurement of EL Spectra

The EL spectra of the manufactured organic light-emitting devices at a luminance of about 500 candelas per square meter ($cd/m^2$) were measured by using a luminance meter (Minolta Cs-1000A). Then, the maximum emission wavelength was evaluated.

(4) Measurement of External Quantum Efficiency

A Keithley 2400 current voltmeter and a luminance meter (Minolta Cs-1000A) were used in evaluation.

The EL spectrum, driving voltage, and external quantum emission efficiency of the organic light-emitting devices manufactured in Examples 1 and 2 and Comparative Examples 1 and 2 are shown in Table 3.

TABLE 3

| No. | Dopant compound | Driving voltage (V) (relative %) | External quantum efficiency (relative %) | Maximum emission wave-length (nm) |
|---|---|---|---|---|
| Comparative Example 1 | Compound A | 98% | 200% | 460 |
| Example 1 | Compound 1 | 89% | 324% | 459 |
| Example 2 | Compound 49 | 87% | 284% | 459 |
| Comparative Example 2 | Compound D | 100% | 100% | 442 |

1

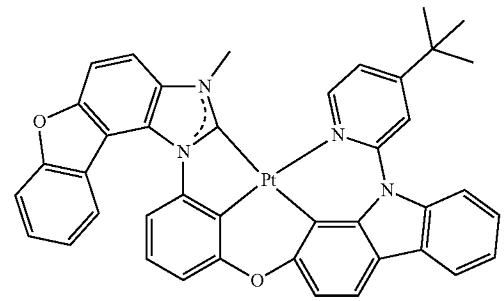

49

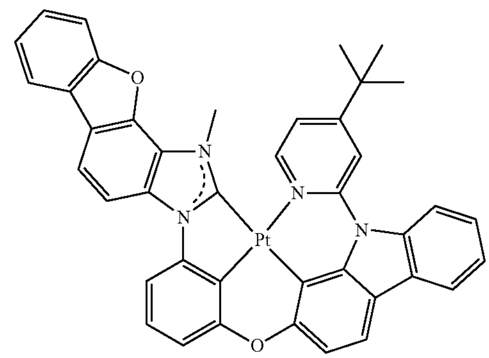

A

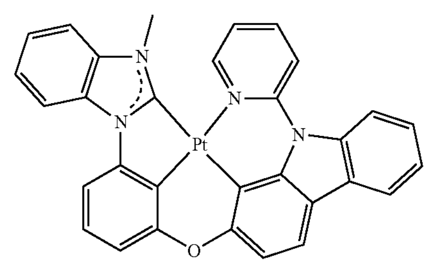

D

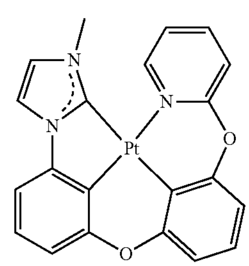

Referring to the results of Table 3, the organic light-emitting devices manufactured in Examples 1 and 2 were found to have excellent external quantum efficiency and a low or equal level of driving voltage, as compared with the organic light-emitting devices manufactured in Comparative Examples 1 and 2.

As apparent from the foregoing description, the organometallic compound has a narrow FWHM and a short decay time, thus having improved quantum efficiency. Thus, an organic light-emitting device including the organometallic compound may have improved luminescent external quantum efficiency and a low driving voltage. Further, a diagnostic composition that includes the organometallic compound may have a high diagnostic efficiency, because the organometallic compound is excellent in phosphorescent emission characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present disclosure as defined by the following claims.

What is claimed is:

1. An organometallic compound represented by Formula 1:

Formula 1

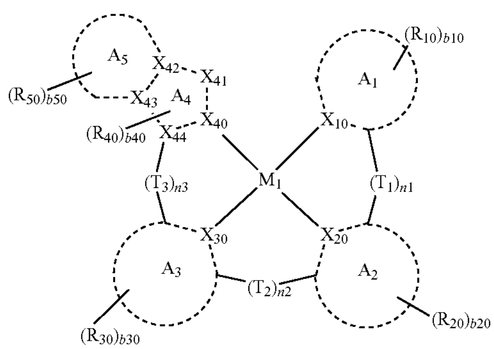

wherein, in Formula 1, $M_1$ is beryllium, magnesium, aluminum, calcium, titanium, manganese, cobalt, copper, zinc, gallium, germanium, zirconium, ruthenium, rhodium, palladium, silver, rhenium, platinum, or gold, $A_1$ to $A_3$ are each independently a $C_5$-$C_{30}$ carbocyclic group or a $C_1$-$C_{30}$ heterocyclic group, $A_4$ is a 5-membered heterocyclic group, $A_5$ is represented by any one of Formulae A5-1 to A5-6, $X_{10}$, $X_{20}$, $X_{30}$, and $X_{40}$ to $X_{44}$ are each independently C or N, $T_1$ to $T_3$ are each independently a single bond, *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(=O)—*', *—S(=O)—*', *—S(=O)$_2$—*', *—C($R_1$)=C($R_2$)—*', *—C(=S)—*', or *—C≡C—*',

* and *' each indicate a binding site to an adjacent atom, n1 to n3 are each independently an integer from 1 to 3, $L_1$ is a single bond, a substituted or unsubstituted $C_5$-$C_{30}$ carbocyclic group, or a substituted or unsubstituted $C_1$-$C_{30}$ heterocyclic group, a1 is an integer from 1 to 3, and when a1 is 2 or greater, at least two $L_1$ groups are identical to or different from each other, $R_1$, $R_2$, $R_{10}$, $R_{20}$, $R_{30}$, $R_{40}$, and $R_{50}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P($Q_8$)($Q_9$), or —P(=O)($Q_8$)($Q_9$), at least two adjacent $R_1$, $R_2$, $R_{10}$, $R_{20}$, $R_{30}$, $R_{40}$, or $R_{50}$ groups are optionally bound together to form a substituted or unsubstituted $C_5$-$C_{30}$ carbocyclic group or a substituted or unsubstituted $C_1$-$C_{30}$ heterocyclic group, b1 is an integer from 1 to 5, and when b1 is 2 or greater, at least two $R_1$ groups are identical to or different from each other, b10, b20, b30, and b50 are each independently an integer from 1 to 10, b40 is an integer from 1 to 3, when b10 is 2 or greater, at least two $R_{10}$ groups are identical to or different from each other, when b20 is 2 or greater, at least two $R_{20}$ groups are identical to or different from each other, when b30 is 2 or greater, at least two $R_{30}$ groups are identical to or different from each other, when b40 is 2 or greater, at least two $R_{40}$ groups are identical to or different from each other, when b50 is 2 or greater, at least two $R_{50}$ groups are identical to or different from each other, and at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_6$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(Q_{18})(Q_{19})$, or —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(Q_{28})(Q_{29})$, or —$P(=O)(Q_{28})(Q_{29})$; or —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(Q_{38})(Q_{39})$, or —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently hydrogen; —F; —Cl; —Br; —I; a hydroxyl group; a cyano group; a nitro group; an amidino group; a hydrazine group; a hydrazone group; a carboxylic acid group or a salt thereof, a sulfonic acid group or a salt thereof, a phosphoric acid group or a salt thereof, a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryl group substituted with a $C_1$-$C_{60}$ alkyl group, a $C_6$-$C_{60}$ aryl group, or a combination thereof, a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group,

A5-1

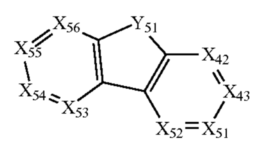

A5-2

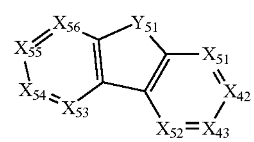

A5-3

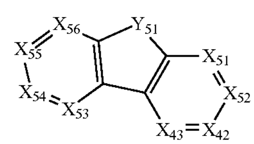

A5-4

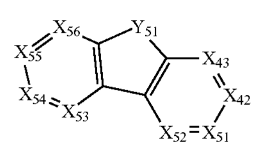

A5-5

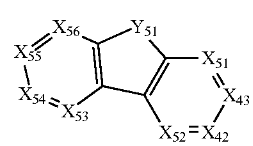

A5-6

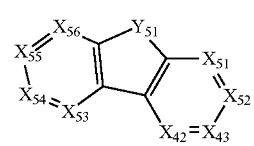

wherein, in Formulae A5-1 to A5-6, $Y_{51}$ is *—O—*' *—S—*' *—N($R_5$)—*', *—C($R_5$)($R_6$)—*', *—Si($R_5$)($R_6$)—*', *—B($R_5$)—*', *—P($R_5$)—*', or *—P(=O)($R_5$)—*', wherein * and *' each indicate a binding site to an adjacent atom, $R_5$ and $R_6$ are respectively understood by referring to $R_1$ and $R_2$, and $X_{51}$ is $C(R_{51})$ or N, $X_{52}$ is $C(R_{52})$ or N, $X_{53}$ is $C(R_{53})$ or N, $X_{54}$ is $C(R_{54})$ or N, $X_{55}$ is $C(R_{55})$ or N, $X_{56}$ is $C(R_{56})$ or N, and wherein $R_{51}$ to $R_{56}$ are each independently understood by referring to the description of $R_{50}$.

2. The organometallic compound of claim 1, wherein $M_1$ is Pt, Pd, or Au.

3. The organometallic compound of claim 1, wherein $A_1$ to $A_3$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

4. The organometallic compound of claim 1, wherein $X_{40}$ in $A_4$ is C, and $X_{41}$ and $X_{44}$ are each N.

5. A diagnostic composition comprising at least one organometallic compound of claim 1.

6. The organometallic compound of claim 1, wherein $X_{10}$ is N, and $X_{20}$, $X_{30}$, and $X_{40}$ are each C.

7. The organometallic compound of claim 1, wherein a bond between $M_1$ and $X_{10}$ is a coordinate bond, a bond between $M_1$ and $X_{20}$ is a covalent bond, a bond between $M_1$ and $X_{30}$ is a covalent bond, and a bond between $M_1$ and $X_{40}$ is a coordinate bond.

8. The organometallic compound of claim 1, wherein $T_1$ to $T_3$ are each independently a single bond, $*—N[(L_1)_{a1}-(R_1)_{b1}]—*'$, $*—C(R_1)(R_2)—*'$, $*—Si(R_1)(R_2)—*'$, $*—O—*'$, or $*—S—*'$, wherein * and *' each indicate a binding site to an adjacent atom.

9. The organometallic compound of claim 1, wherein $L_1$ is:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

10. The organometallic compound of claim 1, wherein $R_1$, $R_2$, $R_5$, $R_6$, $R_{10}$, $R_{20}$, $R_{30}$, $R_{40}$, and $R_{51}$ to $R_{56}$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group; or $—N(Q_1)(Q_2)$, $—Si(Q_3)(Q_4)(Q_5)$, $—Ge(Q_3)(Q_4)(Q_5)$, $—B(Q_6)(Q_7)$, $—P(Q_8)(Q_9)$, or $—P(=O)(Q_8)(Q_9)$, wherein $Q_1$ to $Q_9$ are each independently:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, or a naphthyl group; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one selected from deuterium, a $C_1$-$C_{10}$ alkyl group, or a phenyl group.

11. The organometallic compound of claim 1, wherein $R_1$, $R_2$, $R_5$, $R_6$, $R_{10}$, $R_{20}$, $R_{30}$, $R_{40}$, and $R_{51}$ to $R_{56}$ are each independently hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, a group represented by any one of Formulae 9-1 to 9-19, or a group represented by any one of Formulae 10-1 to 10-194:

9-1

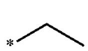

-continued 9-2

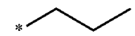

9-3

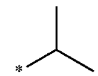

9-4

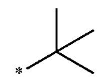

9-5

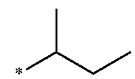

9-6

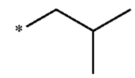

9-7

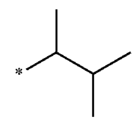

9-8

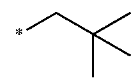

9-9

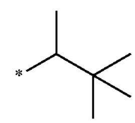

9-10

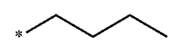

9-11

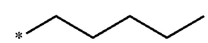

9-12

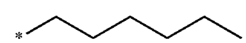

9-13

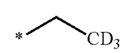

9-14

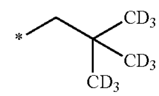

9-15

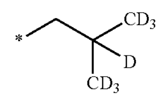

9-16

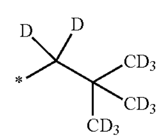

9-17

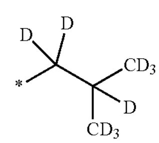

9-18

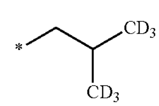

-continued
9-19
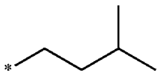
10-1
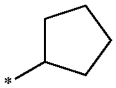
10-2
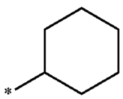
10-3
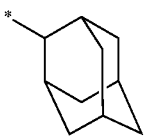
10-4
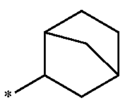
10-5
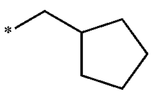
10-6
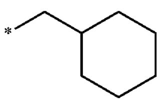
10-7
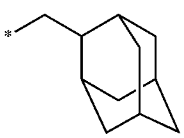
10-8
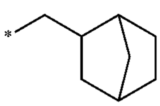
10-9
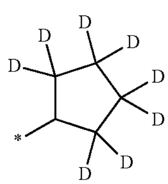
10-10
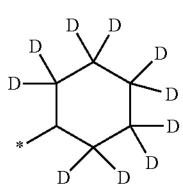
10-11
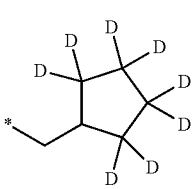
-continued
10-12
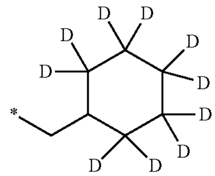
10-13
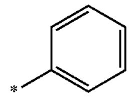
10-14
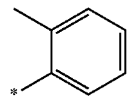
10-15
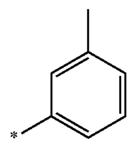
10-16
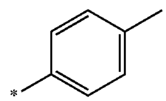
10-17
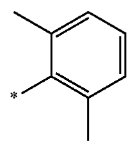
10-18
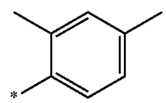
10-19
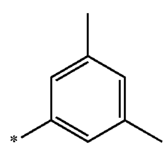
10-20
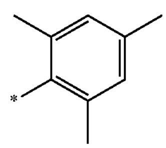
10-21
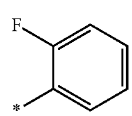
10-22
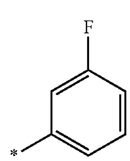
10-23
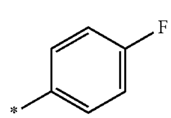

-continued
10-24
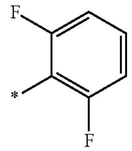
10-25
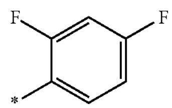
10-26
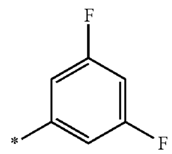
10-27
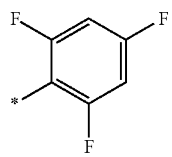
10-28
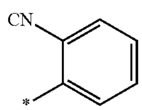
10-29
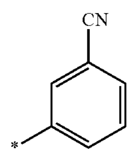
10-30
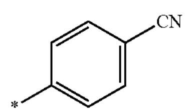
10-31
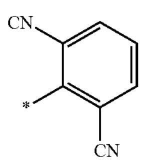
10-32
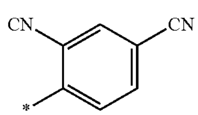
10-33
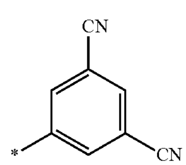
10-34
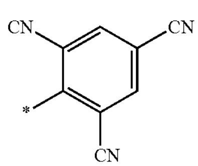
-continued
10-35
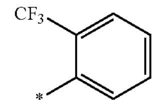
10-36
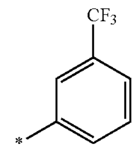
10-37
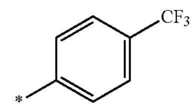
10-38
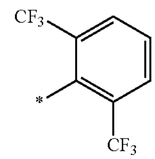
10-39
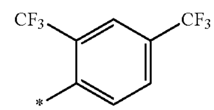
10-40
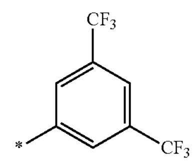
10-41
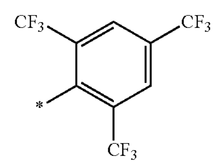
10-42
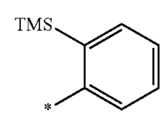
10-43
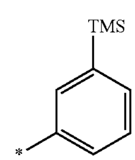
10-44
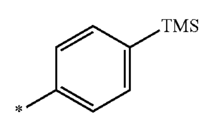
10-45
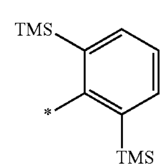

-continued
10-46
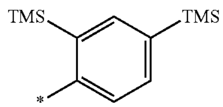
10-47
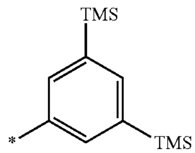
10-48
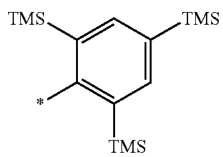
10-49
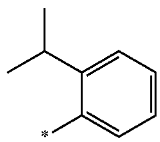
10-50
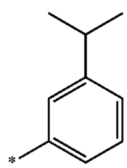
10-51
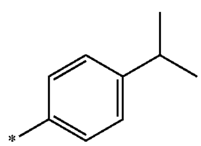
10-52
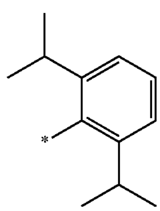
10-53
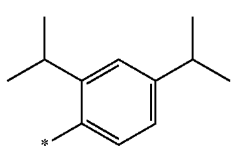
10-54
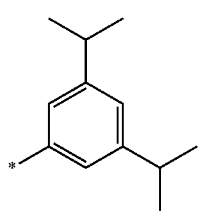
-continued
10-55
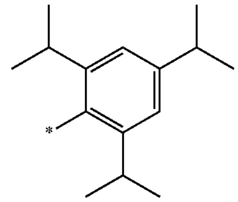
10-56
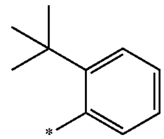
10-57
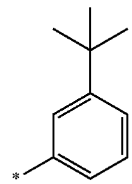
10-58
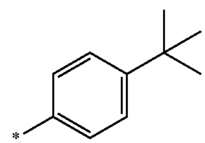
10-59
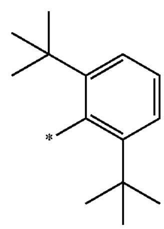
10-60
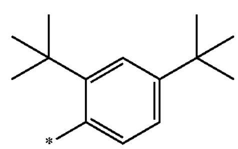
10-61
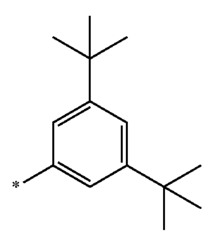
10-62
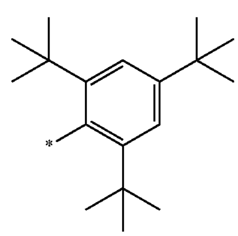

-continued
10-63
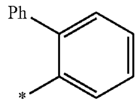
10-64
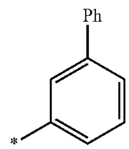
10-65
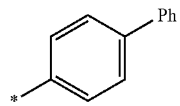
10-66
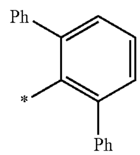
10-67
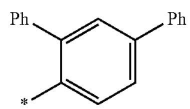
10-68
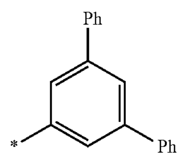
10-69
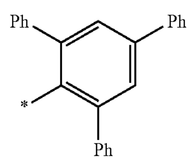
10-70
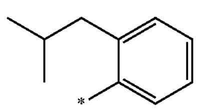
10-71
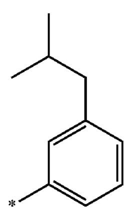
10-72
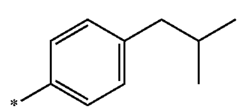
10-73
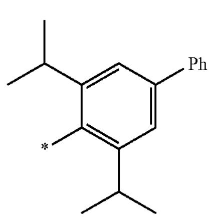
-continued
10-74
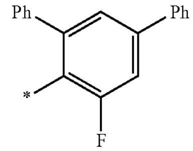
10-75
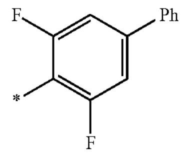
10-76
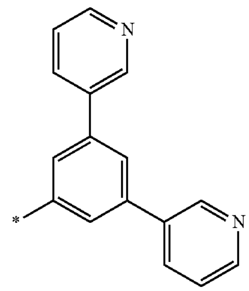
10-77
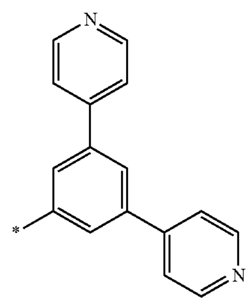
10-78
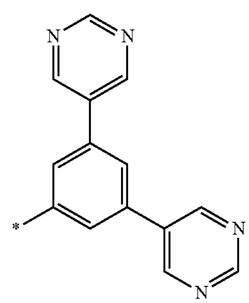
10-79
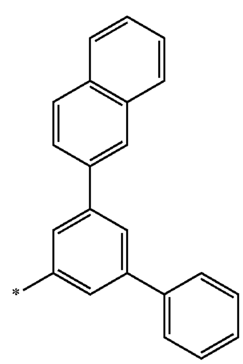

-continued
10-80
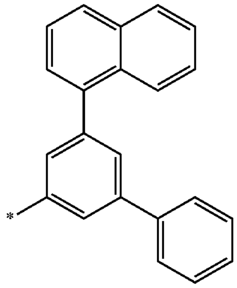
10-81
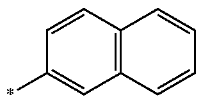
10-82
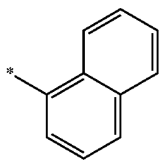
10-83
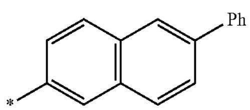
10-84
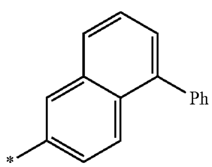
10-85
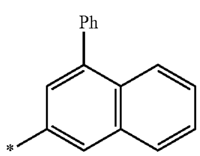
10-86
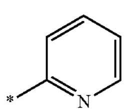
10-87
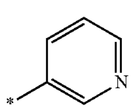
10-88
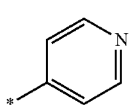
10-89
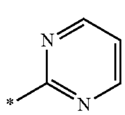
10-90
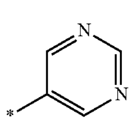
-continued
10-91
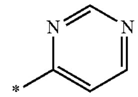
10-92
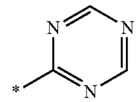
10-93
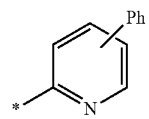
10-94
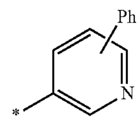
10-95
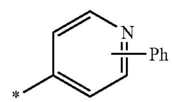
10-96
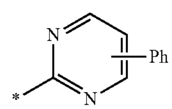
10-97
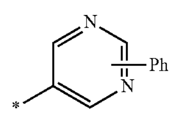
10-98
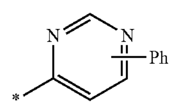
10-99
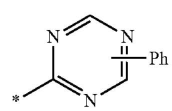
10-100
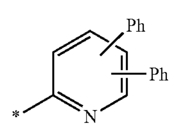
10-101
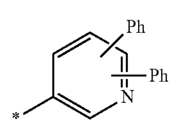
10-102
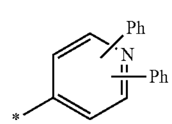
10-103
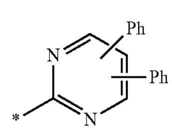

-continued
10-104
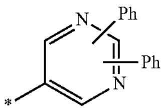
10-105
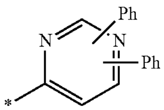
10-106
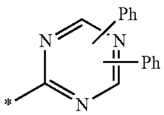
10-107
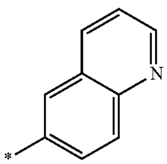
10-108
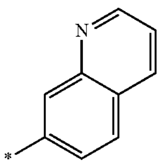
10-109
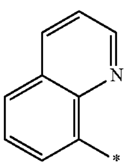
10-110
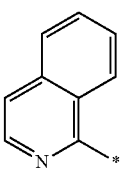
10-111
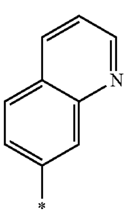
10-112
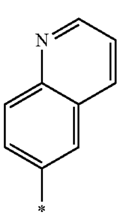
-continued
10-113
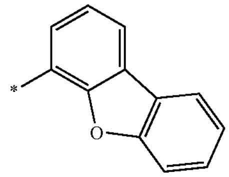
10-114
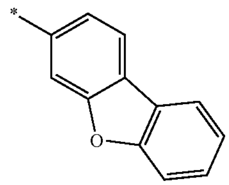
10-115
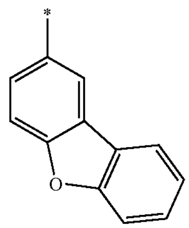
10-116
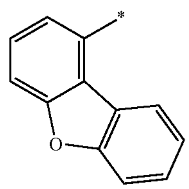
10-117
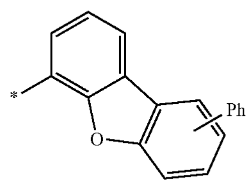
10-118
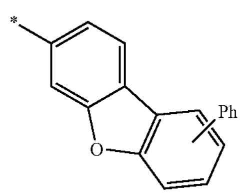
10-119
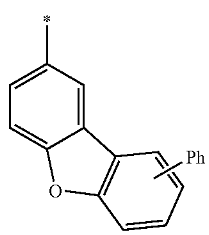
10-120
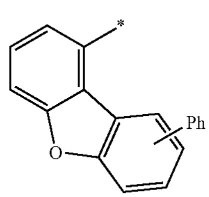

-continued
10-121
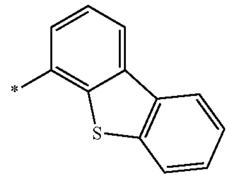
10-122
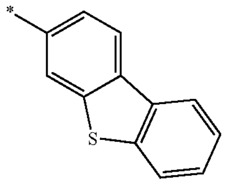
10-123
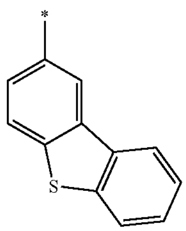
10-124
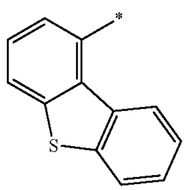
10-125
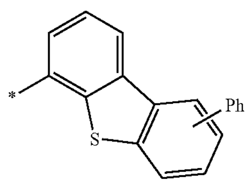
10-126
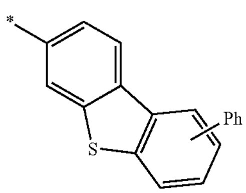
10-127
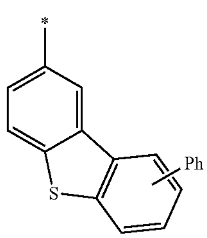
10-128
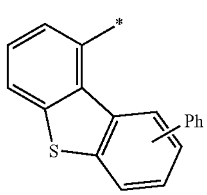
-continued
10-129
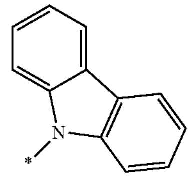
10-130
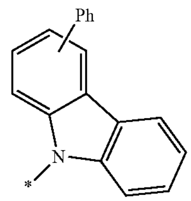
10-131
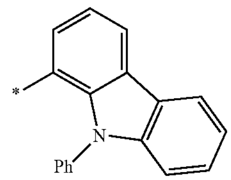
10-132
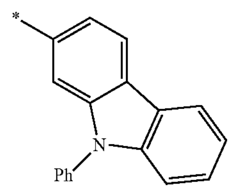
10-133
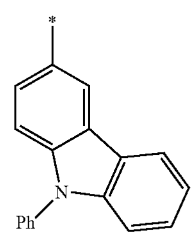
10-134
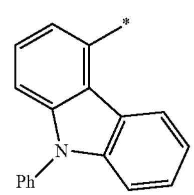
10-135
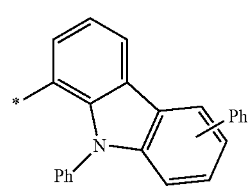
10-136
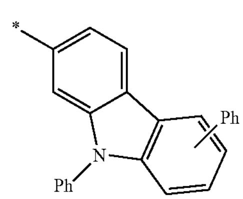

-continued
10-137
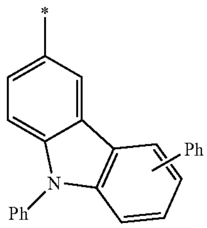
10-138
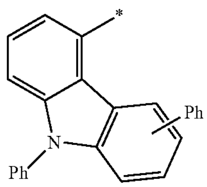
10-139
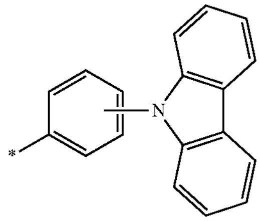
10-140
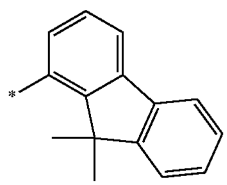
10-141
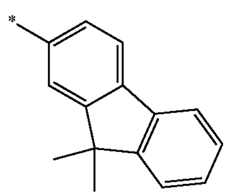
10-142
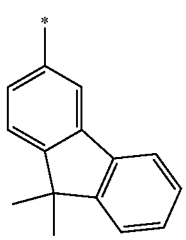
10-143
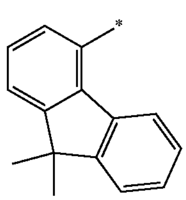
-continued
10-144
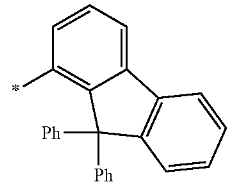
10-145
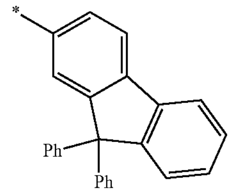
10-146
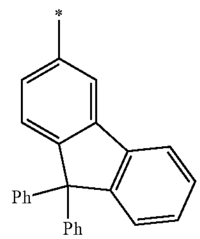
10-147
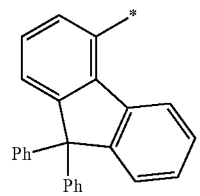
10-148
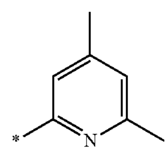
10-149
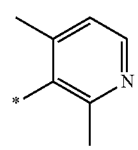
10-150
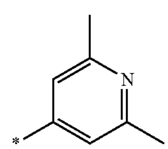
10-151
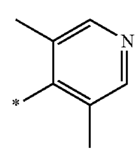
10-152
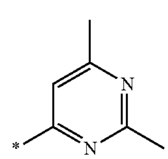

-continued
10-153
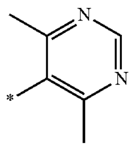
10-154
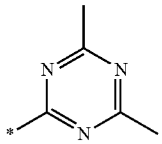
10-155
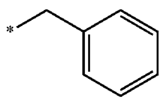
10-156
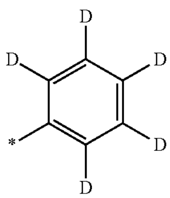
10-157
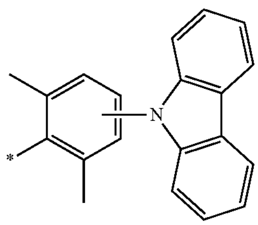
10-158
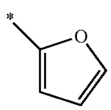
10-159
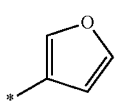
10-160
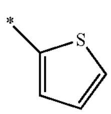
10-161
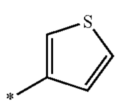
10-162
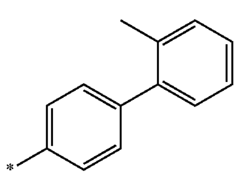
-continued
10-163
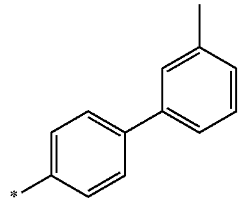
10-164
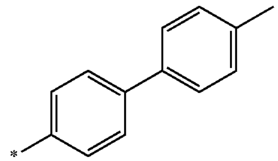
10-165
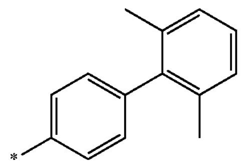
10-166
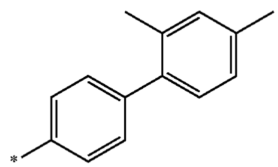
10-167
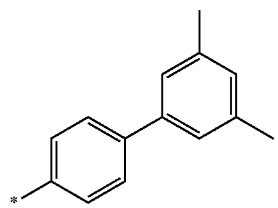
10-168
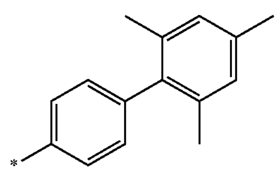
10-169
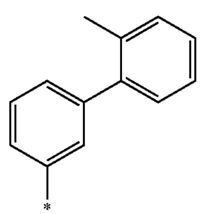
10-170
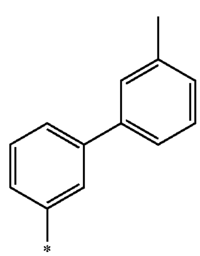

-continued
10-171
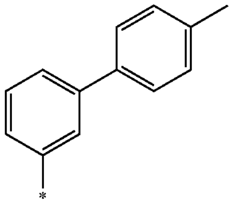
10-172
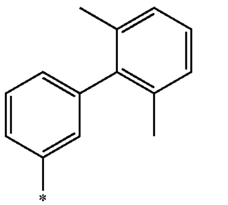
10-173
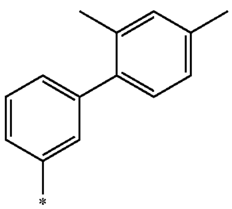
10-174
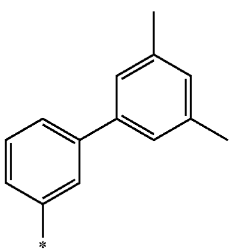
10-175
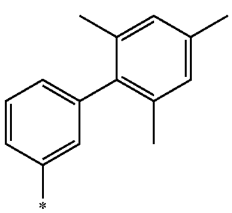
10-176
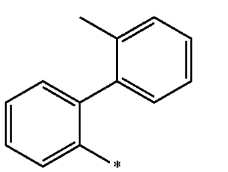
10-177
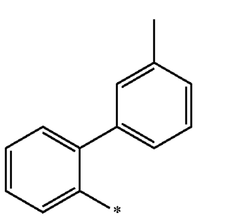
-continued
10-178
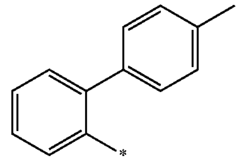
10-179
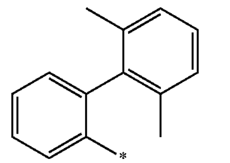
10-180
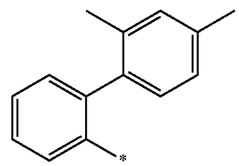
10-181
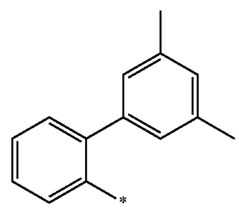
10-182
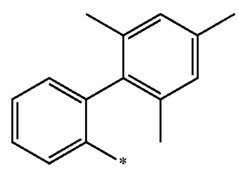
10-183
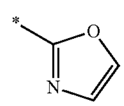
10-184
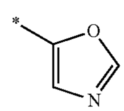
10-185
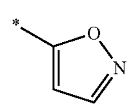
10-186
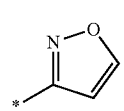
10-187
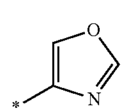
10-188
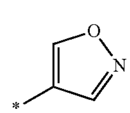

10-189
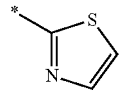
10-190
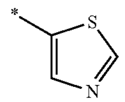
10-191
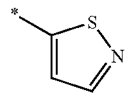
10-192
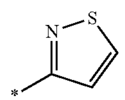
10-193
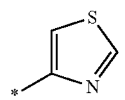
10-194
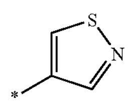
wherein, in Formulae 9-1 to 9-19 and 10-1 to 10-194, * indicates a binding site to an adjacent atom, "Ph" indicates a phenyl group, and "TMS" indicates a trimethylsilyl group.
12. The organometallic compound of claim 1, wherein the organometallic compound represented by Formula 1 is represented by any one of Formulae 11-1 to 11-6:
Formula 11-1
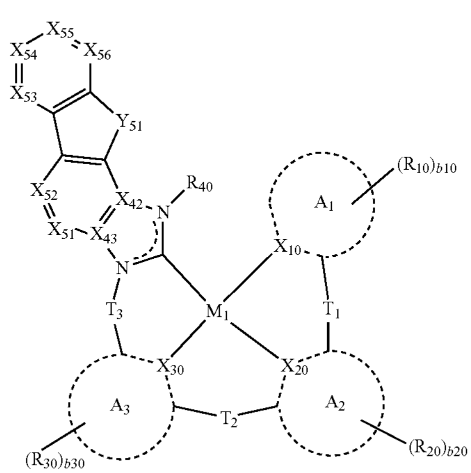
Formula 11-2
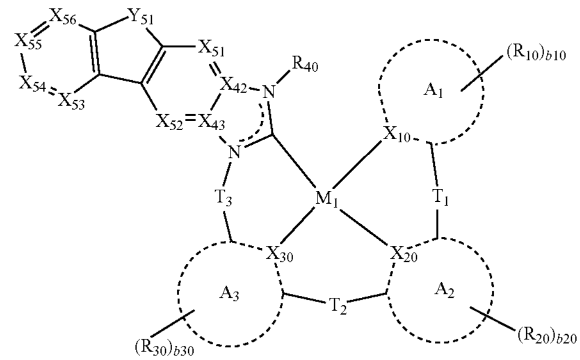
Formula 11-3
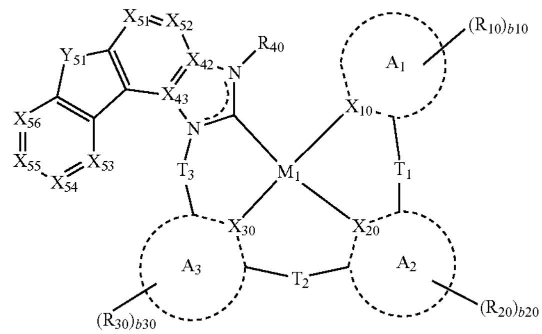
Formula 11-4
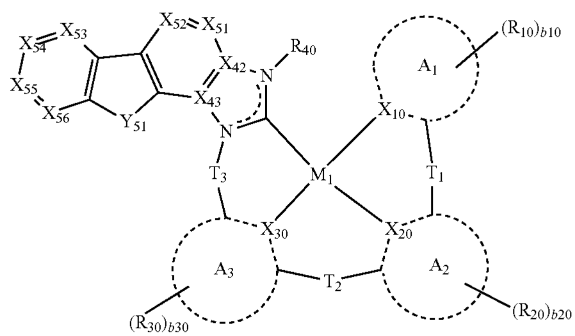
Formula 11-5
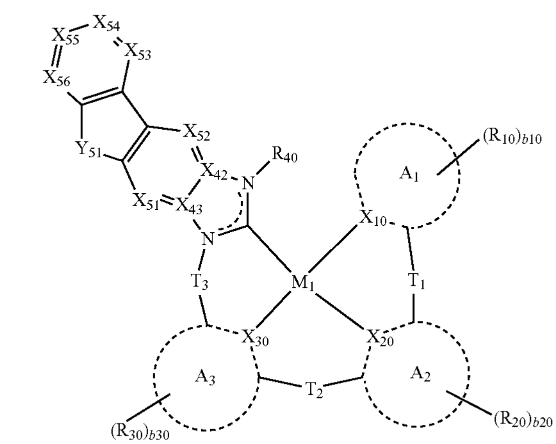

-continued

Formula 11-6

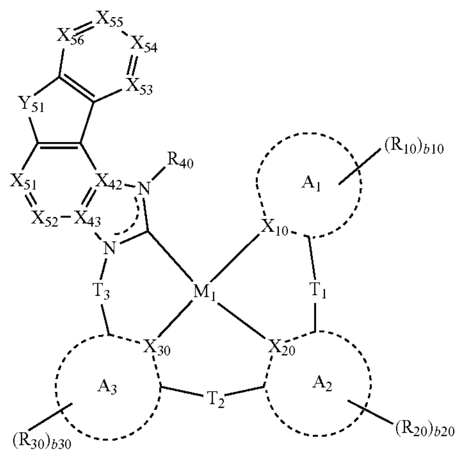

wherein, in Formulae 11-1 to 11-6, $M_1$, $A_1$ to $A_3$, $X_{10}$, $X_{20}$, $X_{30}$, $X_{42}$, $X_{43}$, $T_1$ to $T_3$, $R_{10}$, $R_{20}$, $R_{30}$, $R_{40}$, b10, b20, and b30 are respectively understood by referring to the descriptions of $M_1$, $A_1$ to $A_3$, $X_{10}$, $X_{20}$, $X_{30}$, $X_{42}$, $X_{43}$, $T_1$ to $T_3$, $R_{10}$, $R_{20}$, $R_{30}$, $R_{40}$, b10, b20, and b30 in claim 1, $Y_{51}$ is *—O—*', *—S—*', *—N($R_5$)—*', *—C($R_5$)($R_6$)—*', *—Si($R_5$)($R_6$)—*', *—B($R_5$)—*', *—P($R_5$)—*', or *—P(=O)($R_5$)—*', wherein * and *' each indicate a binding site to an adjacent atom, $R_5$ and $R_6$ are respectively understood by referring to the descriptions of $R_1$ and $R_2$ in claim 1, $X_{51}$ is C($R_{51}$) or N, $X_{52}$ is C($R_{52}$) or N, $X_{53}$ is C($R_{53}$) or N, $X_{54}$ is C($R_{54}$) or N, $X_{55}$ is C($R_{55}$) or N, $X_{56}$ is C($R_{56}$) or N, and $R_{51}$ to $R_{56}$ are each independently understood by referring to the description of $R_{50}$ in claim 1.

13. The organometallic compound of claim 1, wherein the organometallic compound represented by Formula 1 is represented by any one of Formulae 12-1 to 12-6:

Formula 12-1

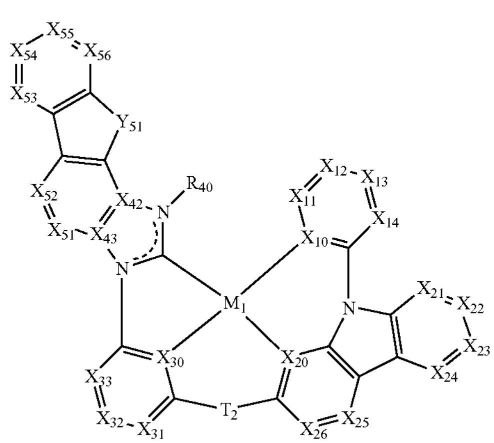

-continued

Formula 12-2

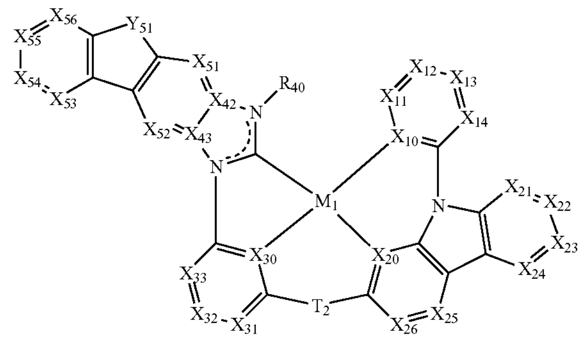

Formula 12-3

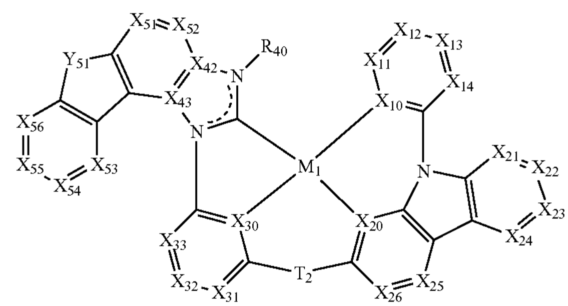

Formula 12-4

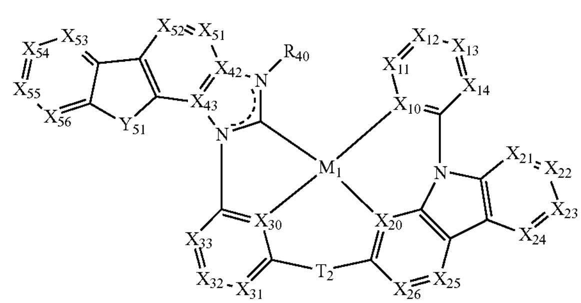

Formula 12-5

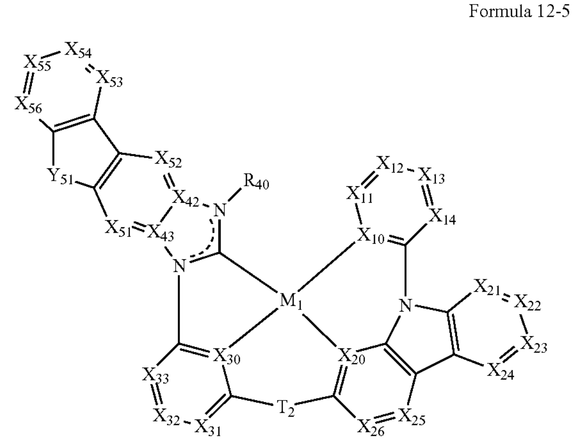

-continued

Formula 12-6

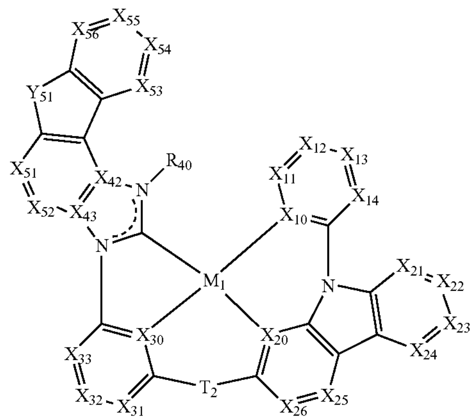

wherein, in Formulae 12-1 to 12-6, $M_1$, $X_{10}$, $X_{20}$, $X_{30}$, $X_{42}$, $X_{43}$, $R_{40}$, and $T_2$ are respectively understood by referring to $M_1$, $X_{10}$, $X_{20}$, $X_{30}$, $X_{42}$, $X_{43}$, $R_{40}$, and $T_2$ in claim 1, $Y_{51}$ is *—O—*', *—S—*', *—N($R_5$)—*', *—C($R_5$)($R_6$)—*', *—Si($R_5$)($R_6$)—*', *—B($R_5$)—*', *—P($R_5$)—*', or *—P(=O)($R_5$)—*', wherein * and *' each indicate a binding site to an adjacent atom, $R_5$ and $R_6$ are respectively understood by referring to $R_1$ and $R_2$ in claim 1, $X_{11}$ is C($R_{11}$) or N, $X_{12}$ is C($R_{12}$) or N, $X_{13}$ is C($R_{13}$) or N, and $X_{14}$ is C($R_{14}$) or N, $X_{21}$ is C($R_{21}$) or N, $X_{22}$ is C($R_{22}$) or N, $X_{23}$ is C($R_{23}$) or N, $X_{24}$ is C($R_{24}$) or N, $X_{25}$ is C($R_{25}$) or N, and $X_{26}$ is C($R_{26}$) or N, $X_{31}$ is C($R_{31}$) or N, $X_{32}$ is C($R_{32}$) or N, and $X_{33}$ is C($R_{33}$) or N, $X_{51}$ is C($R_{51}$) or N, $X_{52}$ is C($R_{52}$) or N, $X_{53}$ is C($R_{53}$) or N, $X_{54}$ is C($R_{54}$) or N, $X_{55}$ is C($R_{55}$) or N, and $X_{56}$ is C($R_{56}$) or N, $R_{11}$ to $R_{14}$ are each independently understood by referring to $R_{10}$ in claim 1, $R_{21}$ to $R_{26}$ are each independently understood by referring to $R_{20}$ in claim 1, $R_{31}$ to $R_{33}$ are each independently understood by referring to $R_{30}$ in claim 1, and $R_{51}$ to $R_{56}$ are each independently understood by referring to $R_{50}$ in claim 1.

14. The organometallic compound of claim 1, wherein the organometallic compound is any one of Compounds 1 to 72:

1

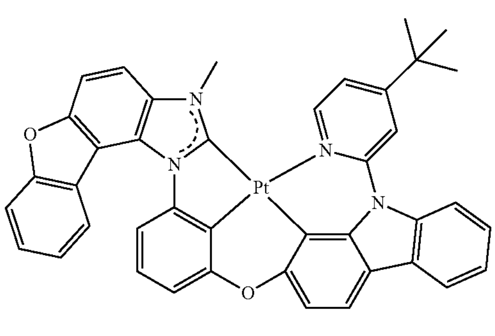

-continued

2

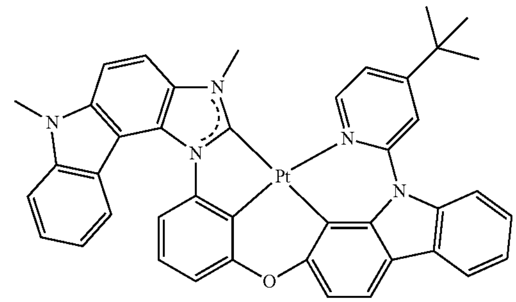

3

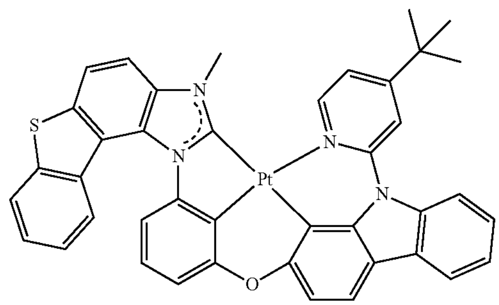

4

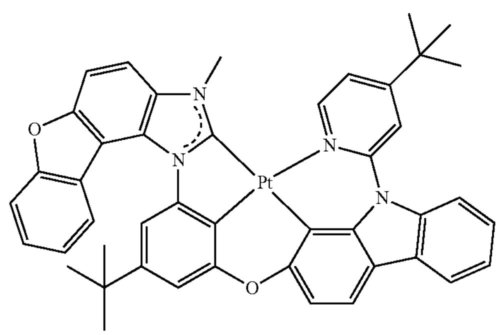

5

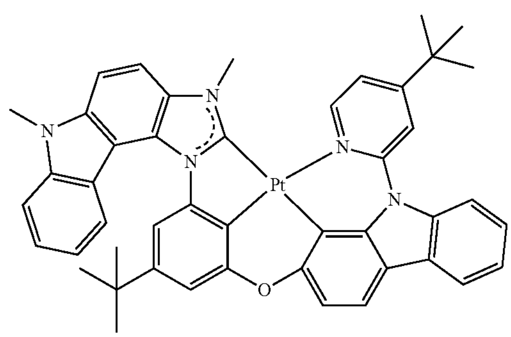

6

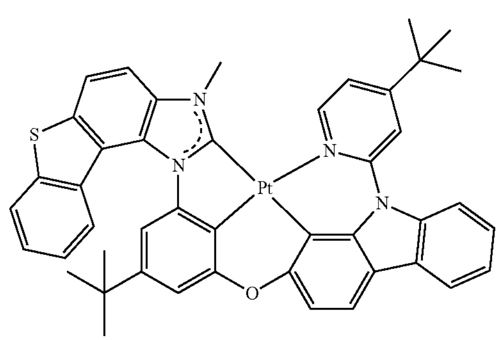

-continued
7
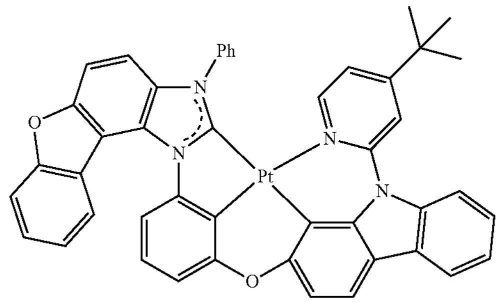
8
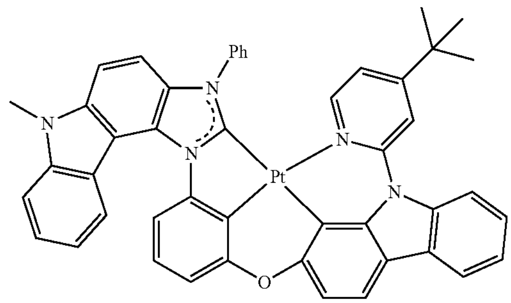
9
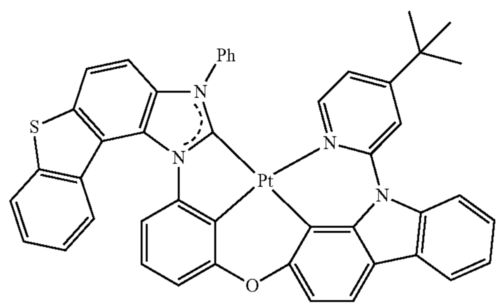
10
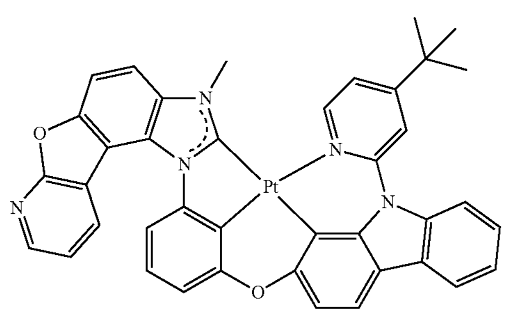
11
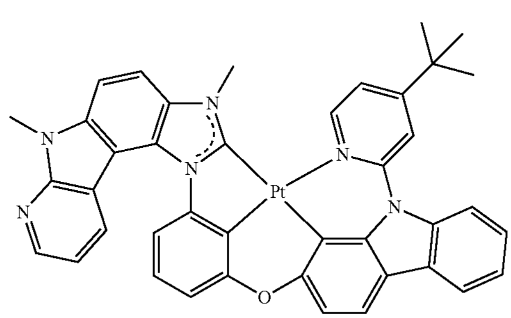
-continued
12
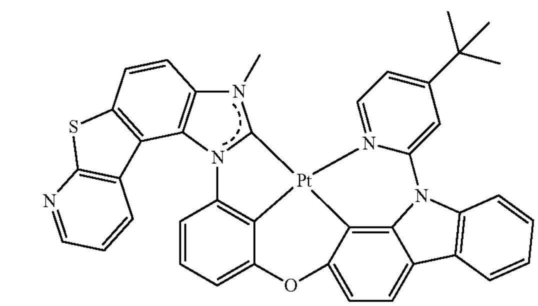
13
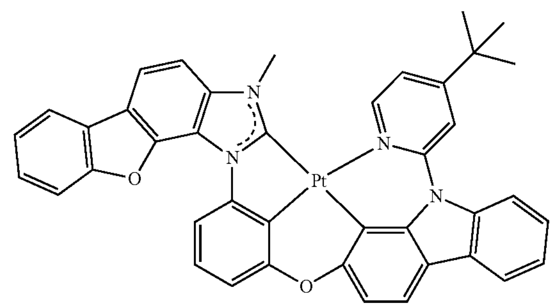
14
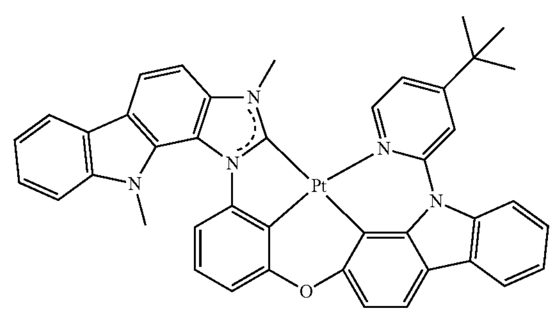
15
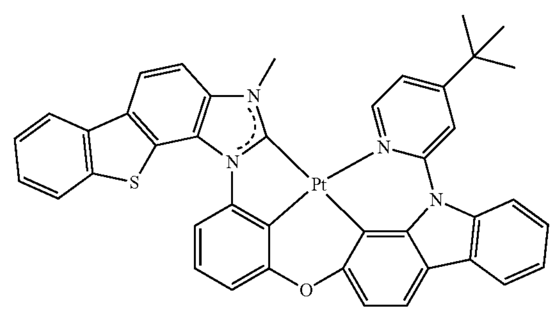
16
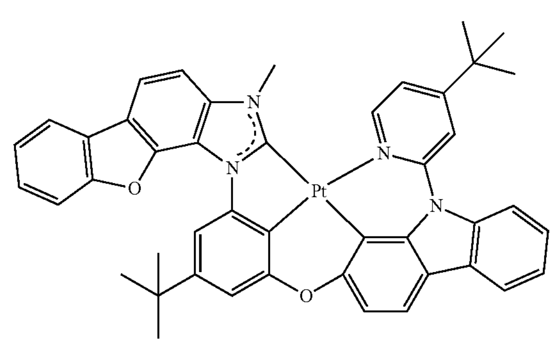

-continued
17
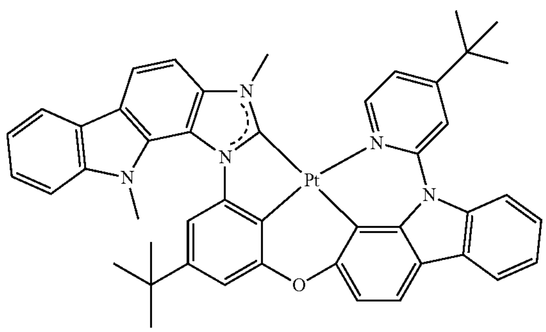
18
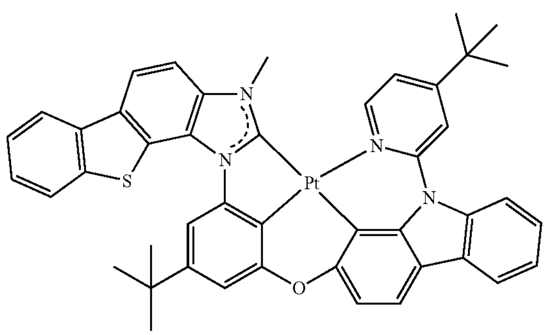
19
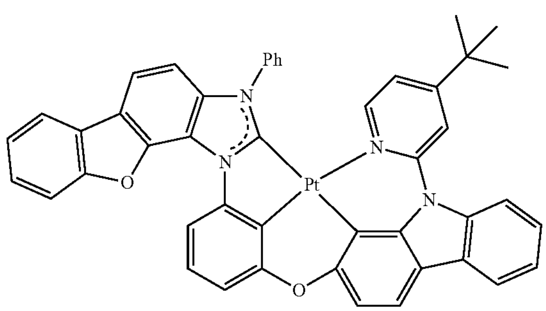
20
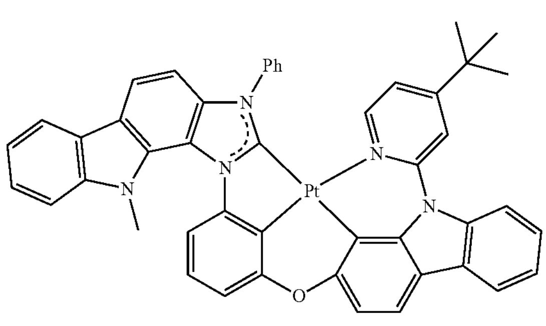
-continued
21
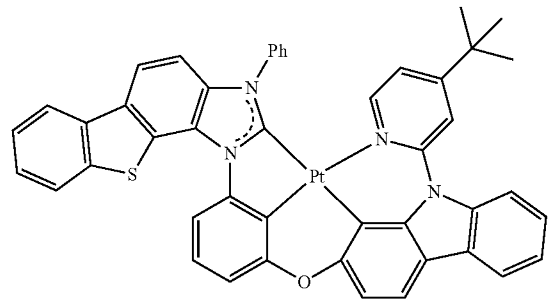
22
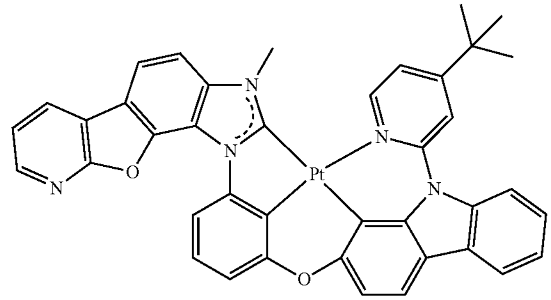
23
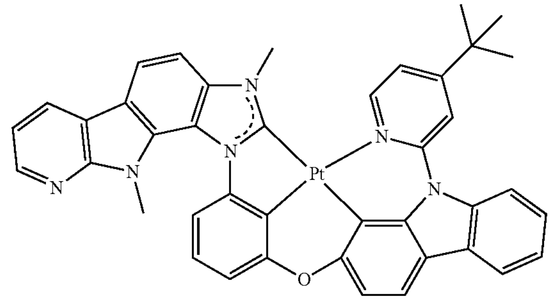
24
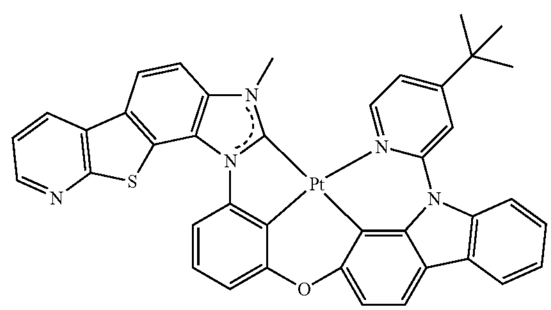
25
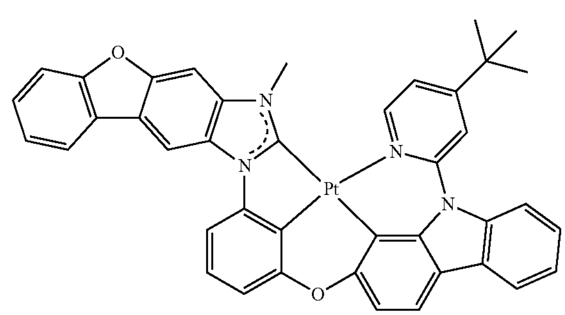

-continued
26
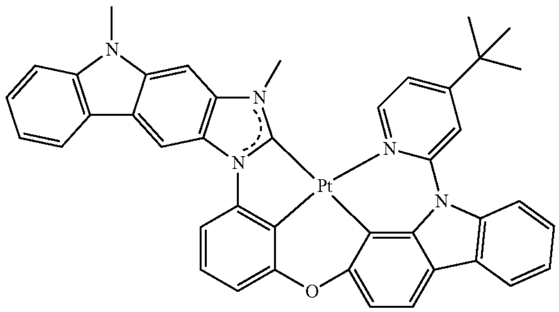
27
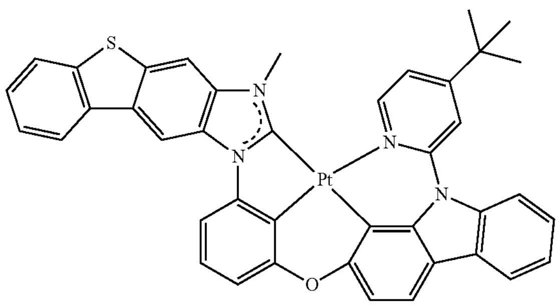
28
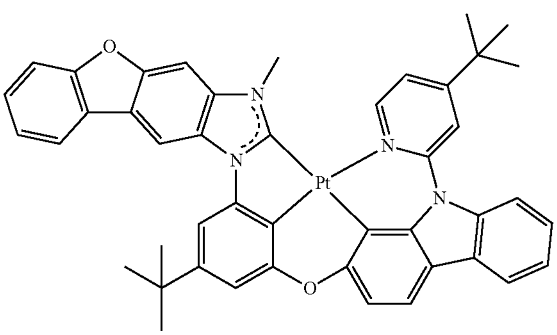
29
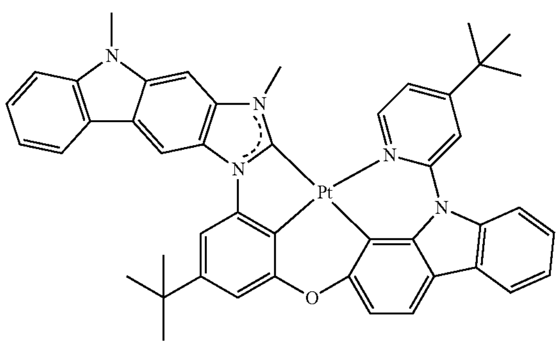
-continued
30
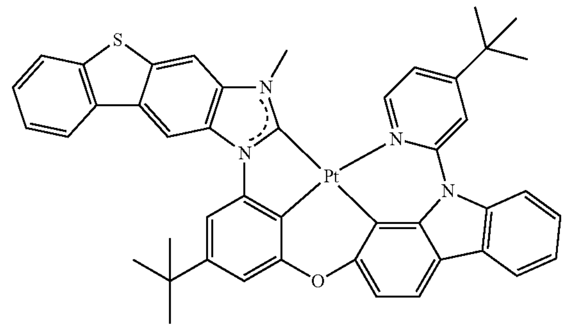
31
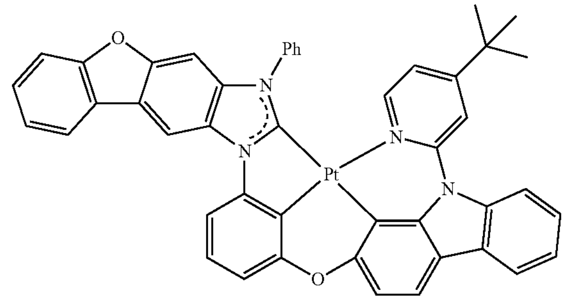
32
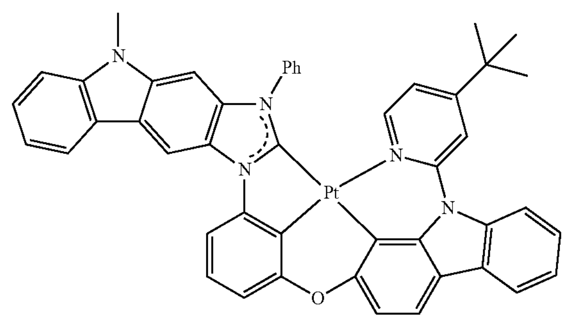
33
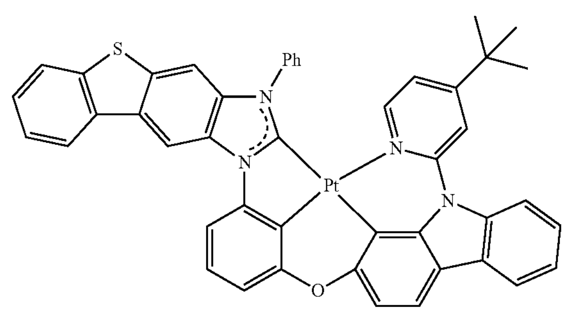
34
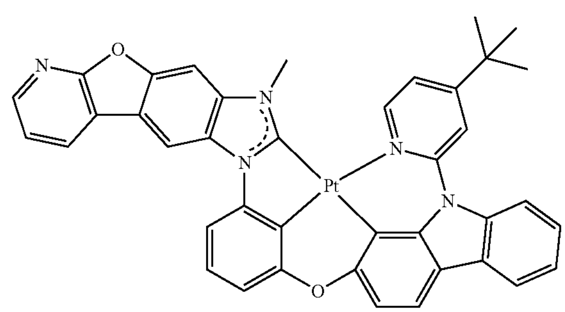

35
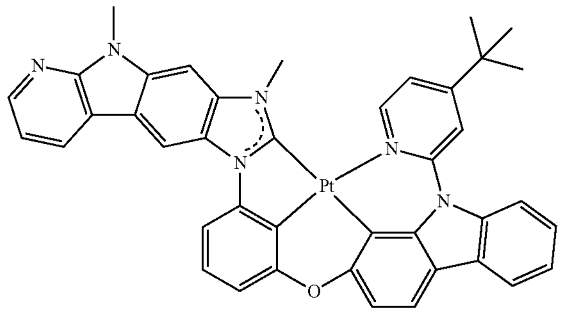
36
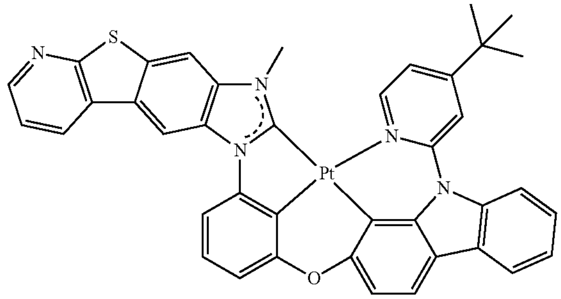
37
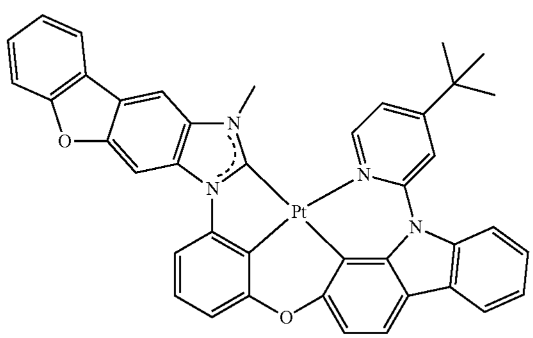
38
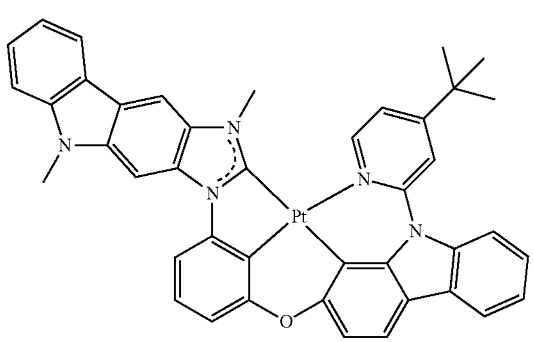
39
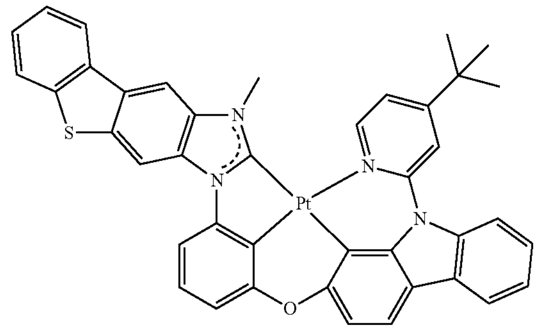
40
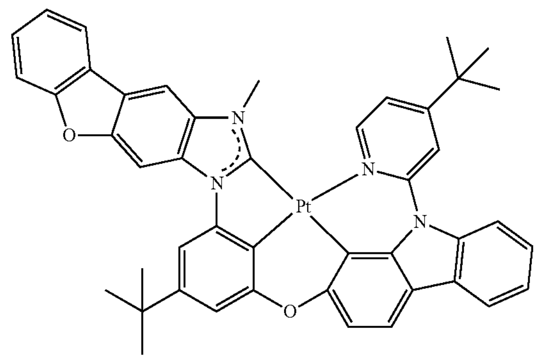
41
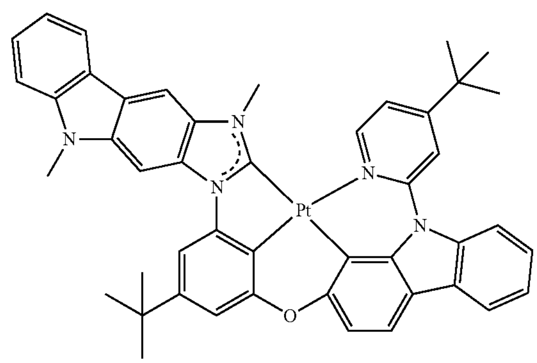
42
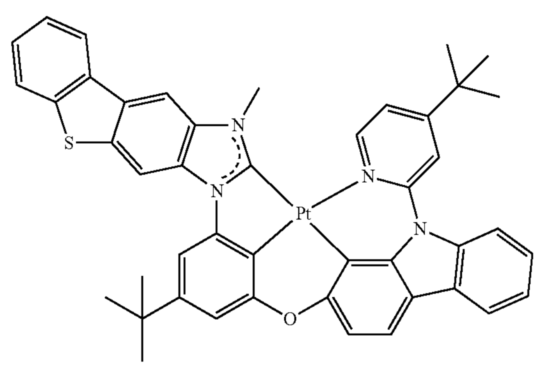

-continued
43
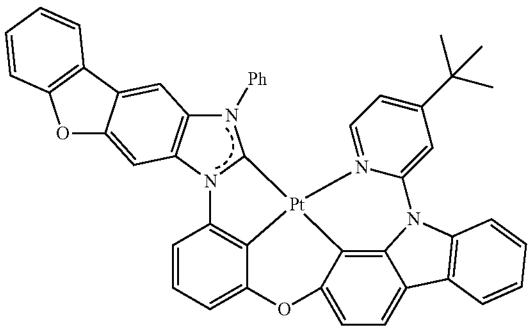
44
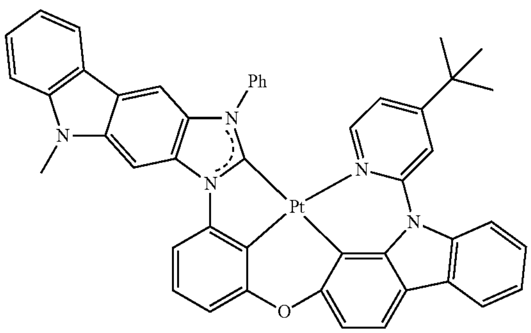
45
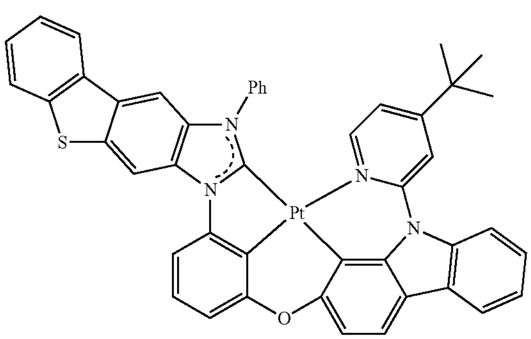
46
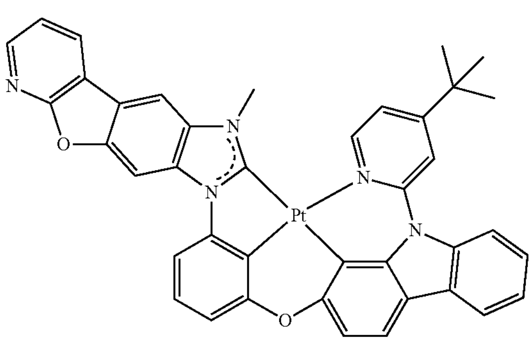
-continued
47
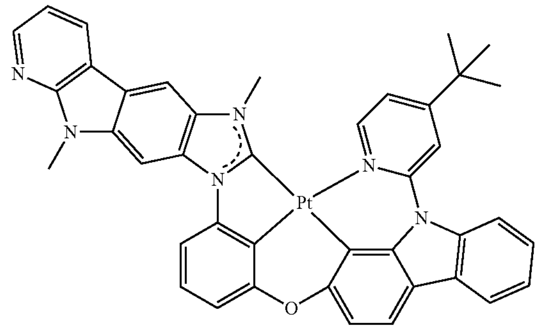
48
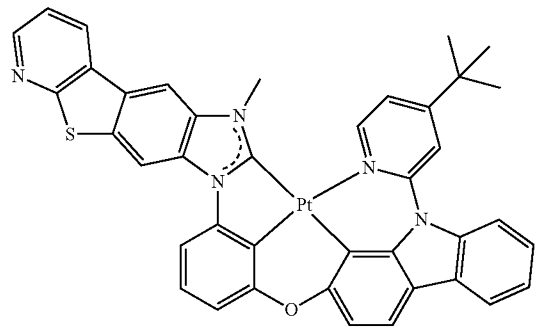
49
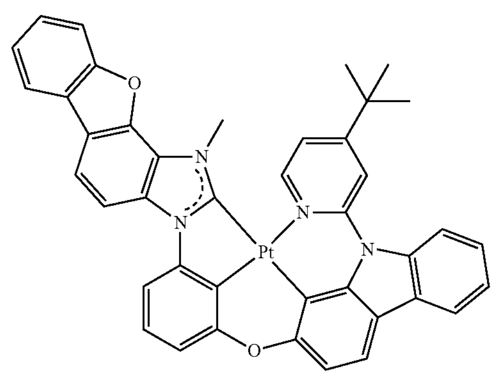
50
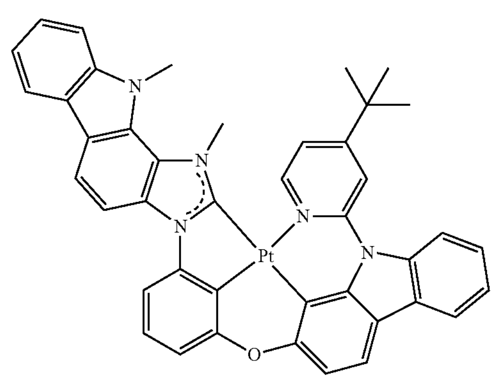

-continued
51
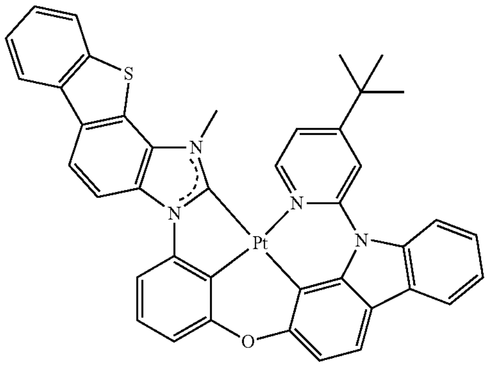
52
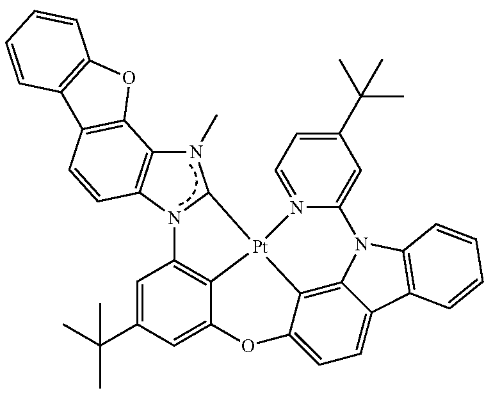
53
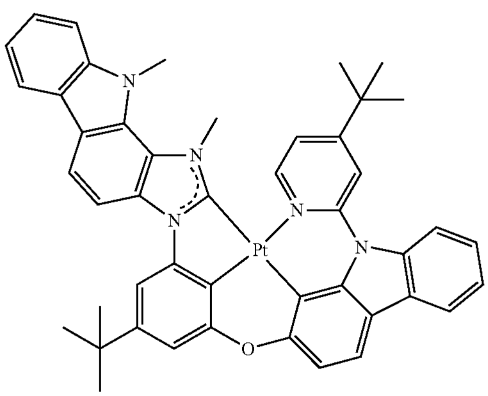
54
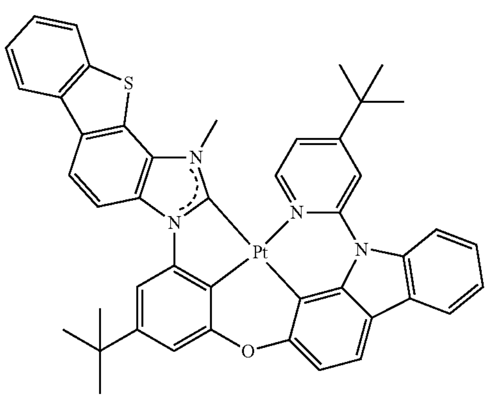
-continued
55
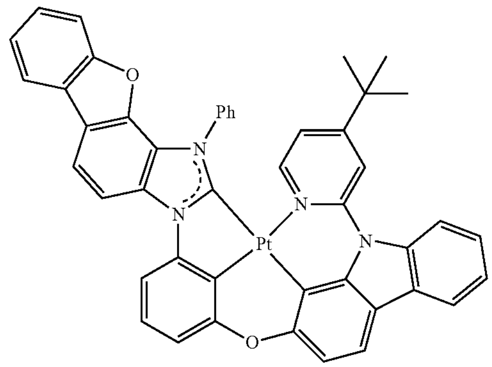
56
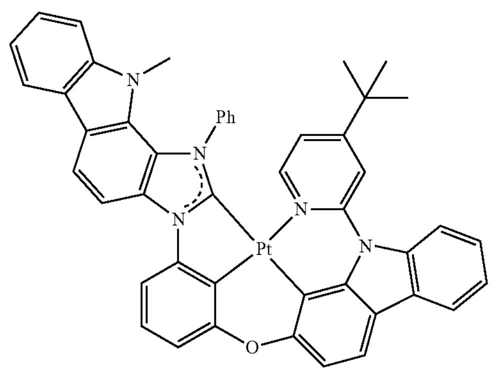
57
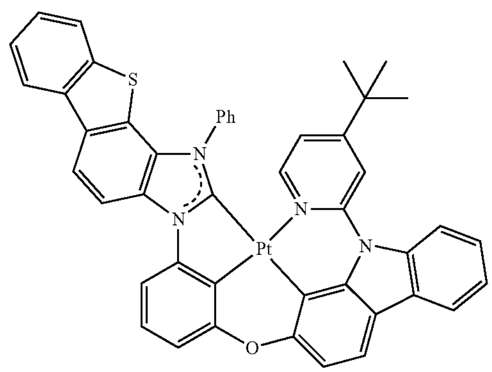
58
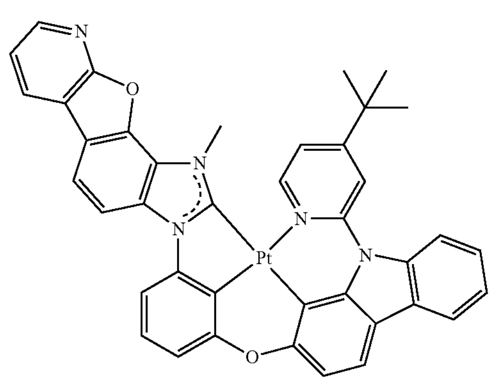

-continued
59
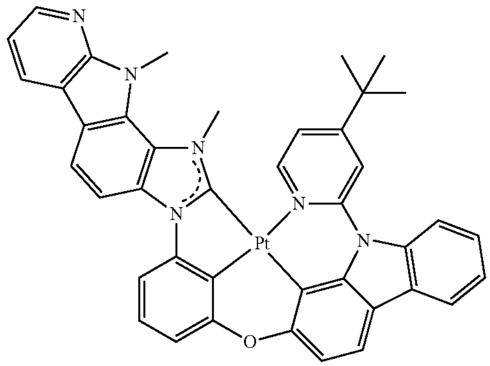
60
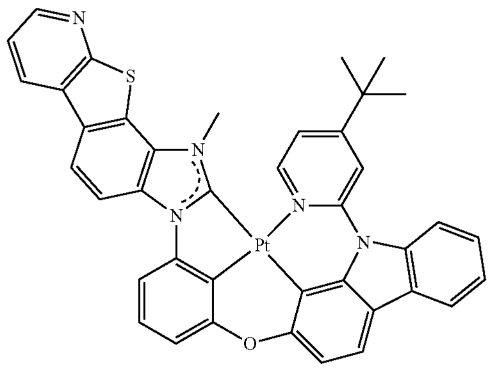
61
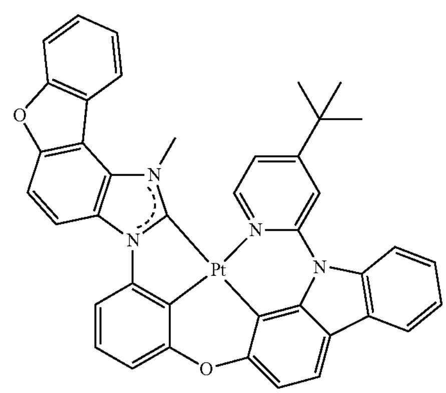
62
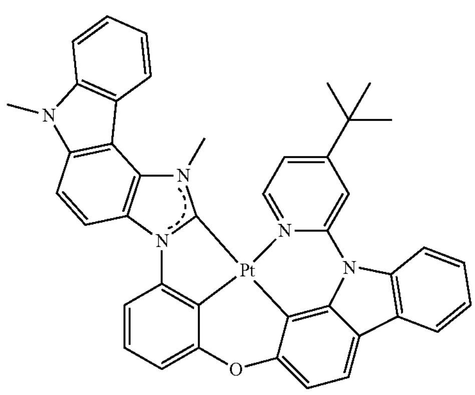
-continued
63
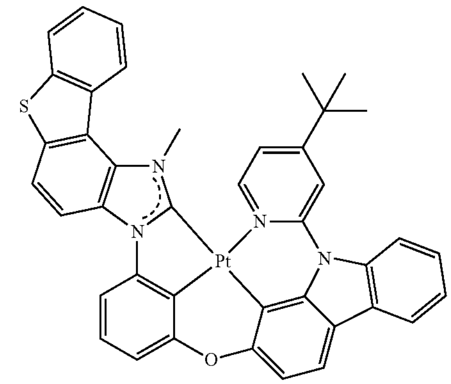
64
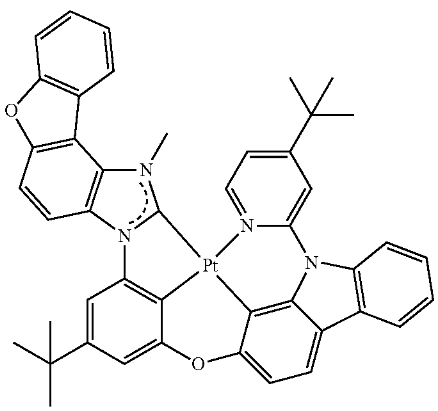
65
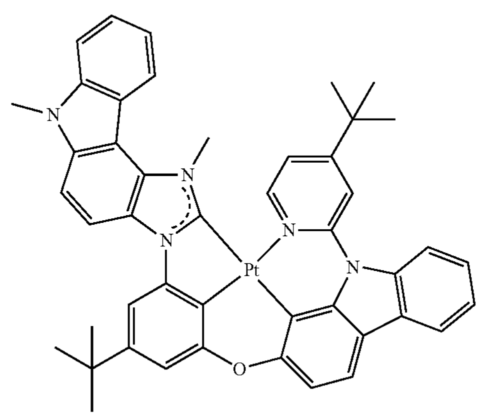
66
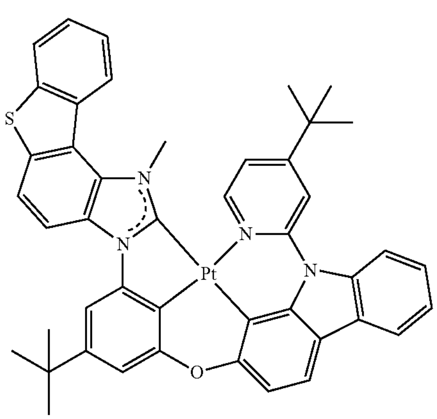

-continued

67

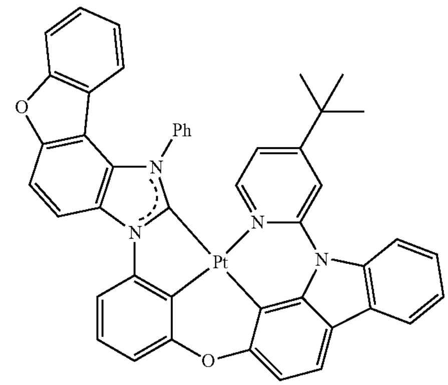

68

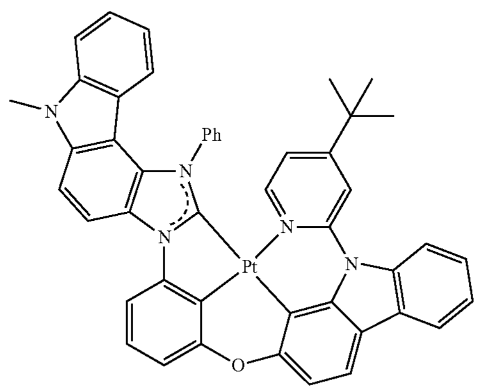

69

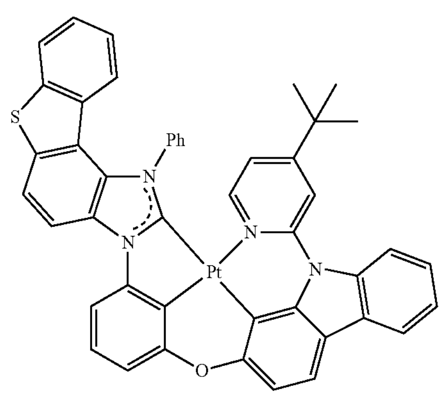

70

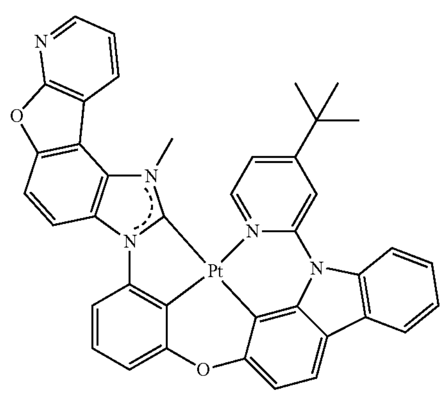

-continued

71

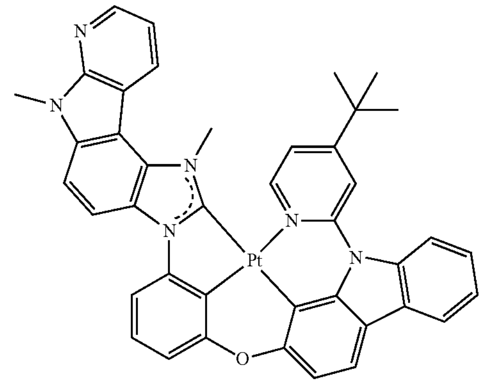

72

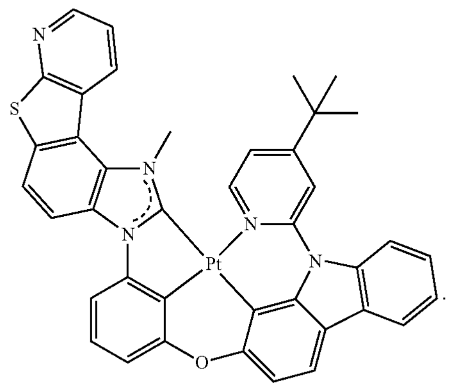

15. An organic light-emitting device comprising:

a first electrode;

a second electrode; and an organic layer disposed between the first electrode and the second electrode, wherein the organic layer comprises:

an emission layer, and at least one organometallic compound of claim 1.

16. The organic light-emitting device of claim 15, wherein the first electrode is an anode, the second electrode is a cathode, and the organic layer comprises a hole transport region disposed between the first electrode and the emission layer and an electron transport region disposed between the emission layer and the second electrode, the hole transport region comprises a hole injection layer, a hole transport layer, an electron blocking layer, or any combination thereof, and the electron transport region comprises a hole blocking layer, an electron transport layer, an electron injection layer, or any combination thereof.

17. The organic light-emitting device of claim 15, wherein the emission layer comprises the organometallic compound.

18. The organic light-emitting device of claim 17, wherein the emission layer further comprises a host, wherein the host is present in the emission layer in an amount greater than an amount of the organometallic compound in the emission layer.

19. The organic light-emitting device of claim 17, wherein the emission layer emits blue light having a maximum emission wavelength in a range of about 430 nanometers to about 480 nanometers.

* * * * *